US012190008B2

United States Patent
Yokoi et al.

(10) Patent No.: US 12,190,008 B2
(45) Date of Patent: Jan. 7, 2025

(54) DISPLAY DEVICE

(71) Applicant: DENSO CORPORATION, Kariya (JP)

(72) Inventors: Nobuo Yokoi, Kariya (JP); Shinsuke Hisatsugu, Kariya (JP); Masafumi Nohara, Kariya (JP)

(73) Assignee: DENSO CORPORATION, Kariya (JP)

( * ) Notice: Subject to any disclaimer, the term of this patent is extended or adjusted under 35 U.S.C. 154(b) by 267 days.

(21) Appl. No.: 17/693,621

(22) Filed: Mar. 14, 2022

(65) Prior Publication Data

US 2022/0197582 A1 Jun. 23, 2022

Related U.S. Application Data

(63) Continuation of application No. PCT/JP2020/034116, filed on Sep. 9, 2020.

(30) Foreign Application Priority Data

| Sep. 17, 2019 | (JP) | ................................ | 2019-167991 |
| Nov. 8, 2019 | (JP) | ................................ | 2019-203274 |
| Jan. 31, 2020 | (JP) | ................................ | 2020-015153 |
| May 18, 2020 | (JP) | ................................ | 2020-086758 |

(51) Int. Cl.
| *G06F 3/14* | (2006.01) |
| *B60K 35/00* | (2006.01) |
| *G02B 5/08* | (2006.01) |
| *G06F 3/147* | (2006.01) |
| *H04N 7/18* | (2006.01) |
| *H04N 23/56* | (2023.01) |

(Continued)

(52) U.S. Cl.
CPC ............ *G06F 3/1423* (2013.01); *B60K 35/00* (2013.01); *G02B 5/0808* (2013.01); *G06F 3/147* (2013.01); *H04N 7/18* (2013.01); *H04N 23/56* (2023.01); *H10K 59/10* (2023.02); *B60K 35/28* (2024.01); *B60K 35/29* (2024.01); *B60K 2360/164* (2024.01); *B60K 2360/166* (2024.01); *B60K 2360/167* (2024.01); *B60K 2360/172* (2024.01); *B60K 2360/176* (2024.01); *B60K 2360/182* (2024.01); *B60K 2360/23* (2024.01); *B60K 2360/25* (2024.01); *B60K 2360/31* (2024.01); *B60K 2360/349* (2024.01)

(58) Field of Classification Search
None
See application file for complete search history.

(56) References Cited

U.S. PATENT DOCUMENTS 5,684,468 A 11/1997 Gotoh et al.
2004/0252993 A1 12/2004 Sato
(Continued)

FOREIGN PATENT DOCUMENTS

JP  H4-226490 A  8/1992
JP  H0537549 U  5/1993
(Continued)

*Primary Examiner* — Samira Monshi
(74) *Attorney, Agent, or Firm* — Harness, Dickey & Pierce, P.L.C.

(57) ABSTRACT

A display device includes a plurality of display units and a reflector. The plurality of display units emits display light representing an image to be displayed from a display screen. The reflector is disposed to face the display screen of each of the plurality of display units and reflects the display light emitted from each of the plurality of display units.

26 Claims, 32 Drawing Sheets

(51) Int. Cl.
    *H10K 59/10*     (2023.01)
    *B60K 35/28*     (2024.01)
    *B60K 35/29*     (2024.01)

(56) References Cited

U.S. PATENT DOCUMENTS

| | | |
|---|---|---|
| 2015/0328990 A1 | 11/2015 | Nakajima et al. |
| 2017/0248786 A1* | 8/2017 | Kuzuhara .............. B60K 35/00 |
| 2018/0341110 A1 | 11/2018 | Hirata et al. |
| 2020/0249479 A1 | 8/2020 | Hirata et al. |
| 2021/0088797 A1* | 3/2021 | Uragami .............. H04N 13/395 |

FOREIGN PATENT DOCUMENTS

| | | | |
|---|---|---|---|
| JP | 2002316580 | A | 10/2002 |
| JP | 2008290545 | A | 12/2008 |
| JP | 2010066706 | A | 3/2010 |
| JP | 2014228314 | A | 12/2014 |
| JP | 2015217815 | A | 12/2015 |
| JP | 2016176918 | A | 10/2016 |
| JP | 2018-103883 | A | 7/2018 |
| WO | WO-2017072841 | A1 | 5/2017 |

\* cited by examiner

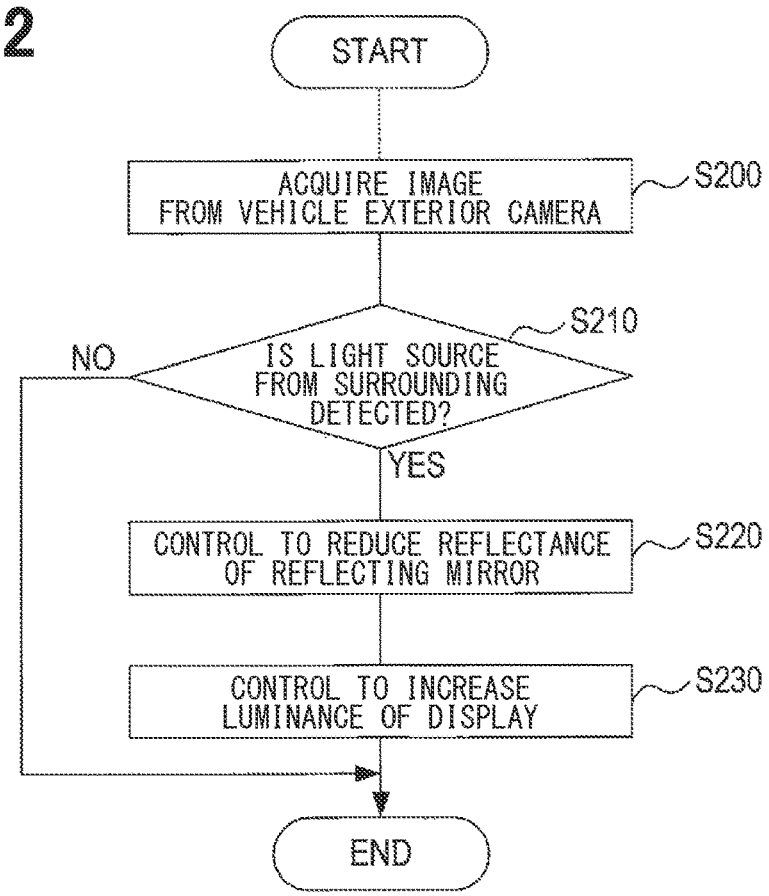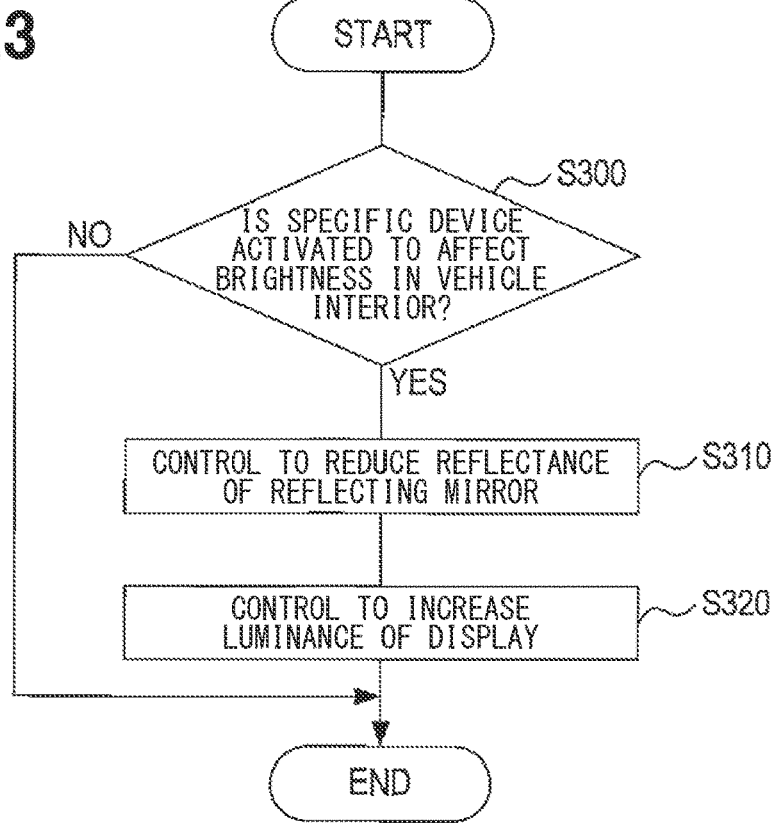

DISPLAY DEVICE

CROSS REFERENCE TO RELATED APPLICATION

The present application is a continuation application of International Patent Application No. PCT/JP2020/034116 filed on Sep. 9, 2020, which designated the U.S. and claims the benefit of priority from Japanese Patent Application No. 2019-167991 filed on Sep. 17, 2019, Japanese Patent Application No. 2019-203274 filed on Nov. 8, 2019, Japanese Patent Application No. 2020-015153 filed on Jan. 31, 2020, and Japanese Patent Application No. 2020-086758 filed on May 18, 2020. The entire disclosures of all of the above applications are incorporated herein by reference.

TECHNICAL FIELD

The present disclosure relates to a display device for a vehicle.

BACKGROUND ART

A display device is mounted on a vehicle.

SUMMARY

A display device for a vehicle includes a plurality of display units and a reflector. The plurality of display units emits display light representing an image to be displayed from a display screen. The reflector is disposed to face the display screen of each of the plurality of display units and configured to reflect the display light emitted from each of the plurality of display units.

BRIEF DESCRIPTION OF DRAWINGS

FIG. 22 is a flowchart illustrating control processing by the display control device according to the fifth embodiment.

FIG. 23 is a flowchart illustrating control processing by a display control device according to a sixth embodiment.

DESCRIPTION OF EMBODIMENTS

To begin with, examples of relevant techniques will be described.

In recent years, in-vehicle display devices have been increasing in size. In a case where the size increase of the in-vehicle display device is achieved by one large display panel, it is necessary to customize (i.e., newly develop and newly manufacture) a large display panel in accordance with the size of a vehicle in which the in-vehicle display device is mounted, which results in high cost.

In addition, as a result of detailed studies by the inventors, in a case where the size increase of the in-vehicle display device is achieved by arranging a plurality of display units, a gap is formed between the display units, thus causing a seam in an image displayed on the in-vehicle display device. That is, the image is not seamless.

The present disclosure provides a display device to make it difficult to see a seam between display units.

A display device for a vehicle includes a plurality of display units and a reflector. The plurality of display units emits display light representing an image to be displayed from a display screen. The reflector is disposed to face the display screen of each of the plurality of display units and configured to reflect the display light emitted from each of the plurality of display units.

In the display device of the present disclosure configured as described above, display light emitted from each of the plurality of display units is reflected on the reflector and emitted into a vehicle interior. Thereby, a virtual image is projected onto the reflector, and an occupant in the vehicle interior can visually recognize the virtual image. In this manner, the display device of the present disclosure does not allow the occupant in the vehicle interior to directly visually recognize the plurality of display units disposed in a state where there is a step therebetween. That is, in the display device of the present disclosure, the display light is reflected on the reflective surface of the reflector, so that a plurality of display images by the plurality of display units can be displayed in a state where there is no step between the display images. Therefore, the display device of the present disclosure can make it difficult to see a seam (joint) between two adjacent display units in the virtual image visually recognized by the occupant.

First Embodiment

Hereinafter, a first embodiment of the present disclosure will be described with reference to the drawings.

Figure 1:
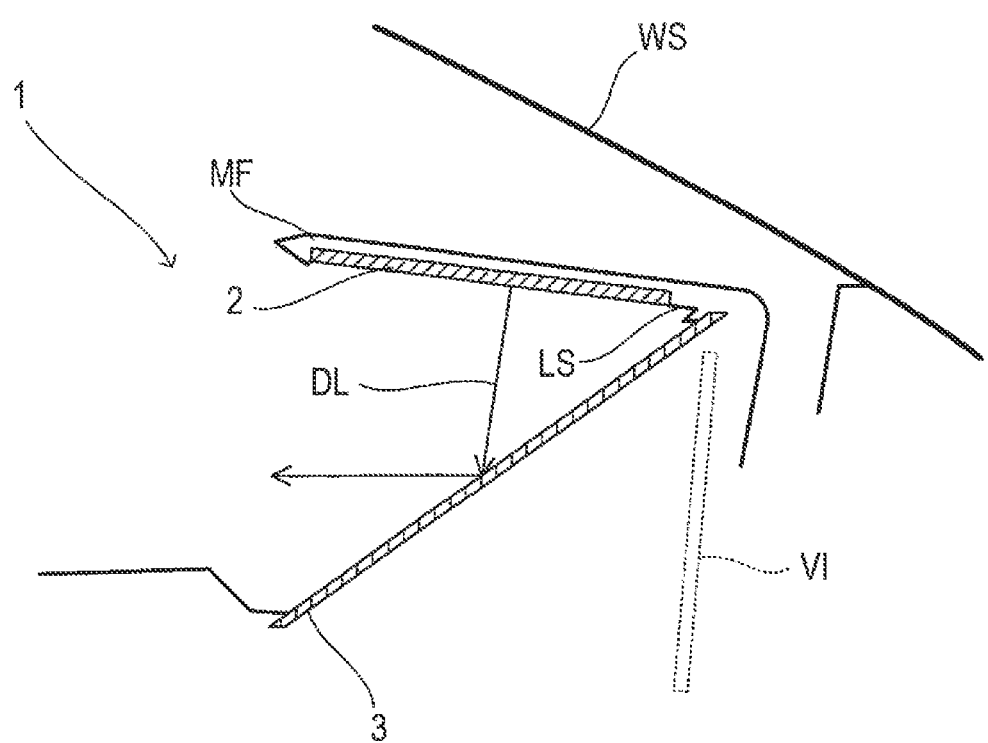
FIG. 1 is a cross-sectional view illustrating placement of a display device in a vehicle interior.

A display device 1 of the present embodiment is mounted in, for example, an autonomous vehicle capable of both autonomous driving and manual driving and includes an irradiator 2 and a reflecting mirror 3 as illustrated in FIG. 1. The irradiator 2 emits display light DL representing an image to be displayed from a display screen. The irradiator 2 is mounted on a lower surface LS of a meter hood MF, which is disposed below a windshield WS of the vehicle and is formed to project toward the rear of the vehicle, such that the display screen faces downward.

The reflecting mirror 3 is installed below the irradiator 2 and reflects display light DL, emitted from the display screen of the irradiator 2, toward the rear of the vehicle. As a result, an occupant of the vehicle can visually recognize the image displayed on the display device 1. A rectangle VI indicated by a broken line shows a position of a virtual image visually recognized by the occupant of the vehicle.

Figure 2:
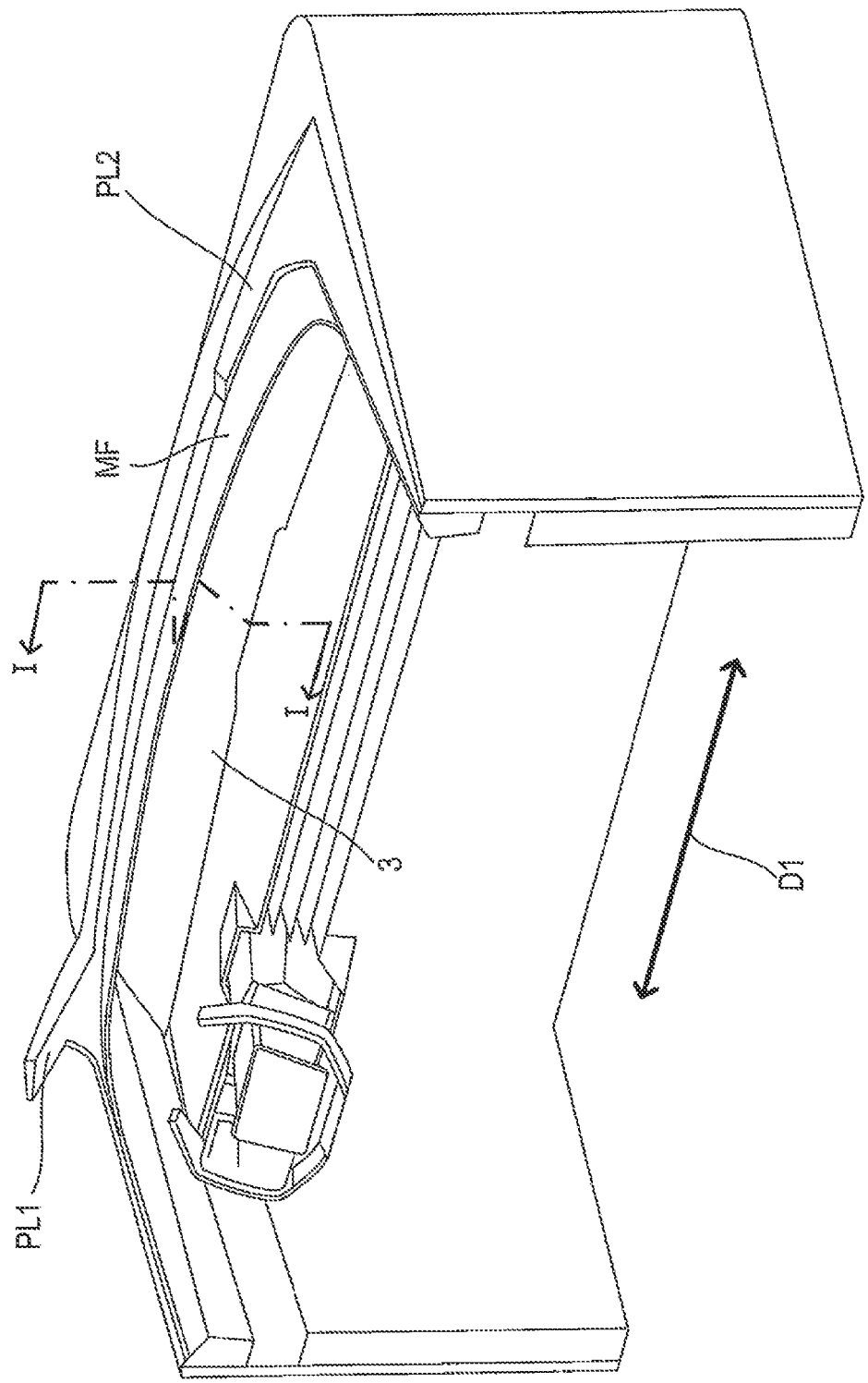
FIG. 2 is a perspective view illustrating placement of a meter hood and a reflecting mirror.

As illustrated in FIG. 2, the meter hood MF is attached so as to bridge between an A-pillar PL1 on the left side of the vehicle and an A-pillar PL2 on the right side of the vehicle.

The reflecting mirror 3 extends along a width direction D1 of the vehicle so as to bridge between the A-pillar PL1 and the A-pillar PL2 below the meter hood MF. The surface of the reflecting mirror 3 is formed to be a curved surface instead of a flat surface. FIG. 1 is a cross-sectional view taken along line I-I in FIG. 2.

Figure 3:
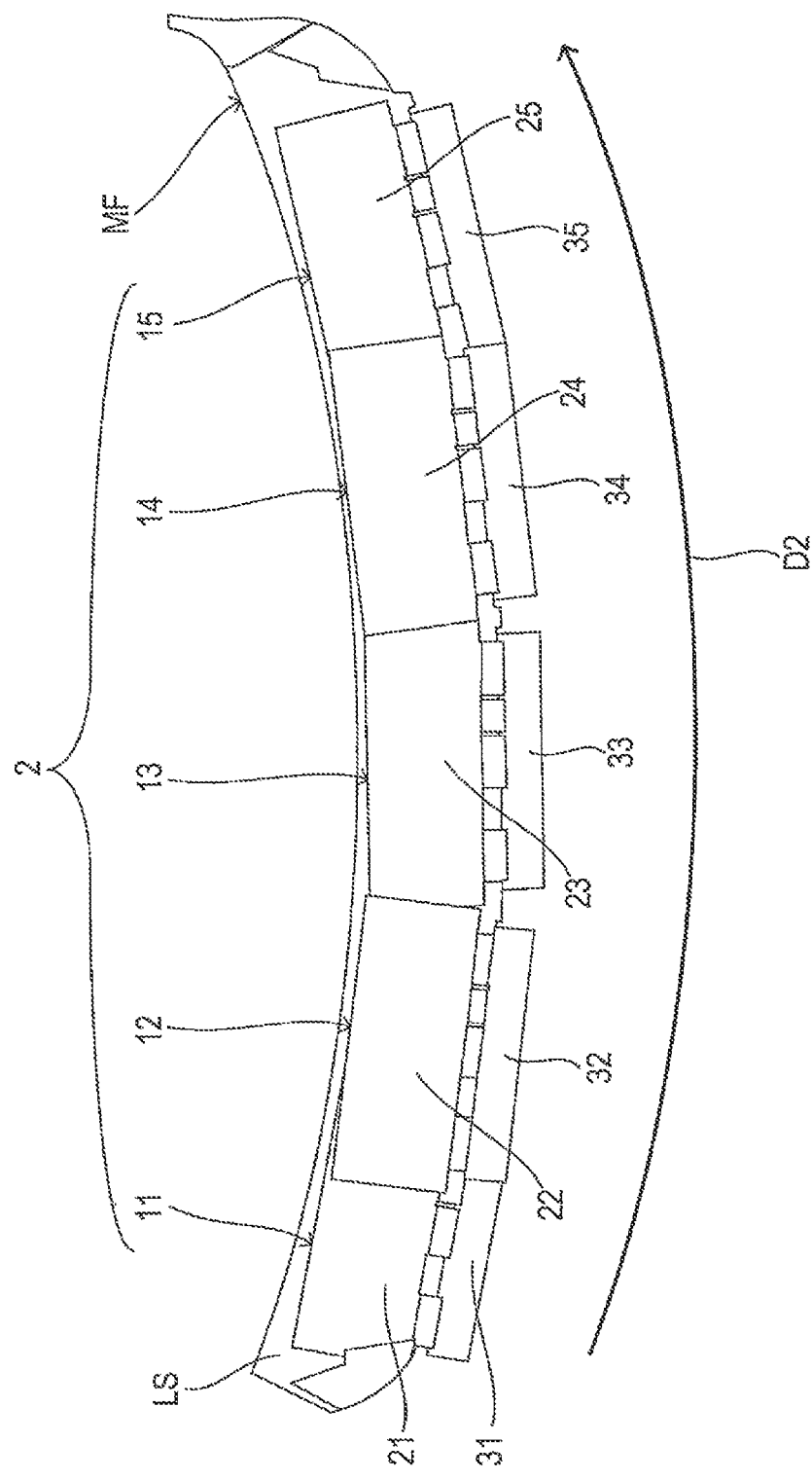
FIG. 3 is a plan view illustrating placement of a plurality of display plates fixed to the meter hood.

As illustrated in FIG. 3, the irradiator 2 includes organic electroluminescence (EL) displays 11, 12, 13, 14, 15.

The organic EL displays 11, 12, 13, 14, 15 include display plates 21, 22, 23, 24, 25 and circuit boards 31, 32, 33, 34, 35 respectively.

The display plates 21, 22, 23, 24, 25 are formed in a thin plate shape in which a plurality of organic EL elements are arranged in a matrix. The circuit boards 31, 32, 33, 34, 35 are wiring boards on which various electronic components for controlling the display plates 21, 22, 23, 24, 25 are mounted, respectively. The display plates 21, 22, 23, 24, 25 are connected to the circuit boards 31, 32, 33, 34, 35 by flexible flat cables, respectively.

The display plates 21, 22, 23, 24, 25 are fixed to the lower surface LS of the meter hood MF with the surface opposite to the display screen in contact with the lower surface LS of the meter hood MF. The display plate 21, the display plate 22, the display plate 23, the display plate 24, and the display plate 25 are arranged in the order from the left-side A-pillar PL1 along an extending direction D2 in which the meter hood MF extends from the left-side A-pillar PL1 toward the right-side A-pillar PL2.

The display plate 22 is installed to cover the right end portion of the display plate 21 and the left end portion of the display plate 23. The display plate 24 is installed to cover the right end portion of the display plate 23 and the left end portion of the display plate 25. Thus, the display plates 21, 22, 23, 24, 25 are installed such that there are no gaps between the display plate 21 and the display plate 22, between the display plate 22 and the display plate 23, between the display plate 23 and the display plate 24, and between the display plate 24 and the display plate 25.

The display plate 21 displays an image shot by a left rear camera that shoots an image of a situation of the left rear of the vehicle. That is, the display plate 21 displays an image of an electronic mirror that functions as a left side mirror. When another vehicle is approaching from the left rear of the vehicle, the display plate 21 displays a left-rear approach image indicating the approach.

The display plate 22 displays various pieces of travel information (e.g., a traveling speed, a traveling mode, a traveling distance, a remaining battery, etc.) of the vehicle.

The display plate 23 displays an image output from a navigation device. For example, the display plate 23 displays an image indicating the current location of the vehicle, an image for guiding a route from the current location to a destination, and the like.

The display plate 24 displays an entertainment video (e.g., a moving image output from a moving image reproduction device or a television tuner) and information (e.g., current set temperature, etc.) related to an air conditioner controller that controls an in-vehicle air conditioner.

The display plate 25 displays an image shot by a right rear camera that shoots a situation of the right rear of the vehicle. That is, the display plate 25 displays an image of an electronic mirror that functions as a right-side mirror. In addition, when another vehicle is approaching from the right rear of the vehicle, the display plate 25 displays a right-rear approach image indicating the approach.

Figure 4:
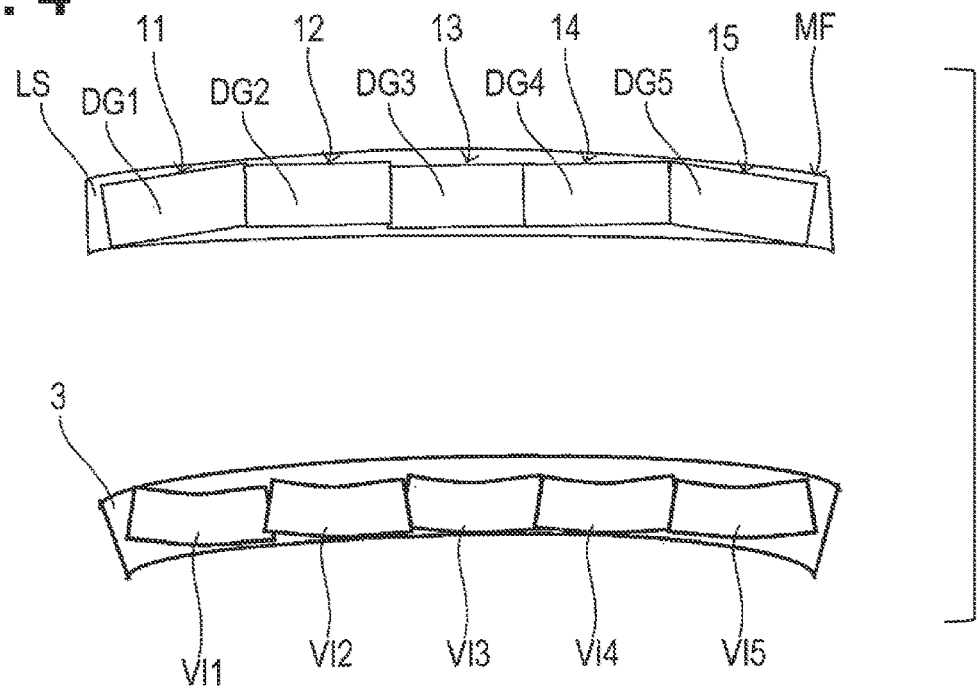
FIG. 4 is a view illustrating display images displayed on the display plates and virtual images visually recognized by an occupant.

As described above, the surface of the reflecting mirror 3 is formed to be a curved surface. Thus, as illustrated in FIG. 4, the display light DL forming each of display images DG1, DG2, DG3, DG4, DG5 displayed on the organic EL displays 11, 12, 13, 14, 15 is reflected on the reflecting mirror 3, whereby the virtual images VI1, VI2, VI3, VI4, VI5 visually recognized by the occupant of the vehicle are distorted with respect to the display images DG1, DG2, DG3, DG4, DG5, respectively.

Figure 5:
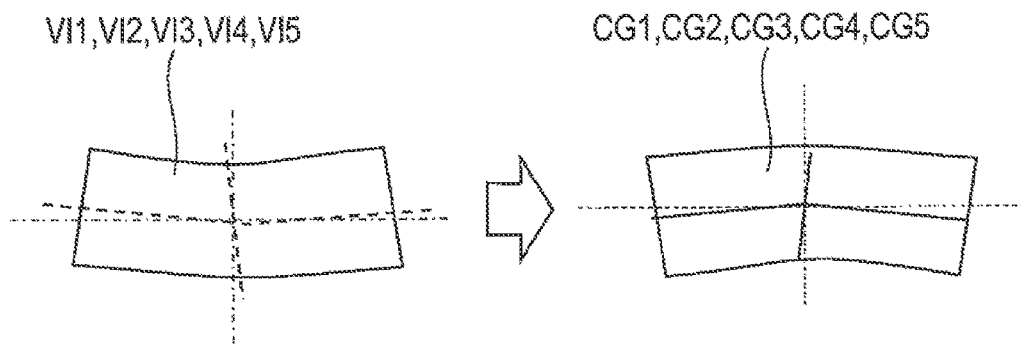
FIG. 5 is a diagram illustrating a virtual image and a corrected display image.

Therefore, as illustrated in FIG. 5, each of the display plates 21, 22, 23, 24, 25 emits display light DL for forming corrected display images CG1, CG2, CG3, CG4, CG5 corrected to cancel the distortion of the virtual images VI1, VI2, VI3, VI4, VI5.

Figure 6:
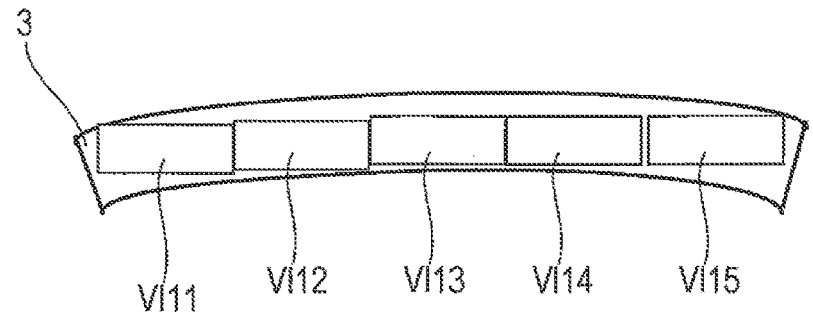
FIG. 6 is a view illustrating corrected virtual images.

Therefore, the display light DL forming each of the corrected display images CG1, CG2, CG3, CG4, CG5 displayed on the display plates 21, 22, 23, 24, 25 is reflected on the reflecting mirror 3, whereby the undistorted virtual images VI11, VI12, VI13, VI14, VI15 are visually recognized by the occupant of the vehicle as illustrated in FIG. 6.

The display device 1 configured as described above includes the organic EL displays 11, 12, 13, 14, 15 and the reflecting mirror 3. Each of the organic EL displays 11 to 15 emits display light DL representing an image to be displayed from the display screen. The reflecting mirror 3 reflects the display light DL emitted from the organic EL displays 11 to 15.

The organic EL displays 11 to 15 is installed on the lower surface LS of the meter hood MF, which is installed in the vehicle interior of the vehicle and protrudes from the front toward the rear of the vehicle, such that the display screens of the organic EL displays 11 to 15 face downward. The reflecting mirror 3 is disposed below the organic EL displays 11 to 15 in a state where a reflective surface that reflects the display light DL is inclined obliquely with respect to an irradiation direction of the display light DL.

As described above, in the display device 1, the display light DL emitted from each of the organic EL displays 11 to 15 is reflected on the reflecting mirror 3 and is emitted into the vehicle interior. As a result, the virtual image is projected onto the reflecting mirror 3, and the occupant in the vehicle interior can visually recognize the virtual image. In this manner, the display device 1 does not allow the occupant in the vehicle interior to directly visually recognize the organic EL displays 11 to 15 disposed with a step between the organic EL displays. That is, in the display device 1, the display light DL is reflected on the reflective surface of the reflecting mirror 3, so that a plurality of display images by the organic EL displays 11 to 15 can be displayed in a state where there is no step between the display images. Hence the display device 1 can make it difficult to see a seam (joint) between the two organic EL displays adjacent to each other in the virtual image visually recognized by the occupant.

Since being able to make it difficult to see the joint between the organic EL displays as described above, the display device 1 can eliminate the need for optical bonding. Furthermore, since not allowing the occupant in the vehicle interior to directly visually recognize the organic EL displays 11 to 15 as described above, the display device 1 can eliminate the need for anti-glare processing and anti-reflection processing.

Each of the organic EL displays 11 to 15 causes the organic EL element itself to emit light, so that a backlight is not required unlike a liquid crystal display. Thus, each of the organic EL displays 11 to 15 can display a deep black image by stopping light emission by the organic EL element. On the other hand, in the liquid crystal display, the light of the backlight slightly leaks from the black part of the display image, and hence the black part of the image appears whitish.

Therefore, the display device 1 displays in black at least a part around the joint between the two adjacent organic EL among the display screens of the organic EL displays 11 to 15, so that the joint between the two organic EL displays can be made more difficult to see.

In the embodiment described above, each of the organic EL displays 11 to 15 corresponds to a display unit, and the reflecting mirror 3 corresponds to a reflector.

Second Embodiment

Hereinafter, a second embodiment of the present disclosure will be described with reference to the drawings. In the second embodiment, portions different from the first embodiment will be described. Common configurations are denoted by the same reference numerals.

The display device 1 of the second embodiment is different from that of the first embodiment in that the shape of the reflecting mirror 3 is changed.

Figure 7:
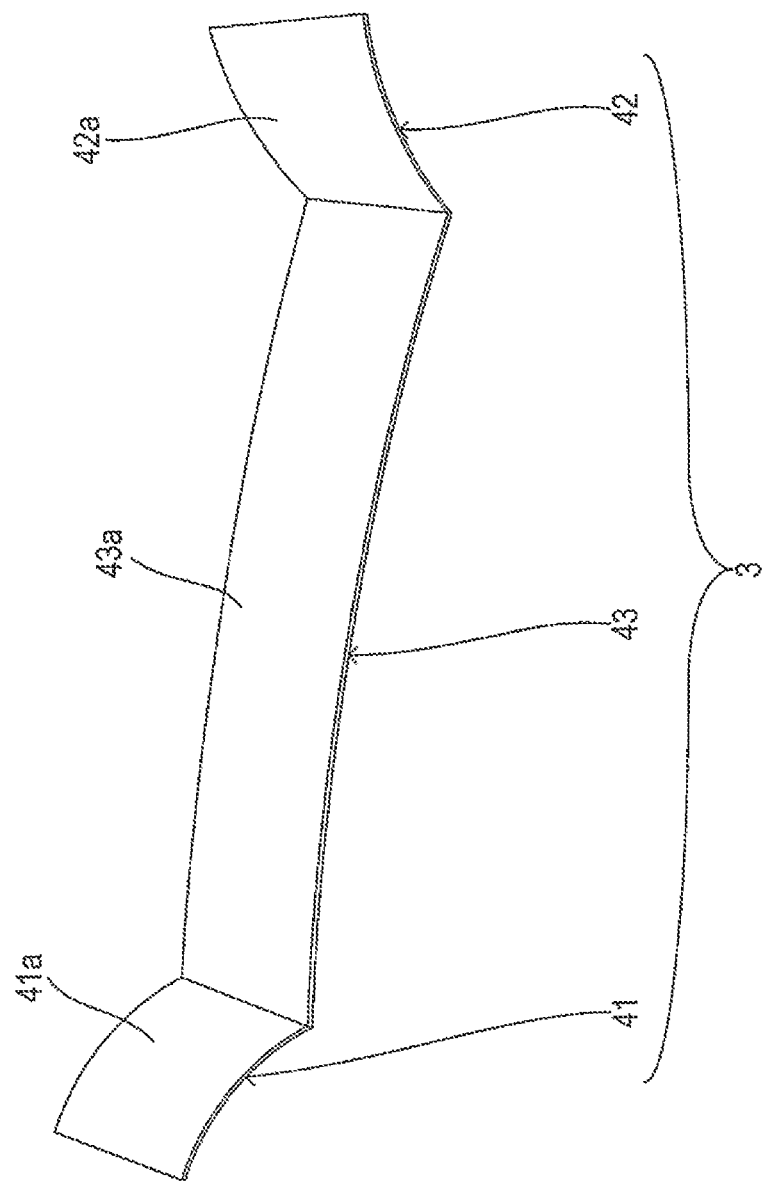
FIG. 7 is a perspective view illustrating a reflecting mirror of a second embodiment.

As illustrated in FIG. 7, the reflecting mirror 3 of the second embodiment includes a first reflector 41, a second reflector 42, and a third reflector 43. Surfaces 41a, 42a, 43a of the first reflector 41, the second reflector 42, and the third reflector 43 are curved surfaces.

The first reflector 41 reflects the display light DL from the display plate 21. The second reflector 42 reflects the display light DL from the display plate 25. The third reflector 43 reflects the display light DL from the display plates 22, 23, 24. Thus, the surface 41a of the first reflector 41 has an area (quantity) capable of reflecting the display light DL from the display plate 21. The surface 42a of the second reflector 42 has an area (quantity) capable of reflecting the display light DL from the display plate 25. The surface 43a of the third reflector 43 has an area (quantity) capable of reflecting the display light DL from the display plates 22, 23, 24.

The first reflector 41, the second reflector 42, and the third reflector 43 are each formed in a rectangular shape. The first reflector 41 and the third reflector 43 are coupled such that the first short side of the first reflector 41 and the first short side of the third reflector 43 coincide with each other. Third reflector 43 and second reflector 42 are coupled such that the second short side of third reflector 43 coincides with the first short side of second reflector 42.

The coupling portion between the first reflector 41 and the third reflector 43 is bent so as to form an obtuse angle by the surface 41a of the first reflector 41 and the surface 43a of the third reflector 43. A coupling portion between the third reflector 43 and the second reflector 42 is bent so as to form an obtuse angle by the surface 43a of the third reflector 43 and the surface 42a of the second reflector 42.

In the display device 1 configured as described above, the meter hood MF is formed to bridge between the vicinity of the A-pillar PL1 installed on the left side of the vehicle and the vicinity of the A-pillar PL2 installed on the right side of the vehicle. The reflecting mirror 3 is formed to bridge between the vicinity of the A-pillar PL1 and the vicinity of the A-pillar PL2. The surface 41a of the reflecting mirror 3 in the vicinity of the A-pillar PL1 and the surface 42a of the reflecting mirror 3 in the vicinity of the A-pillar PL2 are disposed to form an obtuse angle by the surfaces 43a of the reflecting mirror 3 except for the surfaces 41a, 42a.

The display device 1 can thus direct the first reflector 41 disposed in the vicinity of the A-pillar PL1 and the second reflector 42 disposed in the vicinity of the A-pillar PL2 toward the occupant on the driver seat or the passenger seat. As a result, the display device 1 can make the images displayed on the first reflector 41 and the second reflector 42 easily visible to the occupant on the driver seat or the passenger seat.

The first reflector 41 displays an image of an electronic mirror functioning as a left side mirror and displays a left-rear approach image. Thus, the display device 1 can make it easy for the occupant on the driver seat or the passenger seat to recognize information regarding the left rear of the vehicle. Similarly, the second reflector 42 displays an image of an electronic mirror functioning as a right-side mirror and displays a right-rear approach image. Thus, the display device 1 can make it easy for the occupant on the driver seat or the passenger seat to recognize information regarding the right rear of the vehicle.

In the embodiment described above, the A-pillar PL1 corresponds to a first A-pillar, the A-pillar PL2 corresponds to a second A-pillar, the surface 41a corresponds to a first reflective surface, the surface 42a corresponds to a second reflective surface, and the surface 43a corresponds to a third reflective surface.

Third Embodiment

In the following, an embodiment of the present disclosure will be described with reference to the drawings.

[1. Overall Configuration]

Figure 8:
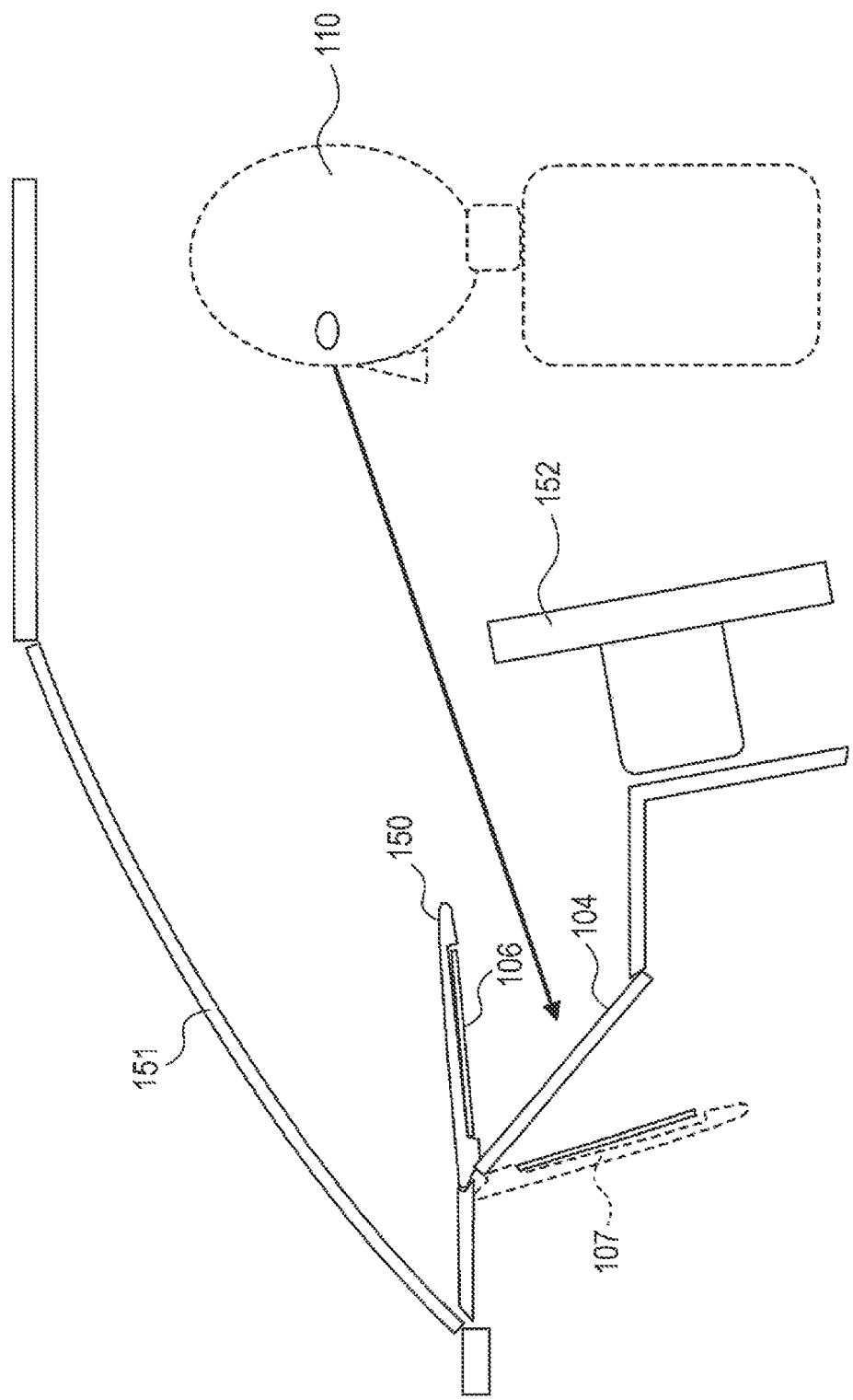
FIG. 8 is an explanatory view illustrating placement of components of a display device of a third embodiment.
Figure 9:
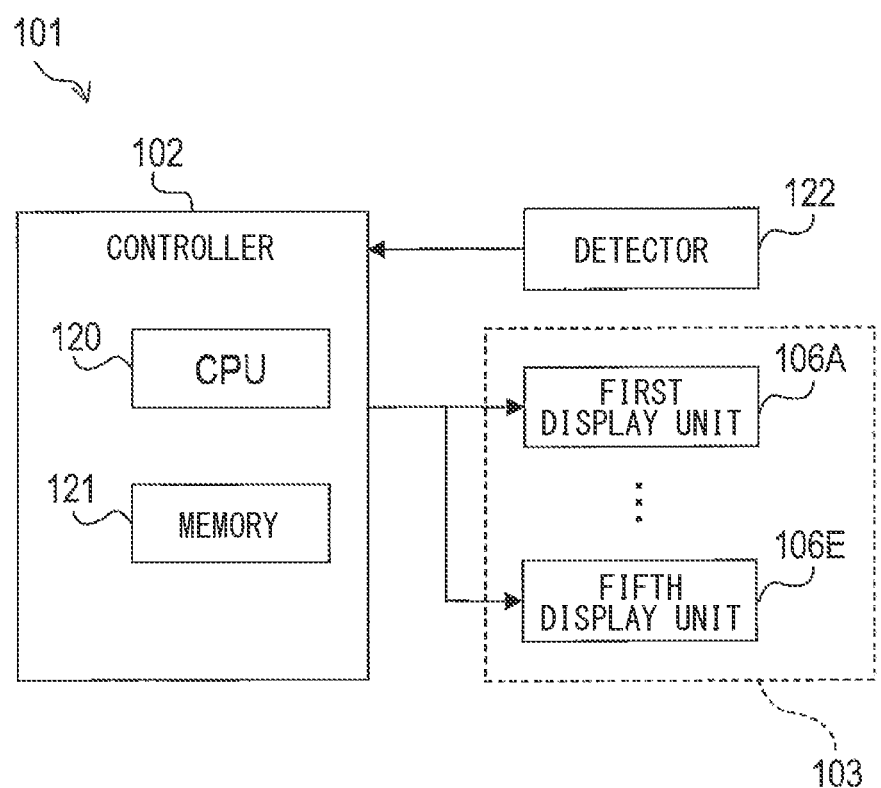
FIG. 9 is a block diagram illustrating an electrical configuration of the display device.

A display device 101 of the present embodiment is mounted in a vehicle and includes a controller 102, an irradiator 103, a reflector 104, and a detector 122 (cf. FIGS. 8 and 9).

The controller 102 is a portion integrally controlling the display device 101 and has a microcomputer including a central processing unit (CPU) 120 and semiconductor memory (hereinafter referred to as memory 121) such as random access memory (RAM), read-only memory (ROM), and flash memory.

The CPU 120 executes a program stored in the memory 121. Each function of the display device 101 is achieved by the CPU 120 executing a program stored in a non-transitory tangible storage medium. In the present embodiment, the memory 121 corresponds to the non-transitory tangible storage medium storing the program. By the execution of the program, a method corresponding to the program is performed. The display device 101 may include one microcomputer or a plurality of microcomputers. A technique for achieving the functions of the display device 101 is not limited to software, and some or all of the functions may be achieved using an electronic circuit. In this case, the electronic circuit may be configured as a digital circuit, an analog circuit, or a combination thereof.

The irradiator 103 includes a plurality of (as an example, five) display units 106 provided in a lower portion of a meter hood 150. Hereinafter, these display units 106 are also referred to as first to fifth display units 106A to 106E. The irradiator 103 emits display light toward the reflector 104 described above by the plurality of display units 106. The meter hood 150 is a wall-shaped portion that is located below the front windshield 151, extends from the right end to the left end of a dashboard, and protrudes toward the rear of the vehicle. The reflector 104 is provided below the meter hood 150, and the plurality of display units 106 face downward so as to face the reflector 104.

The reflector 104 is a plate-shaped portion located below the meter hood 150, is provided to face the meter hood 150, and reflects the display light emitted from the plurality of the display units 106 toward the rear of the vehicle. As a result, an entire image 107 that is a virtual image is projected into a dark space behind the reflector 4, and the entire image 107 can be visually recognized by a person in the vehicle (hereinafter, the occupant).

The detector 122 includes a sensor that detects the brightness of external light incident on the plurality of display units 106 and the reflector 104 from the outside of the display device 101. The sensor may be provided below the meter hood 150, for example. The detector 122 may detect brightness of external light incident on one of the plurality of display units 106 and the reflector 104. The detector 122 outputs a signal indicating the detection result of the brightness of the external light to the controller 102.

[2. Configuration of Irradiator]

Figure 10:
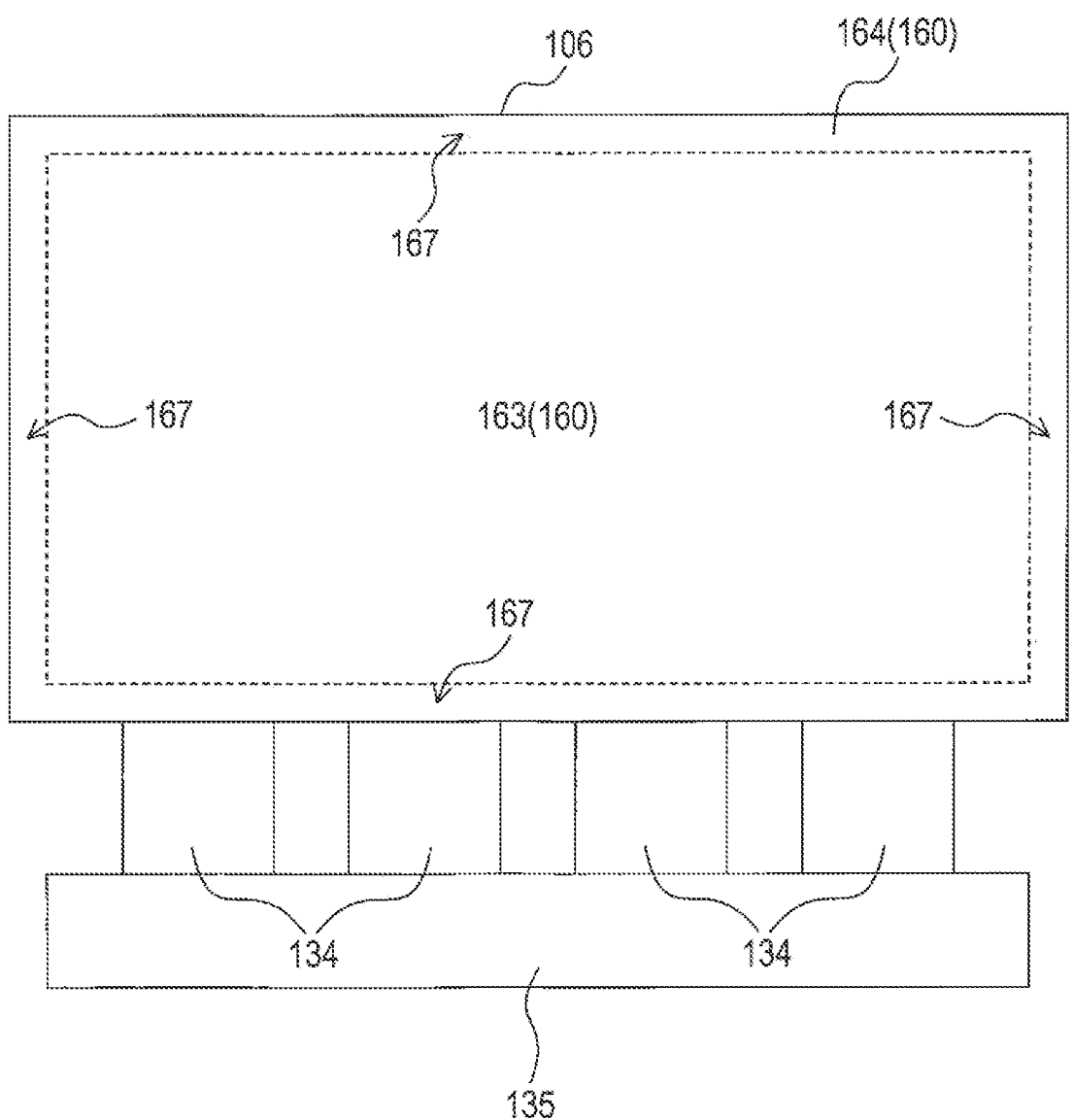
FIG. 10 is an explanatory view of a display unit as viewed from the front surface side.

The irradiator 103 includes a plurality of circuit boards 135 corresponding to the respective display units 106 (cf. FIG. 10). Each circuit board 135 is connected to the display element of the display unit 106 corresponding to the circuit board 135 by a flexible flat cable 134, and a plurality of electronic components for controlling the display element are mounted. The circuit board 135 of each display unit 106 is connected to the controller 102, and the controller 102 controls irradiation of display light on each display unit 106 via the circuit board 135.

Figure 11:
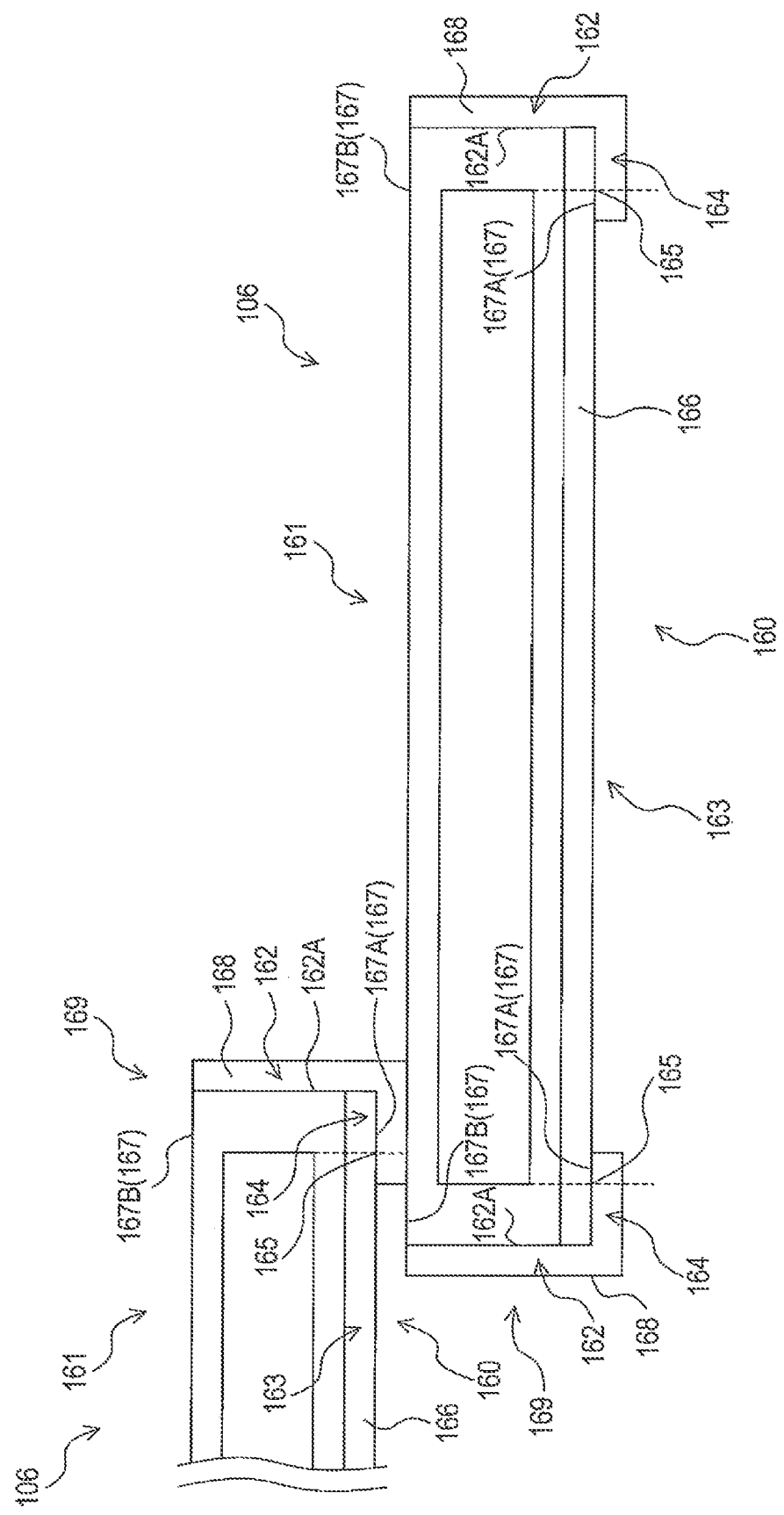
FIG. 11 is an explanatory view illustrating a cross section of two adjacent display units along a vehicle width direction
Figure 12:
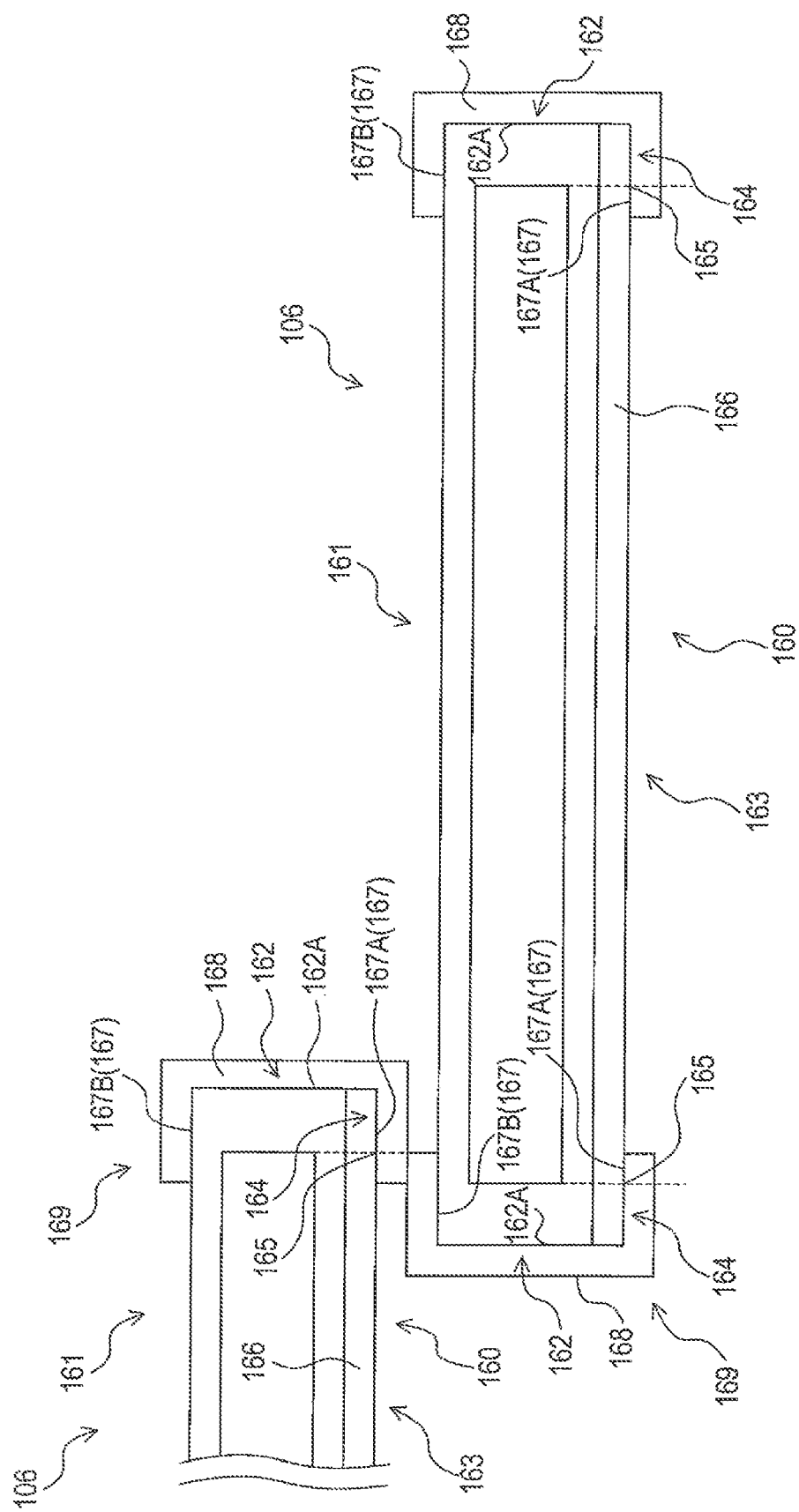
FIG. 12 is an explanatory view illustrating a cross section of two adjacent display units along a vehicle width direction

As an example, each display unit 106 is formed in a rectangular thin plate shape and has a front surface 160 and a back surface 161 (cf. FIGS. 11 and 12). The front surface 160 has a display area 163 and a non-display area 164. The display area 163 has a rectangular shape and is provided apart from the edge of the front surface 160. Meanwhile, the non-display area 164 is an elongated area located between the edge of the front surface 160 and the display area 163 and extending along the edge of the front surface 160.

A plurality of display elements (not illustrated) are arranged in a matrix inside each display unit 106, and the plurality of display elements are configured to emit display light via the display area 163 on the front surface 160. In the present embodiment, as an example, each of the display units 106 is configured as an organic EL display, and organic EL elements are arranged as the display elements inside each of the display units 106. Naturally, each display unit 106 may be configured as a display device except for the organic EL display, such as a liquid crystal display. On the other hand, wiring or the like to a plurality of display elements is provided inside the non-display area 164 in each display unit 106, and display light is not emitted from the non-display area 164.

[3. Configuration of Plurality of Display Units]

Figure 13:
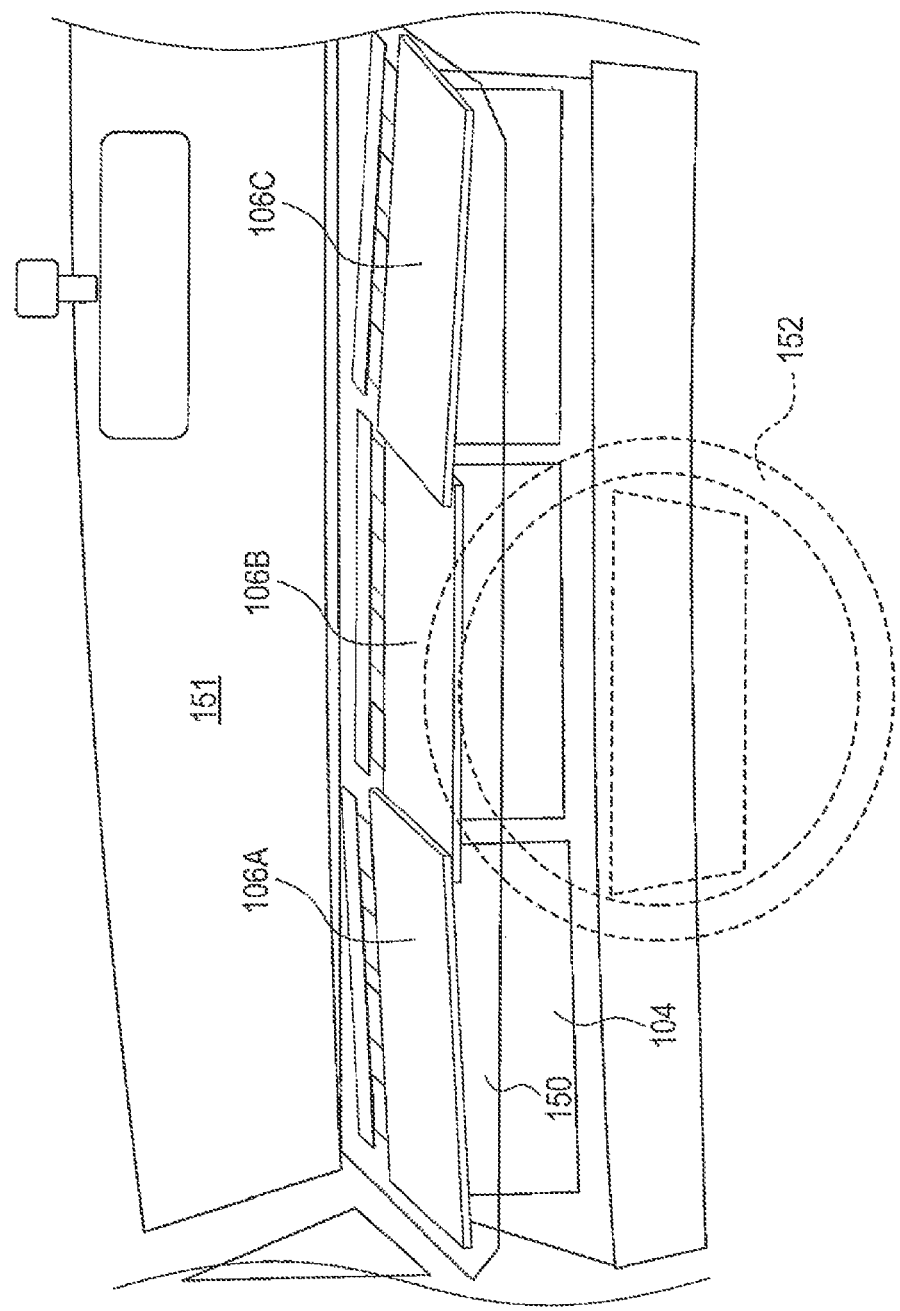
FIG. 13 is an explanatory view illustrating a placement mode of a plurality of display units.
Figure 14:
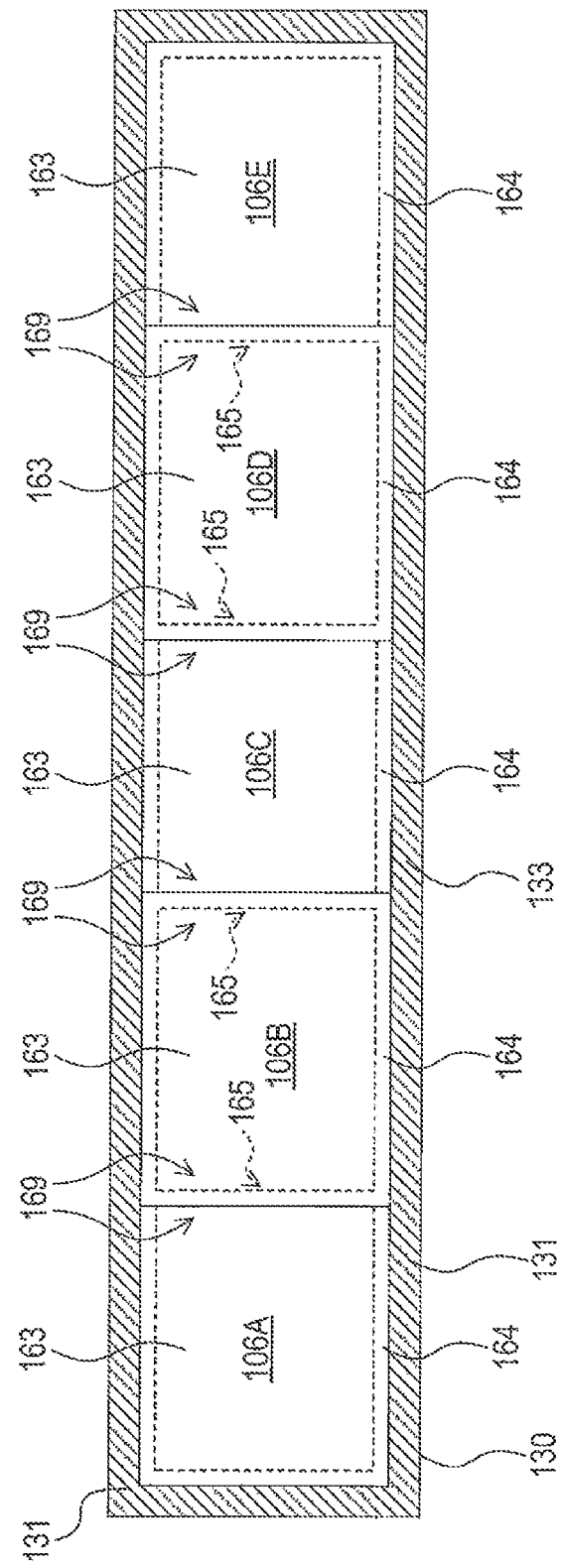
FIG. 14 is an explanatory view of a plurality of display units provided in the meter hood as viewed from the front surface side.
Figure 15:
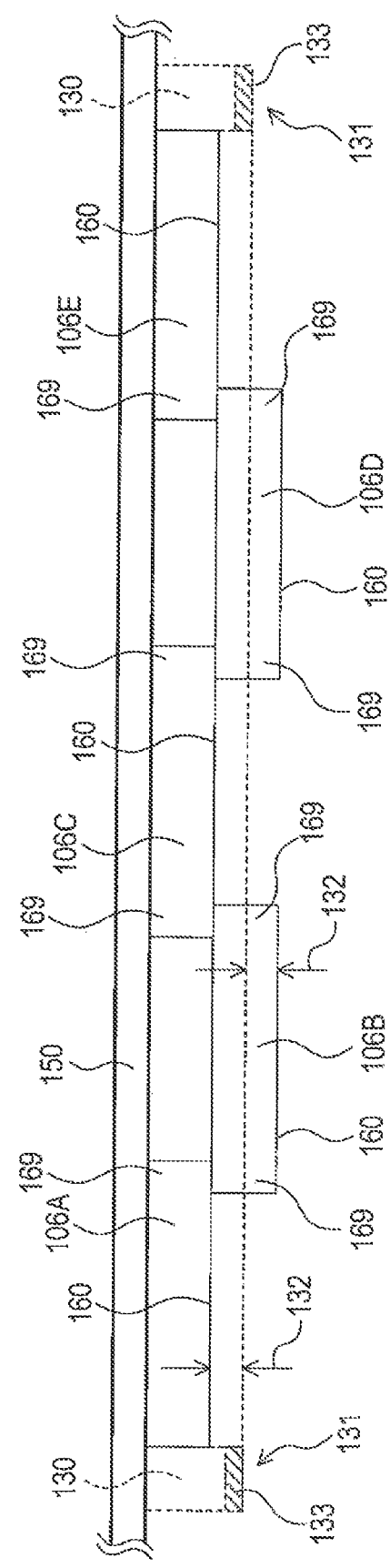
FIG. 15 is an explanatory view illustrating a plurality of display units provided in a meter hood and a cross section along the vehicle width direction.

The first to fifth display units 106A to 106E are provided such that the back surface 161 abuts on or approaches the lower surface of the meter hood 150, the front surface 160 faces the reflector 104, and the first to fifth display units are arranged in a line in the vehicle width direction from the right end to the left end of the dashboard of the vehicle (cf. FIGS. 13 to 15). As an example, the first to fifth display units 106A to 106E are arranged in order from the left end to the right end. In addition, the first display unit 106A located on the leftmost side and/or the fifth display unit 106E located on the rightmost side may be disposed at a position separated from the end of the dashboard.

Here, among the first to fifth display units 106A to 106E, those located in front of positions of a driver and an occupant in the passenger seat are defined as specific display units (cf. FIGS. 13 to 16). Specifically, the second display unit 106B facing a steering wheel 152 of the vehicle and the fourth display unit 106D are the specific display units. The first, third, and fifth display units 106 adjacent to the specific display unit are defined as adjacent display units.

The specific display units 1066, 106D and the adjacent display units 106A, 106C, 106E adjacent to both sides of the specific display units 106B, 106D are arranged such that the specific display units 106B, 106D are located closer to the reflector 4 than the adjacent display units 106A, 106C, 106E and have edge portions overlapping with each other (cf. FIGS. 14 and 15). That is, the specific display units 106B, 106D and the adjacent display units 106A, 106C, 106E may be arranged such that the display areas 163 overlap each other (cf. FIGS. 11 and 12). In addition, for example, the specific display units 106B, 106D and the adjacent display units 106A, 106C, 106E may be arranged such that only the non-display areas 164 overlap each other, or the display areas 163 do not overlap each other, and the display area 163 and the non-display area 164 overlap each other.

For example, only the second display unit 106B or the fourth display unit 106D may be used as the specific display unit. In this case, each of the two display units 106 not adjacent to the specific display unit may be disposed in a state where the edge portions do not overlap with the other display units 106.

[4. Polarizing Plate]

Each display unit 106 is provided with a polarizing plate 166 in contact with the front surface 160 (cf. FIGS. 11 and 12). The polarizing plate 166 covers at least the entire display area 163. A circularly polarizing plate may be used as the polarizing plate 166. Hereinafter, a surface forming the edge of each display unit 106 is referred to as an end surface 162. The end surface 162 extends from the edge of the front surface 160 to the edge of the back surface 161.

A portion of each display unit 106 overlapping another display unit 106 adjacent to the display unit 106 will be referred to as an overlapping portion 169 (cf. FIGS. 14 and 15). That is, one overlapping portion 169 corresponding to one adjacent display unit 106 is formed in each of the first and fifth display units 106A, 106E. On the other hand, two overlapping portions 169 respectively corresponding to the two adjacent display units 106 are formed in each of the second to fourth display units 1066 to 106D.

Of a boundary line between the display area 163 and the non-display area 164 in each display unit 106, a section close to another adjacent display unit 106 is defined as a proximity section 165. The proximity section 165 includes a section closest to another display unit 106 on the boundary line. Further, the proximity section 165 may include, for example, a section extending along the overlapping portion 169 with another display unit 106 and/or a section located in the overlapping portion 169 on the boundary line. That is, in each of the first and fifth display units 106A, 106E, one proximity section 165 corresponding to one adjacent display unit 106 is formed. On the other hand, in each of the second to fourth display units 106B to 106D, two proximity sections 165 corresponding to two adjacent display units 106 are formed.

In each display unit 106, the polarizing plate 166 is disposed to straddle the entire region of one or two proximity sections 165 and cover a portion extending along the proximity section 165 in the non-display area 164. In the present embodiment, as an example, in each display unit 106, the polarizing plate 166 covers the entire display area 163 and the entire non-display area 164.

The polarizing plate 166 may not be provided in all the display units 106 in the above manner. That is, for example, in each of two or more adjacent (in other words, continuously arranged) display units 106, the polarizing plate 166 may be provided to straddle the proximity section 165 corresponding to any one of the display units 106 in the above manner. For example, in at least one of the first to fifth display units 106A to 106E, the polarizing plate 166 may be provided to straddle at least one proximity section 165 in the above manner. Each display unit 106 may not be provided with the polarizing plate 166 in the above manner.

[5. Regarding Reflection Reduction Processing]

Reflection reduction processing 168 for reducing reflection of light is performed to define a reflection suppressor on the respective overlapping portions 169 in the first to fifth display units 106A to 106E (cf. FIGS. 11 and 12). Specifically, for example, the reflection reduction processing 168 may be performed by applying a dark (e.g., black) paint.

Here, an area including the edge (in other words, the area in contact with the end surface 162) on each of the front surface 160 and the back surface 161 of each display unit 106 is defined as an edge area 167 (cf. FIG. 10). More specifically, the edge area 167 may include all or a part of the non-display area 164.

In the end surface 162 of each display unit 106, an area close to another adjacent display unit 106 is defined as a first area 162A. The first area 162A may include, for example, an area located in the overlapping portion 169 of the end surface 162 with another display unit 106. In the edge area 167 of the front surface 160 of each display unit 106, a portion in contact with the first area 162A is defined as a second area 167A. For example, the second area 167A may be located in the overlapping portion 169. In the edge area 167 of the back surface 161 of each display unit 106, a portion in contact with the first area 162A is defined as the third area 167B. For example, the third area 167B may be located in the overlapping portion 169.

That is, the first to third areas 162A, 167A, 167B are provided in the overlapping portions 169 in the first to fifth display units 106A to 106E, respectively. In each overlapping portion 169, the reflection reduction processing 168 for reducing reflection of light is performed on at least two of the first to third areas 162A, 167A, 167B. Specifically, for example, the reflection reduction processing 168 may be performed on the first and second areas 162A, 167A (cf. FIG. 11), or the reflection reduction processing 168 may be performed on the first to third areas 162A, 167A, 167B (cf. FIG. 12).

The reflection reduction processing 168 may not be performed on all the overlapping portions 169. That is, for example, in each of two or more adjacent display units 106, the reflection reduction processing 168 may be performed on the overlapping portion 169 corresponding to any one of these display units 106. For example, in at least one of the first to fifth display units 106A to 106E, the reflection reduction processing 168 may be performed on at least one overlapping portion 169. For example, in each display unit 106, the reflection reduction processing 168 may be performed over the entire circumference. For example, the reflection reduction processing 168 may not be performed on each display unit 106.

[6. Configuration of Outer Peripheral Frame]

The irradiator 103 includes an outer peripheral frame 130 surrounding the first to fifth display units 106A to 106E (cf. FIGS. 14 and 15). The outer peripheral frame 130 is a frame-shaped portion protruding from the lower surface of the meter hood 150. The outer peripheral frame 130 may be a part of the meter hood 150. That is, the outer peripheral frame 130 may be formed by partially protruding the lower surface of meter hood 150. In the outer peripheral frame 130 surrounding the plurality of display units 106, a surface facing the reflector 104 is defined as a top surface 131. In the present embodiment, as an example, the top surface 131 is substantially parallel to the front surface 160 of each display unit 106.

Each display units 106 has the same thickness (hereinafter also described as d), and the distance between the front surface 160 and the top surface 131 of each display unit 106 (hereinafter also referred to as a top surface distance 132) is D/2 or less. Specifically, in the present embodiment, the second and fourth display units 106B, 106D are configured as specific display units and are located closer to the reflector 104 than the remaining display units 106A, 106C, 106E. Thus, the front surfaces 160 of the second and fourth display units 106B, 106D are located closer to the reflector 104 than the top surface 131, and the top surface distance 132 of each of the front surfaces 160 is D/2. On the other hand, the top surface 131 is located closer to the reflector 104 than the front surfaces 160 of the first, third, and fifth display units 106A, 106C, 106E, and the top surface step 132 of each of the front surfaces 160 is D/2.

A step or an inclination may be formed on the top surface 131, and the top surface distance 132 between each display unit 106 and a portion of the top surface 131 adjacent to the display unit 106 may be adjusted to be D/2 or less. For example, the top surface distance 132 may be D/2 or less in at least one of the plurality of display units 106.

In order to reduce a difference between the appearance of the top surface 131 and the appearance of the front surface 160 of each of the plurality of display units 106 not emitting the display light (hereinafter, the front surface 160 at the time of non-display), surface treatment 133 corresponding to the appearance of the front surface 160 is performed on the top surface 131.

Specifically, for example, a pattern may be formed on the top surface 131 by embossing, or a geometric pattern or the like may be formed on the top surface 131. For example, in order to reduce a difference in reflection characteristic between the top surface 131 and the front surface 160 at the time of non-display, a polarizing plate similar to that provided in each display unit 106 may be attached to the top surface 131, coating, plating, printing, or vapor deposition may be performed, or a sheet or a film may be attached. The reflection characteristic may be, for example, a reflectance or a gloss value. For example, in order to reduce a difference in color and/or gloss between the top surface 131 and the front surface 160 at the time of non-display, coating, plating, printing, or vapor deposition may be performed on the top surface 131, or a sheet or a film may be attached.

The top surface distance 132 in the outer peripheral frame 130 may be larger than D/2. The top surface 131 may not be subjected to the surface treatment 133. The display device 101 may not include the outer peripheral frame 130.

[7. Image Control]

Figure 16:
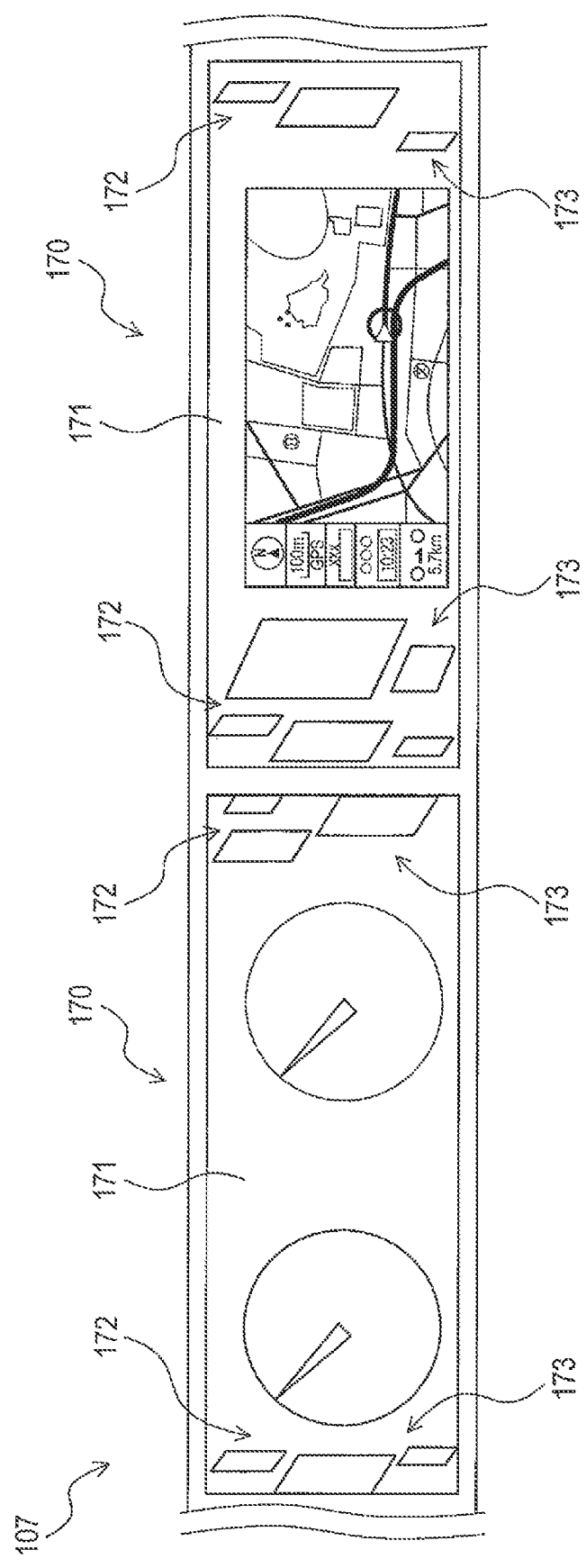
FIG. 16 is an explanatory view of a part of an entire image projected by the display device.

As described above, the controller 102 controls each of the first to fifth display units 105A to 105E so as to emit the display light toward the reflector 104, thereby displaying the entire image 107 that is a virtual image (cf. FIG. 16). Hereinafter, each image projected by the display light of each display unit 106 is referred to as an individual image 170. FIG. 16 illustrates a part of the entire image 107, and the part is made up of two individual images 170. The individual images 170 of the respective display units 106 are displayed so as to be adjacent to each other in the vehicle width direction and arranged in a line. The entire image 107 is formed by combining these individual images 170. In the present embodiment, the display units 106 are arranged such that the edge portions overlap each other. Thus, the gap between the individual images 170 of the two adjacent display units 106 is narrowed, and generation of a seam between the individual images 170 is reduced.

Here, a portion constituting the background in the entire image 107 and each individual image 170 is defined as a background image 171. In each individual image 170, a portion adjacent to another individual image 170 is defined as an adjacent region 172. That is, in the present embodiment, one adjacent region 172 exists in the individual image 170 projected by each of the first and fifth display units 106A, 106E located at the ends, and two adjacent regions 172 exist in the individual image 170 projected by each of the remaining display units 106B to 106D. Hereinafter, a direction in which the individual images 170 are arranged (in other words, in the vehicle width direction) is defined as a horizontal direction, and a direction orthogonal to the horizontal direction is defined as a vertical direction.

The controller 102 controls each display unit 106 so as to set the background image 171 in the entire image 107 (in other words, each individual image 170) to a dark color (e.g., black). The present invention is not limited thereto, and the controller 102 may control the display units 106 that project two or more individual images 170 adjacent to each other (in other words, arranged continuously) so as to set the background images 171 of these individual images 170 to a dark color.

The controller 102 controls each display unit 106 so that a plurality of image elements 173 arranged irregularly are displayed in the entire adjacent region 172 in each individual image 170. Specifically, the plurality of image elements 173 are arranged in the entire region of each adjacent region 172, and the position of each image element 173 in the horizontal direction and the vertical direction is determined irregularly. Each image element 173 has substantially the same color and shape but has irregularly determined lengths in the horizontal and vertical directions. Thereby, a horizontal interval and a vertical interval between two adjacent image elements 173 are determined irregularly.

For example, one of the horizontal interval and the vertical interval of each image element 173 may be determined irregularly. However, it is preferable that the horizontal interval of each image element 173 be determined irregularly. This can effectively restrict a seam from being conspicuous. For example, one or both of the horizontal length and the vertical length of each image element 173 may be the same. For example, the color and/or shape of each image element 173 may be determined irregularly. For example, the color, shape, and size of each image element 173 may be the same, and the position and interval of each image element 173 may be determined irregularly.

The controller 102 may not cause the plurality of image elements 173 to be displayed in each of the adjacent regions 172 of all the individual images 170. That is, in each of two or more adjacent individual images 170, the controller 102 may cause the plurality of image elements 173 to be displayed in the manner described above in the adjacent region 172 included in each of the individual images 170 and adjacent to another individual image 170.

Furthermore, the controller 102 measures the brightness of the external light incident on the plurality of display units 106 and/or the reflector 104 based on the signal from the detector 122. The controller 102 controls each display unit 106 so that the entire image 107 with image quality corresponding to the brightness of the external light is displayed.

Specifically, the controller 102 may adjust, for example, the color of the background image 171 or the luminance of the entire image 107 in accordance with the measurement result. More specifically, for example, when the setting sun or the morning sun is incident on the plurality of display units 106 and/or the reflectors 104, and the measured value of the brightness of the external light is high, the controller 102 may improve the brightness of the color of the background image 171 or may improve the luminance of the entire image 107.

The controller 102 may not adjust the image quality of the entire region of the entire image 107. That is, the controller 102 may control the display unit 106 that projects two or more adjacent individual images 170 so that these individual images 170 have image quality corresponding to the measured brightness of the external light.

A case is assumed where display units of different models are used as some of the plurality of display units 106. In such a case, the controller 102 preferably adjusts the image quality of the individual image projected by each display unit 106 in accordance with, for example, the appearance of the surface of each model and/or the characteristic of the display light.

All or some of the control for darkening the background image 171, the display of the plurality of image elements 173 in the adjacent region 172, and the adjustment of the image quality corresponding to the brightness of the incident light detected by the detector 122 may be omitted.

[8. Effects]

(1) According to the above embodiment, the individual images 170 projected by the specific display units 106B, 106D and the adjacent display units 106A, 106C, 106E can be brought closer to each other. This can reduce the generation of a gap at the boundary between these individual images 170.

The edge portions of the adjacent display units 106A, 106C, 106E are hidden by the edge portions of the specific display units 106*6*, 106D. Hence it is possible to reduce the reflection of the external light or the display light toward the reflector 104 at the edge portion of each of the adjacent display units 106A, 106C, 106E and to reduce the reflection of the edge portions in the reflector 104.

The second and fourth display units 106*6*, 106D, which are specific display units, are located in front of the driver seat and the passenger seat, respectively. Thus, even if the end surface 162 of the second display unit 106B is reflected in the reflector 104, a direction in which the end surface 162 spreads is similar to the line-of-sight direction of the driver, the end surface 162 is inconspicuous to the driver. The end surface 162 of the fourth display unit 106D also produces a similar effect in relation to the occupant in the passenger seat.

Therefore, it is possible to restrict a seam from being visible in the entire image 107.

(2) The entire image 107 is displayed in a dark space below the meter hood 150 (in other words, the inside of the dashboard). The background image 171 in the entire image 107 is formed using a dark color. Thus, for example, even when a gap is generated at the boundary between the individual images 170, or the edge portion of the display unit 106 is projected onto the reflector 104, it is possible to make the gap or the edge portion inconspicuous. Therefore, it is possible to restrict a seam from being visible in the entire image 107.

(3) The plurality of irregularly arranged image elements 173 are displayed in the adjacent region 172 in each of the adjacent individual images 170, which makes the boundary between these individual images 170 difficult to see. Thereby, for example, even when a gap is generated at the boundary between the individual images 170 or the edge portion of the display unit 106 is projected, it is difficult for the occupant to notice the gap or the edge portion. Therefore, it is possible to restrict a seam from being visible in the entire image 107.

(4) The image quality of the entire image 107 is adjusted in accordance with the brightness of the external light detected by the detector 122. Thus, for example, even when bright external light is incident on each of the plurality of display units 106 and the reflector 104, and the edge portion of the display unit 106 or an image therearound is projected in the entire image 107, these can be made inconspicuous.

(5) The polarizing plate 166 is disposed on the front surface 160 of the display unit 106 so as to straddle proximity section 165 at the boundary between the display area 163 and the non-display area 164. Thus, it is possible to reduce the reflection of light, emitted from each of the plurality of display units 106 and external light, toward the reflector 104 in the non-display area 164 around the proximity section 165. Therefore, it is possible to reduce the reflection of the non-display area 164 in the reflector 104, and to thereby restrict a seam from being visible in the entire image 107.

(6) In the overlapping portion 169 of the display unit 106, the reflection reduction processing 168 is performed on at least two of the first to third areas 162A, 167A, 167B. It is thus possible to effectively reduce the reflection of light emitted from each of the plurality of display units 106 and external light toward the reflector 104 in the overlapping portion 169 of the display unit 106. As a result, it is possible to reduce the reflection of the overlapping portion 169 in the reflector 104 and to thereby restrict a seam from being visible in the entire image 107.

(7) The top surface distance 132 between the front surface 160 of the display unit 106 and the top surface 131 of the outer peripheral frame 130 is equal to or less than D/2. That is, the step between the front surface 160 and the top surface 131 is adjusted so as not to be large. Therefore, it is possible to reduce reflection of light emitted from each of the plurality of display units 106 and external light toward the reflector 104 in the edge portion of the display unit 106 and the outer peripheral frame 130 and to reduce the reflection in the vicinity of the outer periphery of the individual image 170 in the reflector 104.

(8) The top surface 131 of the outer peripheral frame 130 is subjected to the surface treatment 133 corresponding to the appearance of the front surface 160 of the display unit 106 not emitting the display light. This makes it possible to reduce a difference in appearance between the top surface 131 and the front surface 160. Therefore, even if the top surface 131 is reflected in the reflector 104, it is possible to restrict the top surface 131 from being conspicuous.

(9) Further, by providing outer peripheral frame 130, alignment can be easily performed at the time of attaching each display unit 106 to the lower surface of meter hood 150, and the rigidity of the irradiator 103 can be enhanced.

Fourth Embodiment

[1. Overall Configuration]

First, an overall configuration of a display device according to the present fourth embodiment will be described.

Figure 17:
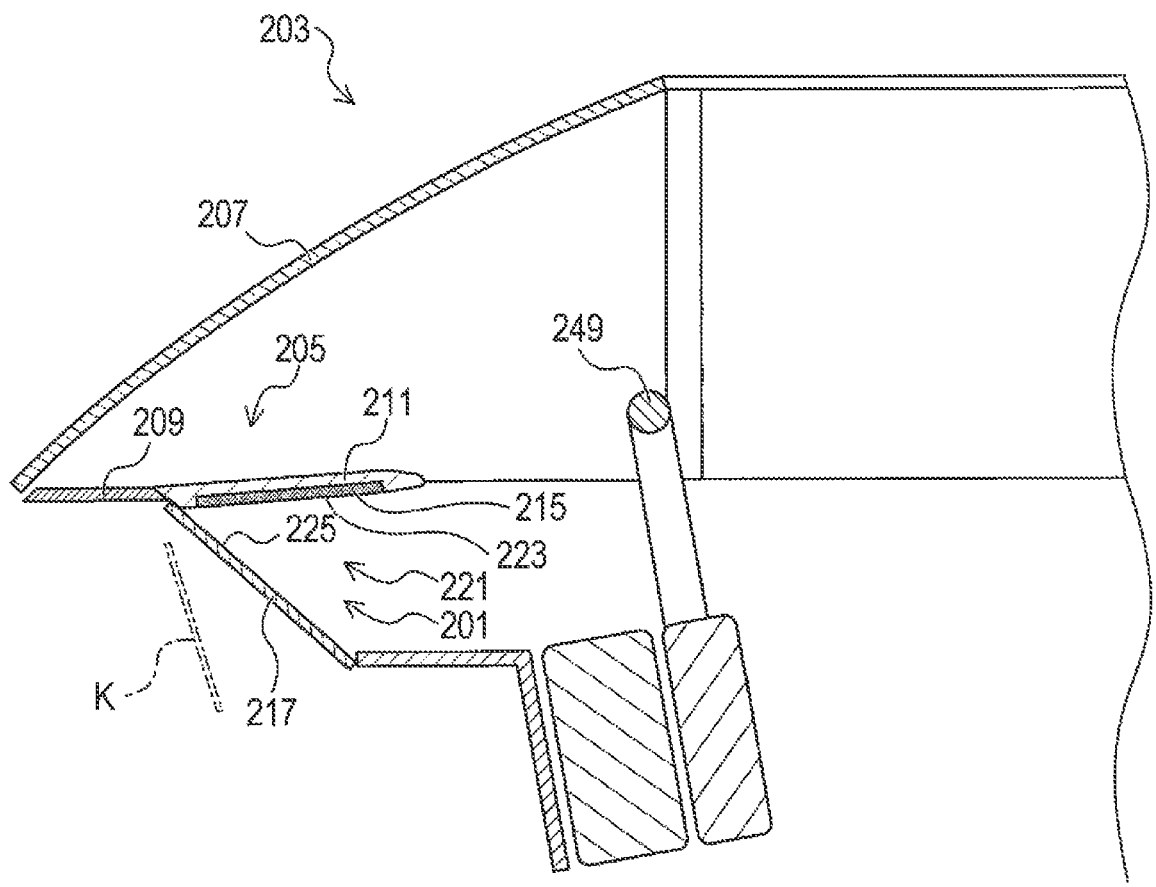
FIG. 17 is an explanatory view illustrating the inside of a vehicle including a display device according to a fourth embodiment as viewed from the lateral side.

As illustrated in FIG. 17, a display device 201 of the present fourth embodiment is mounted in a vehicle 203 that is an automobile and displays various images such as characters, symbols, and videos for an occupant such as a driver. That is, the display device 201 is an in-vehicle display.

The display device 201 is disposed on a dashboard 205 in front of a driver seat and a passenger seat. Specifically, the dashboard 205 is disposed below a windshield (i.e., front window) 207, and the dashboard 205 includes, on its upper surface, an instrument panel (i.e., IP panel) 209 to which various instruments are attached. The IP panel 209 has a visor 211, which is a light shielding plate, to face the driver seat and the passenger seat (i.e., the rear side of the vehicle 203). The visor 211 protrudes to the rear side of the vehicle 203.

The display device 201 is disposed below the visor 211, and an image displayed on the display device 201 is visually recognizable to the occupant seated on the driver seat or the passenger seat. The displayed image is a virtual image (i.e., display image) as described later, and hence the occupant visually recognizes the virtual image.

[2. Configuration of Display Device]

Next, a mechanical configuration of the display device 201 will be described in detail.

As illustrated in FIG. 17, the display device 201 includes a display 215 that emits light, a reflecting mirror 217 that reflects light, and a display control device (i.e., the controller) 219 to be described later with reference to FIG. 19.

The display 215 and the reflecting mirror 217 constitute a display unit 221 having a mechanical configuration for displaying an image by light, and the display unit 221 is disposed on the dashboard 205. The display control device 219 may be disposed at a position away from the display unit 221.

The display 215 is a device capable of displaying various images such as characters, symbols, and videos by generated light. That is, the display 215 is capable of displaying various images such as characters, symbols, and videos based on a control signal from the display control device 219.

As the display 215, for example, it is possible to employ a device having the shape of a flat plate and capable of displaying an image by using an LED such as an organic LED. The LED is an abbreviation for light-emitting diode. As the display 215, a liquid crystal display including a backlight may be employed.

The display 215 is attached to the lower surface of the visor 211 and is disposed with a display surface 223, which is a surface for displaying an image, facing downward. That is, the display 215 is configured to emit light toward the reflecting mirror 217 disposed below the display 215.

The reflecting mirror 217 is, for example, a flat mirror that reflects the light emitted from the display 215 and is inclined at an angle of, for example, 40 degrees with respect to the horizontal direction such that the position becomes lower toward the driver side (i.e., the right side of FIG. 17). The surface of the reflecting mirror 217 on the display 215 side is a reflective surface 225 that reflects light.

In particular, in the present fourth embodiment, a mirror capable of adjusting a reflectance, which is a ratio of light reflection, is used as the reflecting mirror 217. For example, as the reflecting mirror 217, a gas chromic mirror, an electrochromic mirror, a mirror including a liquid crystal shutter, or the like can be employed. As will be described later, the reflecting mirror 217 can adjust its own reflectance by a control signal from the display control device 219.

Figure 18:
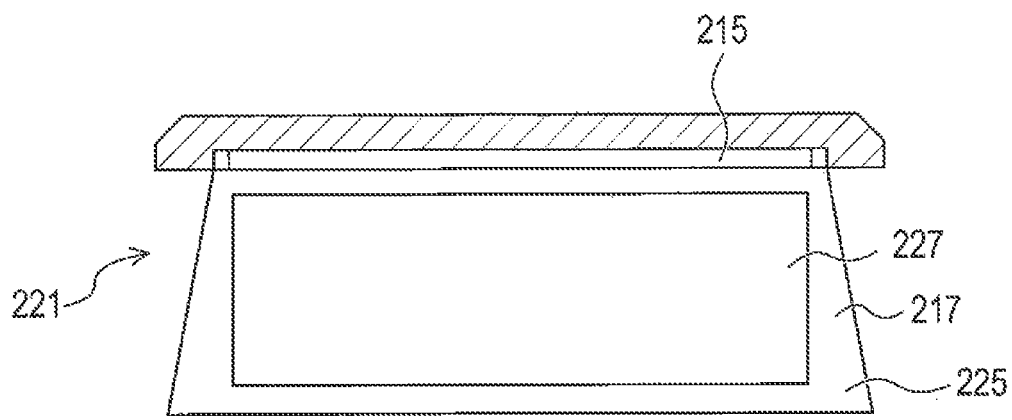
FIG. 18 is a perspective view illustrating a state where a display unit of the display device according to the fourth embodiment is viewed from the driver side.

As illustrated in FIG. 18, the reflecting mirror 217 has a trapezoidal planar shape elongated in a right-left direction, and a display region 227 in which an image of the display 215 is displayed is provided on the surface (i.e., reflective surface) 225 of the front side of the reflecting mirror 217. The surface shape of the display region 227 is the same as the surface shape (e.g., rectangular) of the display 215.

As illustrated in FIG. 17 described above, in the display device 201, more specifically, in the display unit 221, the display 215 is disposed on the front side of and above the reflecting mirror 217 with the display surface 223 that displays an image facing downward, so that the image displayed by the display unit 221 is visually recognizable to the driver by being reflected on the reflecting mirror 217.

Specifically, when the light of the image, which is a real image, from the display 215 is reflected on the reflective surface 225 on the front side of the reflecting mirror 217, the driver who sees the reflected light recognizes as if the real image is at a predetermined position on the back side of the reflecting mirror 217. That is, a virtual image that is not actually present is recognized at a predetermined position in the line-of-sight direction of the driver. In other words, the image that can be viewed by the reflecting mirror 217 is a virtual image formed on the back side of the reflecting mirror 217. In FIG. 17, the virtual image is denoted by K.

As will be described in detail later, in the present fourth embodiment, since the light emitted from the display 215 to the reflecting mirror 217 is reflected toward the driver side in accordance with the reflectance of the reflecting mirror 217, the brightness (i.e., luminance) of the virtual image formed on the back side of the reflecting mirror 217 changes in accordance with the reflectance. The luminance of the virtual image also changes depending on the brightness (i.e., luminance) of the image displayed on display 215.

That is, in the display device 201 using the reflecting mirror 217 as thus described, the luminance of the virtual image formed by the reflecting mirror 217 can be set by the luminance of the display 215 and the reflectance of the reflecting mirror 217.

[3. Electrical Configuration of Display Device]

Next, an electrical configuration of the display device 201 and the like will be described.

Figure 19:
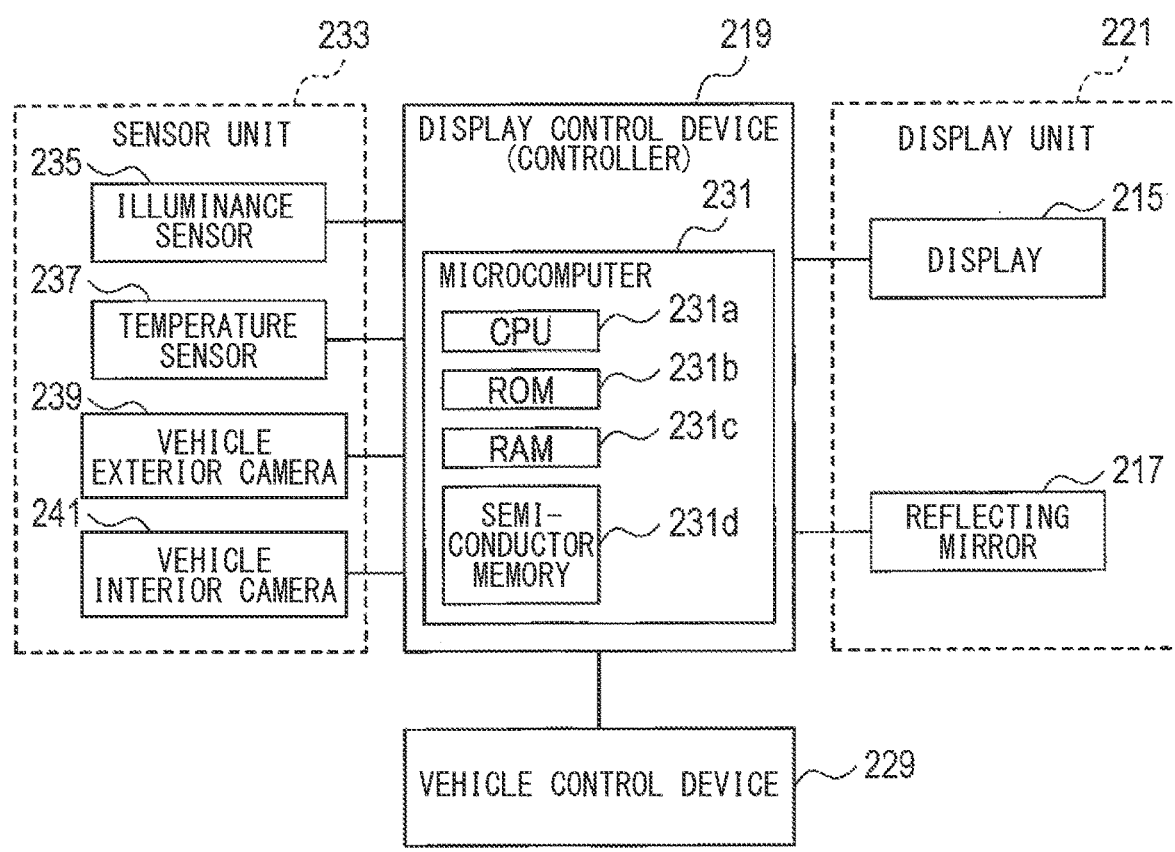
FIG. 19 is a block diagram illustrating an electrical configuration of the display device and the like according to the fourth embodiment.

As illustrated in FIG. 19, the display device 201 includes the display control device 219 that controls the display device 201, and a vehicle control device 229 that controls an operation such as the traveling of the vehicle 203 is connected to the display control device 219.

The display control device 219 includes a known microcomputer (i.e., microcomputer) 231 including a CPU 231$a$, ROM 231$b$, RAM 231$c$, and semiconductor memory 231$d$ such as flash memory. The display control device 219 is configured such that each function is achieved by the CPU 231$a$ executing a program stored in a non-transitional tangible recording medium. In the present fourth embodiment, the semiconductor memory 231$d$ corresponds to the non-transitional tangible recording medium storing the program.

The number of microcomputers 231 included in the display control device 219 may be one or more. Various functions achieved by the display control device 219 are not limited to being achieved by the CPU 231*a* executing a program, and some or all of the functions may be achieved using one or a plurality of pieces of hardware.

As the display unit 221 described above, the display 215 and the reflecting mirror 217 are connected to the display control device 219. A sensor unit 233 that detects the state and the surrounding situation of the vehicle 203 and the like is connected to the display control device 219. Examples of the sensor unit 233 include an illuminance sensor 235, a temperature sensor 237, a vehicle exterior camera 239, a vehicle interior camera 241, and the like.

The illuminance sensor 235 is disposed in a vehicle interior and detects brightness (e.g., illuminance) in the vehicle interior. In addition to the illuminance sensor 235, a known solar sensor can be used. With these sensors, it is possible to detect the influence and degree of solar radiation from the outside of the vehicle.

The temperature sensor 237 is, for example, disposed on or in the vicinity of the display 215 of the display device 201 and directly or indirectly detects the temperature of the display 215. When the temperature sensor 237 is disposed on the display 215, the temperature of the display 215 can be detected directly. When the temperature sensor 237 is disposed in the vicinity of the display 215, for example, in the vicinity of the display 215 in the display unit 221, the IP panel 209, the visor 211, the dashboard 205, or the like, the temperature of the display 215 can be detected indirectly. That is, the temperature sensor 237 may be disposed at a place where the temperature of the display 215 can be directly detected or estimated.

As the vehicle exterior camera 239, for example, a known charge-coupled device (CCD) camera or the like can be employed. Since an image of the surroundings of the vehicle 203 can be shot by the vehicle exterior camera 239, a light source such as a lamp from which light comes into the vehicle interior can be detected based on the shot image.

As the vehicle interior camera 241, for example, a known CCD camera or the like can be employed. Since an image of the occupant or the like in the vehicle interior can be shot by the vehicle interior camera 241, the seating position of the occupant, the occupant wearing sunglasses, and the like can be detected based on the shot image. In addition, it is possible to detect brightness in the vehicle interior and lighting states (e.g., luminance etc. of various display devices based on the image.

The vehicle control device 229 described above can perform various known controls for controlling the traveling state of the vehicle 203, for example, controls of an engine and a brake. In the vehicle 203 that performs autonomous driving, the vehicle control device 229 can control the autonomous driving of the vehicle 203. Examples of the autonomous driving include autonomous driving at or above a level at which the driver can take his/her hand off the steering wheel 249 (e.g., see FIG. 17).

In the present fourth embodiment, the operation of the display 215 can be controlled by transmitting a control signal from the display control device 219 to the display 215. That is, it is possible to display images such as various characters, symbols, and videos on the display 215. In addition, it is possible to control luminance at the time of displaying an image.

The operation of the reflecting mirror 217 can be controlled by transmitting a control signal from the display control device 219 to the reflecting mirror 217. That is, the reflectance indicating the degree of reflection of light can be adjusted by the reflecting mirror 217.

A signal indicating the brightness detected by the illuminance sensor 235 is output from the illuminance sensor 235 to the display control device 219.

A signal indicating the temperature detected by the temperature sensor 237 is output from the temperature sensor 237 to the display control device 219.

A signal indicating an image of the outside of the vehicle shot by the vehicle exterior camera 239 is output from the vehicle exterior camera 239 to the display control device 219.

A signal indicating an image of the inside of the vehicle shot by the vehicle interior camera 241 is output from the vehicle interior camera 241 to the display control device 219.

The semiconductor memory stores, for example, various types of data for controlling the brightness (i.e., luminance) of the display 215 and controlling the reflectance of the reflecting mirror 217. For example, data such as how to control the luminance of the display 215 and the reflectance of the reflecting mirror 217 in order to obtain the luminance of the target virtual image is stored. Further, data such as how to control the luminance of the display 215 and the reflectance of the reflecting mirror 217 in accordance with the surrounding brightness is stored.

[4. Processing of Display Control Device]

Next, among the processing performed by the display control device 219, processing of control for adjusting the luminance of the virtual image to target luminance will be described. The present processing is repeatedly performed every predetermined period while the vehicle 203 is traveling, stopped, or the like, that is, when an ignition switch is turned on.

Figure 20:
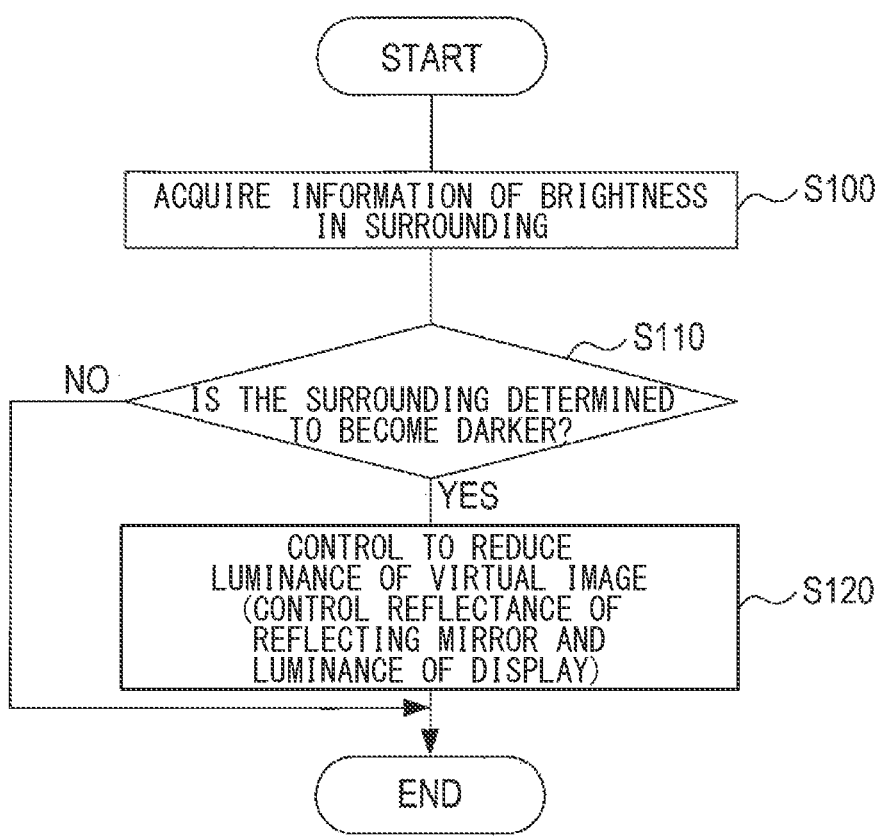
FIG. 20 is a flowchart illustrating control processing by the display control device according to the fourth embodiment.

As illustrated in FIG. 20, the microcomputer 231 acquires a signal from the illuminance sensor 235 in step (i.e., Sin FIG. 20) 100. The microcomputer 231 detects brightness around the illuminance sensor 235 (e.g., in the vehicle interior) based on a signal from the illuminance sensor 235. When the brightness around the vehicle 203 (i.e., the brightness in the surrounding environment) changes such as the brightness in the daytime and the nighttime, the brightness in the vehicle interior also normally changes in the same manner, so that the brightness around the vehicle 203 can also be detected by the illuminance sensor 235.

In subsequent S110, the microcomputer 231 determines whether or not the brightness around the vehicle 203 or in the vehicle interior, that is, the brightness in the surroundings has become darker than before, based on a value indicating brightness (e.g., illuminance). When a positive determination is made here, the microcomputer 231 proceeds to S120, and on the other hand, when a negative determination is made, the microcomputer 231 temporarily terminates the present processing.

The microcomputer 231 determines, for example, whether or not the brightness in the vehicle interior has come into a dark state such as in the nighttime from a bright state in the daytime. Specifically, the microcomputer 231 uses a value indicating brightness (e.g., illuminance) to determine whether or not the brightness in the vehicle interior has changed from a value indicating brightness in the daytime to a value indicating brightness in the nighttime in a dark place such as a tunnel with less lighting. Hereinafter, the nighttime or a dark place is referred to as nighttime or the like.

Since the brightness of the environment outside the vehicle 203 normally changes gradually, a determination value for determining the brightness is determined in advance, and the microcomputer 231 determines the brightness depending on whether or not the brightness is equal to or greater than the determination value. That is, here, for example, the daytime is set in the case of brightness equal to or greater than the determination value, and the nighttime or the like is set in the case of brightness less than the determination value.

In step S120, the microcomputer 231 controls the reflectance of the reflecting mirror 217 and the luminance of the image displayed on the display 215 in order to reduce the luminance of the virtual image. That is, when the surroundings become dark, and the virtual image is displayed with high luminance as in a case where the surroundings are bright, the driver or the like feels that the display is bright, and hence, the microcomputer 231 performs control for reducing the luminance of the virtual image.

When the display 215 is an LED, the microcomputer 231 controls the luminance of the LED itself, and when the display 215 is a liquid crystal display, the microcomputer 231 controls the luminance of the backlight. Hereinafter, the control of the luminance of the LED itself and the control of the luminance of the backlight are simply referred to as the control of the luminance of the display 215.

Here, Table 1 below shows methods (a) to (d) for reducing the luminance of the virtual image when the brightness changes from the state in the daytime to the state in the nighttime or the like, that is, when the surroundings become dark.

TABLE 1

| | Control of reflectance of reflecting mirror | Control of luminance of display |
|---|---|---|
| A | Maintain reflectance | Reduce luminance of display |
| B | Reduce reflectance | Maintain luminance of display |
| C | Reduce reflectance more than B (Reduce significantly) | Increase luminance of display |
| D | Increase reflectance | Increase luminance of display more than C (Increase significantly) |

As described in Table 1, in the case of (A), the reflectance of the reflecting mirror 217 is maintained to be the reflectance in the daytime, and the luminance of the display 215 is made lower than that in the daytime. That is, the microcomputer 231 reduces the luminance of the virtual image by reducing the luminance of the display 215. When the luminance of the display 215 is reduced, the power consumption of the display 215 can be reduced.

In the case of (B), the reflectance of the reflecting mirror 217 is made lower than the reflectance in the daytime, and the luminance of the display 215 is maintained to be the luminance in the daytime. That is, the microcomputer 231 reduces the luminance of the virtual image by reducing the reflectance.

In the case of (C), the reflectance of the reflecting mirror 217 is made significantly lower than the reflectance in the daytime, and the luminance of the display 215 is made higher than the luminance in the daytime. That is, although the luminance of the display 215 increases, the microcomputer 231 reduces the luminance of the virtual image by greatly reducing the reflectance.

In the case of (D), the reflectance of the reflecting mirror 217 is made higher than the reflectance in the daytime, and the luminance of the display 215 is made significantly lower than the luminance in the daytime. That is, although the reflectance increases, the microcomputer 231 reduces the luminance of the virtual image by significantly reducing the luminance of the display 215.

[5. Effects]

In the fourth embodiment, the following effects can be obtained.

(4a) The present fourth embodiment includes the display unit 221 having the display 215 and the reflecting mirror 217 and the display control device 219.

With such a configuration, in the fourth embodiment, when the reflectance of the reflecting mirror 217 is high, and the trouble as described above is likely to occur, the reflectance can be adjusted so as to restrict the occurrence of such a trouble.

That is, in the fourth embodiment, the reflectance of the reflecting mirror 217 can be controlled in accordance with the brightness in the surroundings that are a space affecting the visual recognition of the display using the reflecting mirror 217. For example, the reflectance of the reflecting mirror 217 can be controlled in accordance with the brightness around the vehicle 203 in the daytime or in the nighttime or the like, and thus the brightness in the vehicle interior. Therefore, reflection of scenery or the like around the vehicle 203 can be restricted. The seamless feeling can be enhanced to improve the appearance and look of the display 215 and the like. Furthermore, generation of a double image and stray light can be restricted.

Thus, when the area (quantity) of the portion where light is reflected and displayed on the reflecting mirror 217 (i.e., the display area (quantity)) is increased, for example, even when the display area (quantity) of one reflecting mirror 217 is increased, or the total display area (quantity) is increased using the plurality of reflecting mirrors 217, the problem described above becomes less conspicuous by controlling the reflectance of the reflecting mirror 217, so that it is possible to effectively reduce the problem.

(4b) In the present fourth embodiment, the display control device 219 can control the reflectance of the reflecting mirror 217 and control the luminance of the display 215.

Therefore, it is possible to control the reflectance of the reflecting mirror 217 and the luminance of the display 215 in accordance with the brightness around the vehicle 203 or in the vehicle interior due to the daytime or due to the nighttime or the like, for example, in accordance with the brightness around the reflecting mirror 217.

Examples of the control of the reflectance include control for increasing, reducing, or maintaining the reflectance. Examples of the control of the luminance of the display 215 include control for increasing, reducing, or maintaining the luminance.

(4c) In the present fourth embodiment, in order to display the virtual image (i.e., display image) with target brightness (i.e., luminance), for example, in order to set the luminance of the virtual image to a predetermined low luminance, it is possible to perform control combining the control of the reflectance of the reflecting mirror 217 and the control of the luminance of the display 215.

For example, when the surroundings of the vehicle 203 become dark in the nighttime or the like, and thus the vehicle interior around the display 215 becomes dark, the control combining the reflectance control of the reflecting mirror 217 and the luminance control of the display 215 can be performed so as to reduce the luminance of the virtual image. For example, it is possible to perform control for increasing the reflectance of the reflecting mirror 217 and reducing the luminance of the display 215.

This can reduce the glare of the virtual image and enhance the visibility of the virtual image. When the luminance of the display 215 is reduced in this manner, the power consumption of the display 215 can be reduced.

When the brightness in the vehicle interior becomes brighter than before, control for increasing the luminance of the virtual image may be performed. For example, control for reducing the reflectance of the reflecting mirror 217 and increasing the luminance of the display 215 may be performed. As a result, when the surroundings are bright, the visibility of the virtual image can be enhanced.

[6. Correspondence Relationship Between Words]

In the relationship between the present fourth embodiment and the present disclosure, the display device 201 corresponds to a display device, the display 215 corresponds to a display unit, the reflecting mirror 217 corresponds to a reflector, and the display control device 219 corresponds to a controller.

Fifth Embodiment

A basic configuration of a fifth embodiment is similar to that of the fourth embodiment, and hence a difference from the fourth embodiment will be mainly described below. The same reference numerals as those in the fourth embodiment denote the same configuration, and the preceding description will be referred to.

In the present fifth embodiment, at least the reflectance of the reflecting mirror 217 is controlled in accordance with the presence or absence of a light source such as an artificial light existing around the vehicle 203 and/or the proximity state of the light source.

(5a) First, the outline of the control will be described.

Figure 21:
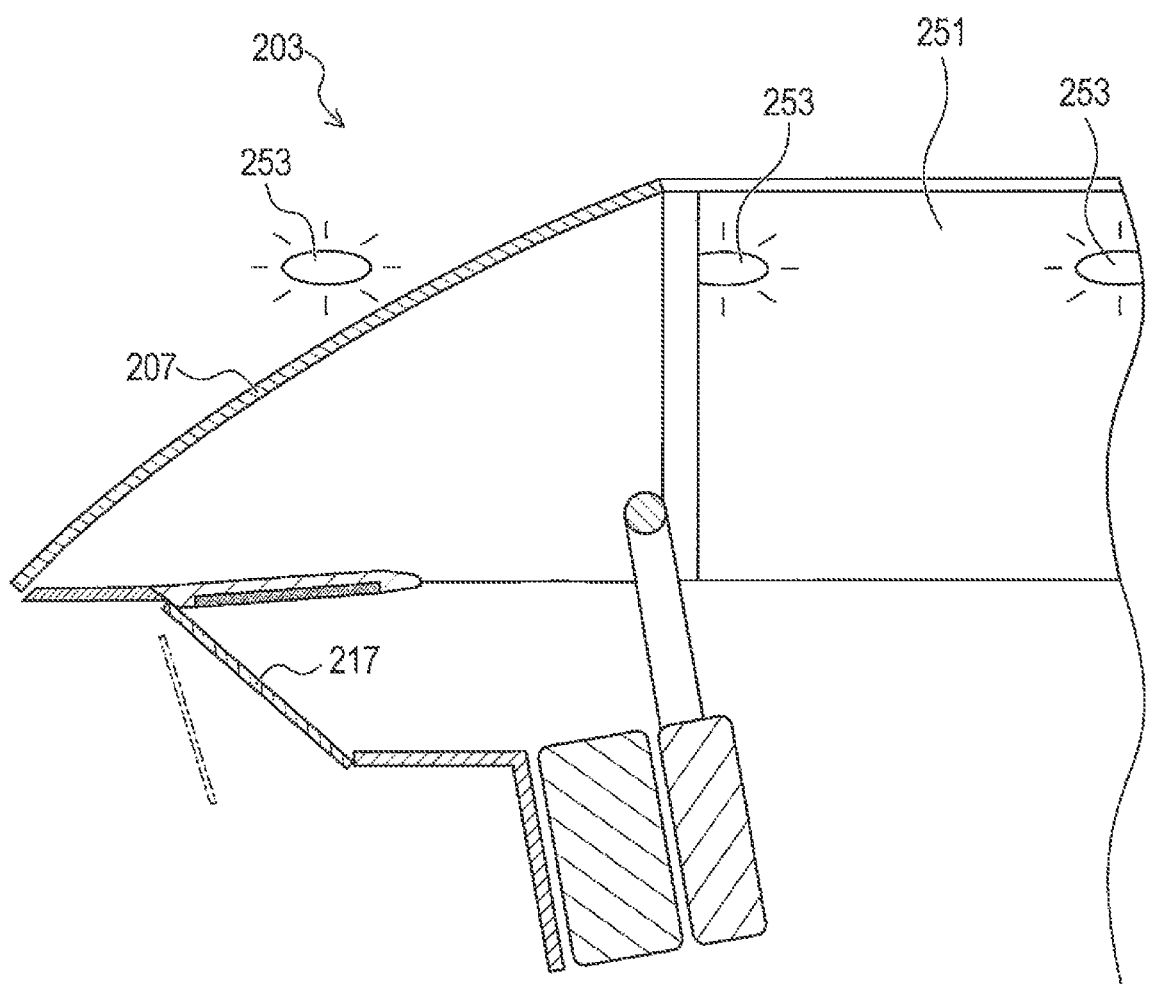
FIG. 21 is an explanatory view illustrating a light incident state of a lighting lamp outside a vehicle in a fifth embodiment.

For example, while the vehicle 203 is traveling, there is light from a headlight that enters the vehicle interior at a low angle from the lateral side or the rear of the vehicle 203. In addition, as illustrated in FIG. 21, there is light of a lighting lamp 253 entering the vehicle interior from the surroundings of the vehicle 203 via the front window 207 or the side window 251 in a tunnel or on an expressway.

Such light is reflected on the reflecting mirror 217, and reduces the visibility of an image (i.e., the display image that is the virtual image) displayed on the display device 201 especially when the surroundings are dark such as in the nighttime or the like.

Therefore, in the present fifth embodiment, in order to enhance the driver's visibility, the reflectance and the like of the reflecting mirror 217 are controlled as illustrated in FIG. 22 below.

(5b) Next, the control processing of the present fifth embodiment will be described.

As illustrated in FIG. 22, in S200, the microcomputer 231 acquires a shot image from the vehicle exterior camera 239, for example.

In subsequent S210, the microcomputer 231 determines whether or not there is light of the headlight or light of the lighting lamp 253 (i.e., light source) around the vehicle 203 from the image shot by the vehicle exterior camera 239. That is, the microcomputer 231 determines whether or not the light of the headlight or the lighting lamp 253 is falling on the vehicle 203. When a positive determination is made here, the microcomputer 231 proceeds to S220, and on the other hand, when a negative determination is made, the microcomputer 231 temporarily terminates the present processing.

The light of the headlight and the light of the lighting lamp 253 can be discriminated because only a part of the light is bright with respect to the darkness in the surroundings.

In S220, since the light from the headlight and the light from the lighting lamp 253 are reflected on the reflecting mirror 217, and the visibility of the display image is reduced, the microcomputer 231 performs control for reducing the reflectance of the reflecting mirror 217.

In subsequent S230, in order to enhance the visibility of the display image, the microcomputer 231 performs control for increasing the luminance of the display 215 and temporarily terminates the present processing.

Although the presence or absence of the light source is determined in S210 above, it may be determined whether or not the light source is approaching (i.e., whether or not the light source is in the proximity state) separately from S210 or in addition to S210. Whether or not the light source is in proximity can be determined by, for example, whether or not the brightness is increasing for the same light source.

By the control described above, the present fifth embodiment has a similar effect to that of the present fourth embodiment.

Further, in the present fifth embodiment, when light from a light source around the vehicle 203 (i.e., external light) enters the vehicle interior, that is, when external light in the surroundings is reflected in the reflecting mirror 217, and the visibility of the display image is reduced, control is performed to reduce the reflectance of the reflecting mirror 217 and increase the luminance of the display 215.

As a result, the reflection of external light in the surroundings is reduced, the complexity of viewing the display image is reduced, and moreover, since the luminance of the display image is sufficiently maintained, so that a remarkable effect of improving the visibility of the display image is obtained.

When the light source in the surroundings becomes non-existent or when the light source becomes distant, control opposite to the above control may be performed. That is, control for increasing the reflectance of the reflecting mirror 217 and reducing the luminance of the display 215 may be performed.

(5c) Next, an experimental example in which the effect of the present fifth embodiment is confirmed will be described.

Here, a nighttime state was assumed. That is, a state where there is no sunlight was assumed. As described in Table 2 below, when the luminance of incidence of an external light source by a spotlight was set, and the reflectance of the reflecting mirror 217 and the luminance of the display 215 were adjusted, the luminance of the display image and the luminance of the external light reflection on the reflecting mirror 217 were measured. Table 2 below also shows the results of the measurement.

TABLE 2

| | [During nighttime lighting] | | | | |
|---|---|---|---|---|---|
| | Reflecting mirror (Reflectance) | Display plate (Luminance) | Display image (Luminance) | External light source (Incident luminance) | External light reflection (Luminance) |
| Without reflectance adjustment | 50% | 30 cd/m² | 15 cd/m² | 100 cd/m² | 50 cd/m² |

TABLE 2-continued

| | [During nighttime lighting] | | | | |
|---|---|---|---|---|---|
| | Reflecting mirror (Reflectance) | Display plate (Luminance) | Display image (Luminance) | External light source (Incident luminance) | External light reflection (Luminance) |
| With reflectance adjustment | 50% → 10% | 150 cd/m² | 15 cd/m² | 100 cd/m² | 10 cd/m² |

As is apparent from Table 2, in a comparative example illustrated in the upper part of Table 2 (i.e., without adjustment), when there was an external light source of 100 cd/m², the reflectance was maintained at 50% without controlling the reflectance, and the luminance of the display 215 was also maintained at 30 cd/m² without controlling the luminance. In this case, the luminance of the display image was 15 cd/m², and the luminance of the portion in which external light was reflected was 50 cd/m².

In contrast, in the present fifth embodiment illustrated in the lower part of Table 2 (i.e., with adjustment), when there is an external light source of 100 cd/m², the reflectance is reduced from 50% to 10%, and the luminance of the display 215 is increased to 150 cd/m². In this case, the luminance of the display image was ensured at 215 cd/m², and the luminance of the portion in which the external light was reflected was reduced to 10 cd/m².

As described above, in the present fifth embodiment, when there is an external light source, the reflectance is reduced, and the luminance of the display 215 is increased, so that the luminance of the display image can be sufficiently ensured, and the reflection of external light can be reduced. Therefore, it can be seen that the effect of improving the visibility of the display image can be obtained.

Sixth Embodiment

A basic configuration of a sixth embodiment is similar to that of the fourth embodiment, and hence a difference from the fourth embodiment will be mainly described below. The same reference numerals as those in the fourth embodiment denote the same configuration, and the preceding description will be referred to.

In the present sixth embodiment, the reflectance of the reflecting mirror 217 and the like are controlled in accordance with the opening and closing of a sunroof or a roof of an open car. Details will be described below.

In the display control device 219 of the present sixth embodiment, as illustrated in FIG. 23, the microcomputer 231 determines whether or not a specific device that affects brightness in the vehicle interior has been activated in S300. The microcomputer 231 determines, for example, whether or not a switch or the like for opening the sunroof or the roof of the open car has been operated. When a positive determination is made here, the microcomputer 231 proceeds to S310, and on the other hand, when a negative determination is made, the microcomputer 231 temporarily terminates the present processing.

In S310, it is considered that the sunroof or the roof of the open car is opened, the bright external light outside the vehicle interior enters the vehicle interior, and the brightness inside the vehicle interior increases. Thus, in this state, the external light is reflected on the reflecting mirror 217 to cause a decrease in the visibility of the display image, and hence the microcomputer 231 performs control for reducing the reflectance of the reflecting mirror 217.

In subsequent S230, in order to enhance the visibility of the display image, the microcomputer 231 performs control for increasing the luminance of the display 215 and temporarily terminates the present processing.

The present sixth embodiment has a similar effect to that of the present fifth embodiment. The processing described above may not be performed in the nighttime or the like.

In the above FIG. 23, the case has been described as an example where the roof of the sunroof or the open car is opened and the brightness in the vehicle interior is increased. However, when the roof of the sunroof or the open car is closed and the brightness in the vehicle interior is reduced, contrary to the above control, control for increasing the reflectance of the reflecting mirror 217 and control for reducing the luminance of the display 215 may be performed.

Seventh Embodiment

A basic configuration of a seventh embodiment is similar to that of the fourth embodiment, and hence a difference from the fourth embodiment will be mainly described below. The same reference numerals as those in the fourth embodiment denote the same configuration, and the preceding description will be referred to.

The present seventh embodiment is a form in which the reflectance and the like of the reflecting mirror 217 are controlled when, for example, a relaxation mode or an entertainment display mode is set in an autonomous driving state, a parking state, or the like in a vehicle having a driving support function.

The relaxation mode is a mode in which the amount of light of the indoor light is reduced to relax the occupant, for example, in the nighttime or the like. The entertainment display mode is a mode in which a television, a movie, a game, or the like is displayed on a display (e.g., entertainment display) except for the in-vehicle display device 201.

In the present seventh embodiment, for example, in a case where a roof display, an entertainment display, or other indirect lighting in the vehicle interior is used, when an image is not displayed on the display device 201, control for reducing the reflectance of the reflecting mirror 217 is performed.

The roof display is, for example, a display disposed on a ceiling or the like for an occupant in a rear seat. The entertainment display is an entertainment display that displays a television, a movie, a game, or the like.

Hereinafter, the control of the present seventh embodiment will be described.

Figure 24:
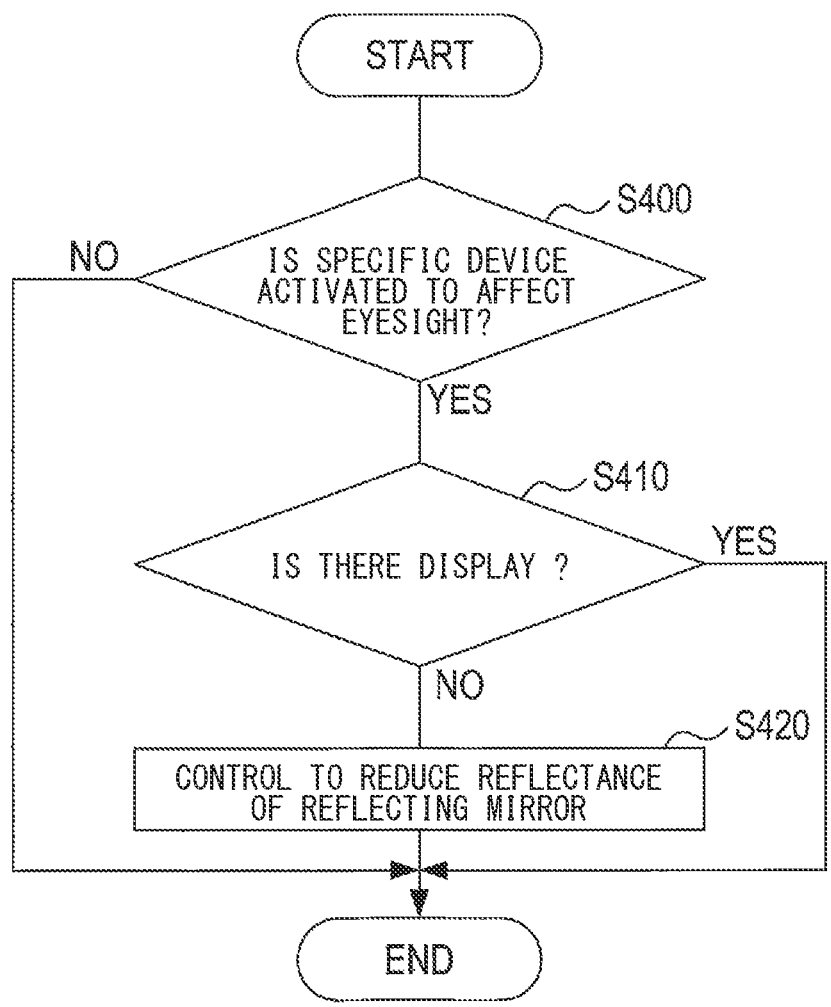
FIG. 24 is a flowchart illustrating control processing by a display control device according to a seventh embodiment.

In the display control device 219 of the present seventh embodiment, as illustrated in FIG. 24, the microcomputer 231 determines whether or not a specific device that affects eyesight has been activated in S400. The microcomputer 231 determines, for example, whether or not the roof display, the entertainment display, or other indirect lighting in the vehicle interior is being used (i.e., in an on-state). When a positive determination is made here, the microcomputer 231 proceeds to S410, and on the other hand, when a negative determination is made, the microcomputer 231 temporarily terminates the present processing.

In step S410, the microcomputer 231 determines whether or not an image is displayed on the display 215. When a negative determination is made here, the microcomputer 231 proceeds to S420, and on the other hand, when a positive determination is made, the microcomputer 231 temporarily terminates the present processing.

In S420, the microcomputer 231 performs control for reducing the reflectance of the reflecting mirror 217 and temporarily terminates the present processing.

The present seventh embodiment has a similar effect to that of the present fourth embodiment.

Further, in the present seventh embodiment, in a case where the roof display or the entertainment display is being used, when the display device 201 is not displayed, the reflectance of the reflecting mirror 217 is reduced, so that there is an effect that viewing of each display is hardly hindered. In addition, even when other indirect lighting is on, the reflectance of the reflecting mirror 217 is reduced, so that the light of the indirect lighting is less likely to be reflected on the reflecting mirror 217.

Hence there is an advantage that the atmosphere in the vehicle interior is hardly impaired. That is, since the reflection of each display or indirect lighting in the reflecting mirror 217 is reduced, there is an advantage that complexity due to viewing of extra light is reduced and a sense of immersion in a video or the like is increased.

In a case where the relaxation mode has been set, when the display device 201 is not displayed, the complexity described above can be reduced and the relaxation effect can be enhanced by reducing the reflectance of the reflecting mirror 217.

FIG. 24 illustrates an example in which the control for reducing the reflectance of the reflecting mirror 217 is performed when the roof display, the entertainment display, or the indirect lighting is being used and the display device 201 is not displayed. However, contrary to the above control, when the roof display, the entertainment display, or the indirect lighting is not being used, the reflectance of the reflecting mirror 217 may be increased to return to a normal state.

Eighth Embodiment

A basic configuration of an eighth embodiment is similar to that of the fourth embodiment, and hence a difference from the fourth embodiment will be mainly described below. The same reference numerals as those in the fourth embodiment denote the same configuration, and the preceding description will be referred to.

The present eighth embodiment is a form in which at least the reflectance of the reflecting mirror 217 is controlled in accordance with the temperature of the display 215 and/or in the vicinity of the display 215 or an index corresponding to the temperature.

(8a) First, the outline of the control will be described.

For example, when some of various devices disposed on the IP panel 209 of the vehicle 203 reach a certain temperature or higher, there is a risk that a part may be damaged or deformed, or malfunction occurs. Examples of the devices include, in addition to the display 215, a meter, a CID, a head-up display, and the like. CID is an abbreviation for center information display.

For example, when the vehicle 203 is left unattended for a long period of time under a clear sky in midsummer, the temperature in the vehicle interior and the temperature of the IP panel 209 may rise due to the influence of solar radiation, and there is a possibility that the failures of the various devices described above occur.

Therefore, in the present eighth embodiment, in such a case, control is performed to reduce the luminance of the display 215 in order to reduce self-heating in the display 215 and reduce a temperature rise in the display 215 and the vicinity thereof.

However, when the luminance of the display 215 is simply reduced, the visibility of the display image may be reduced, and hence the visibility is improved by performing control for increasing the reflectance of the reflecting mirror 217 as necessary.

As the above temperature measure, a method of increasing the reflectance in advance is also conceivable, but in this case, there are various problems such as an increase in the reflection of the surrounding scenery described above. Therefore, in the present eighth embodiment, control is performed to increase the reflectance when there is a need for the temperature measurement.

Examples of the vicinity of the display 215 include a range in which the temperature of the device in the vicinity of the display 215 can be changed more than a predetermined temperature range when the luminance of the display 215 is controlled. The device in the vicinity can be determined by an experiment or the like for examining a temperature change.

It is conceivable that the temperature sensor 237 is disposed on the display 215 so as to detect the temperature of the display 215 itself. The temperature sensor 237 may be disposed at a position in the vicinity of the display 215, for example, at a predetermined position such as the dashboard 205, the IP panel 209, or the visor 211, and the temperature in the vicinity of the display 215 may be detected.

Alternatively, in addition to the method of directly detecting the temperature of the display 215 or the vicinity thereof, the temperature of a position (e.g., other positions such as a ceiling) considered to have a correspondence relationship with the temperature of the display 215 or the vicinity thereof may be measured, and the temperature of the display 215 or the vicinity thereof may be estimated from the measured temperature.

Examples of the index corresponding to the temperature include a solar radiation amount and a solar radiation time. For example, when the solar radiation time is a predetermined value or more, it can be estimated that the temperature of the display 215 is a predetermined value or more.

(8b) Next, the content of the control performed by the display control device 219 will be described.

Figure 25:
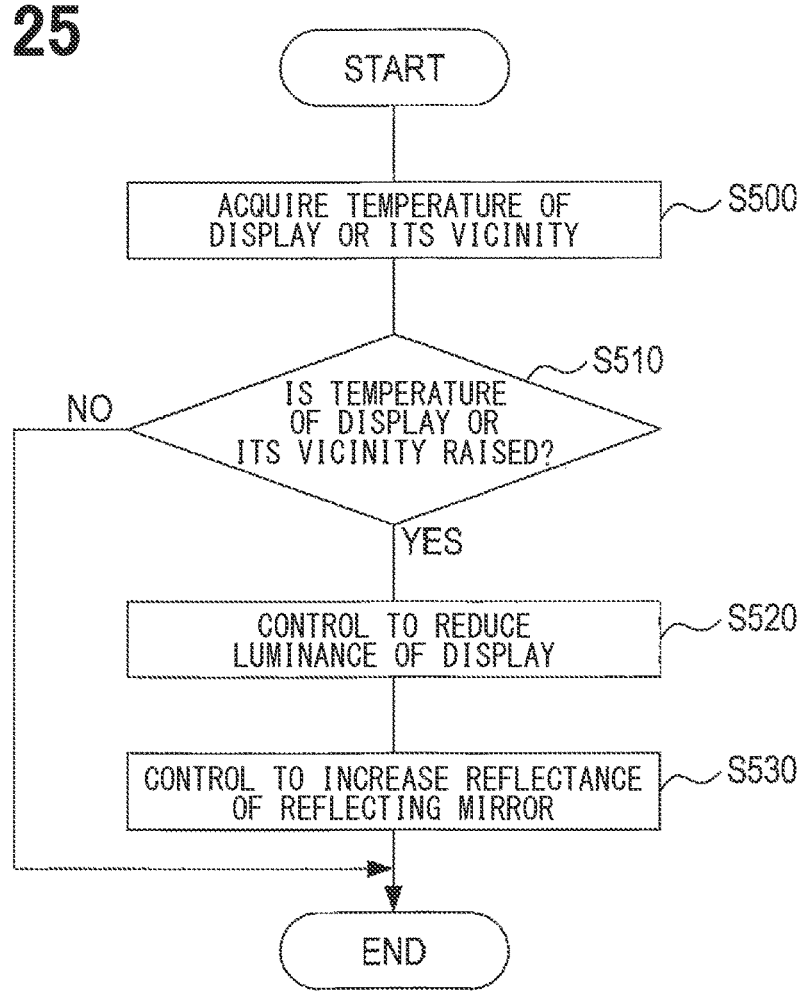
FIG. 25 is a flowchart illustrating control processing by a display control device according to an eighth embodiment.

As illustrated in FIG. 25, in S500, the microcomputer 231 acquires the temperature of the display 215 or the vicinity thereof based on a signal from the temperature sensor 237.

In subsequent S510, the microcomputer 231 determines whether or not the temperature of the display 215 or the vicinity thereof has risen to a predetermined temperature or higher at which a malfunction may occur in the device. When a positive determination is made here, the microcomputer 231 proceeds to S520, and on the other hand, when a negative determination is made, the microcomputer 231 temporarily terminates the present processing.

In S520, since the temperature of the display 215 or the vicinity thereof has excessively risen, the microcomputer 231 performs control for reducing the luminance of the display 215 in order to restrict the temperature rise.

In subsequent S530, since the visibility decreases due to a decrease in the luminance of the display 215, the microcomputer 231 performs control for increasing the reflectance of the reflecting mirror 217 in order to enhance the visibility and temporarily terminates the present processing.

By the control described above, the present eighth embodiment has a similar effect to that of the present fourth embodiment.

Further, in the present eighth embodiment, when the temperature of the display 215 or the vicinity thereof rises, control for reducing the luminance of the display 215 is performed, and control for increasing the reflectance of the reflecting mirror 217 is performed. As a result, the temperature rises of the display 215 and the devices in the vicinity thereof can be reduced, so that the occurrence of the failures of the various devices can be restricted, and moreover, the visibility can also be ensured.

When the temperature of the display 215 or the vicinity thereof falls below a predetermined temperature, control opposite to the above control may be performed. That is, control for increasing the luminance of the display 215 may be performed, and control for reducing the reflectance of the reflecting mirror 217 may be performed.

(8c) Next, Experimental Example a and Experimental Example b in which the effect of the present eighth embodiment was confirmed will be described.

Experimental Example a

In Experimental Example a, a state was assumed where the heat received due to solar radiation was small in the daytime, and the temperature in the vehicle interior hardly rose.

As described in Table 3 below, when the reflectance of the reflecting mirror 217 and the luminance of the display 215 were set, the luminance of the display image on the reflecting mirror 217 was measured. Table 3 below also shows the results of the measurement.

In Table 3 and Table 4 below, "Environmental temperature (ΔT-SUN)" indicates a temperature at which the temperature of the display 215 rises above a predetermined reference temperature T1 due to solar radiation. "Self-heating (ΔT)" indicates a temperature at which the temperature of the display 215 rises from a predetermined reference temperature T2 when display is performed on the display 215.

TABLE 3

| | Reflecting mirror (Reflectance) | Display plate (Luminance) | Display image (Luminance) | Environmental influence (ΔT-SUN) | Self-heating (ΔT) |
|---|---|---|---|---|---|
| | [When influence of temperature of surrounding environment, such as heat received due to solar radiation, is small] [During daytime lighting] | | | | |
| Without reflectance adjustment | 50% | 600 cd/m² | 300 cd/m² | +5° C. | +20° C. |

As is clear from Table 3, when the heat received due to solar radiation (i.e., environmental influence) is small, the luminance of the display 215 is set to a value as high as 600 cd/m² as an initial value in order to sufficiently brighten the display.

In a case where the reflectance of the reflecting mirror 217 is not adjusted, that is, in a case where the reflectance is maintained at 50%, the luminance of the display image is as high as 300 cd/m², indicating good visibility.

It is not necessary to excessively increase the luminance of the display image. When the environmental influence is small, the reflectance of the reflecting mirror 217 may not be adjusted (i.e., changed).

In the case of Experimental Example a, since the environmental influence is small, it can be seen that the overall temperature change of the environmental influence and the self-heating is as small as 25° C. even when the luminance of the display 215 is high.

Experimental Example b

In Experimental Example b, it was assumed that the heat received due to solar radiation was large in the daytime, and the temperature in the vehicle interior was likely to rise.

As described in Table 4 below, when the reflectance of the reflecting mirror 217 and the luminance of the display 215 were adjusted, the luminance of the display image on the reflecting mirror 217 was measured. Table 4 below also shows the results of the measurement.

TABLE 4

[When influence of temperature of surrounding environment,
such as heat received due to solar radiation, is large]
[During daytime lighting]

| | Reflecting mirror (Reflectance) | Display plate (Luminance) | Display image (Luminance) | Environmental influence (ΔT-SUN) | Self-heating (ΔT) |
|---|---|---|---|---|---|
| Without reflectance adjustment | 50% | 200 cd/m² | 100 cd/m² | +20° C. | +5° C. |
| With reflectance adjustment | 50% → 90% | 200 cd/m² | 180 cd/m² | +20° C. | +5° C. |

As is clear from Table 4, it can be seen that in a case where the heat received due to solar radiation (i.e., environmental influence) is large, even when the reflectance of the reflecting mirror 217 is not adjusted, that is, even when the reflectance is maintained at 50%, the luminance of the display 215 is set to as low as 200 cd/m², whereby it is possible to reduce the overall temperature change. However, in this case, since the luminance of the display image is as low as 100 cd/m², the visibility is also low.

On the other hand, it can be seen that in a case where the reflectance of the reflecting mirror 217 is increased from 50% to 90%, the luminance of the display image can be increased to as high as 180 cd/m² even when the luminance of the display 215 is set to be as low as 200 cd/m², and hence it is possible to improve the visibility. It can also be seen that in this case, the overall temperature change can be reduced.

Here, the luminance of the display 215 is maintained regardless of whether or not to adjust the reflectance, but the luminance of the display 215 may be decreased in the case of increasing the reflectance.

As described above, in the present eighth embodiment, when the heat received due to solar radiation is large, the luminance of the display 215 is reduced, and the reflectance is increased. Therefore, it can be seen that it is possible to obtain the effect of restricting the occurrence of the malfunction due to the temperature of the device described above and ensuring the visibility of the display image.

Ninth Embodiment

A basic configuration of a ninth embodiment is similar to that of the fourth embodiment, and hence a difference from the fourth embodiment will be mainly described below. The same reference numerals as those in the fourth embodiment denote the same configuration, and the preceding description will be referred to.

In the ninth embodiment, the reflectance of the reflecting mirror 217 is controlled in accordance with (9a) manual driving by the driver or autonomous driving not by the driver, (9b) the line-of-sight movement of the driver, (9c) whether or not the driver is wearing sunglasses, and (9d) whether or not an occupant is in the passenger seat.

Hereinafter, a specific description will be given.

(9a) First, an example of controlling the reflectance in accordance with manual driving by the driver and autonomous driving not by the driver will be described.

Figure 26:
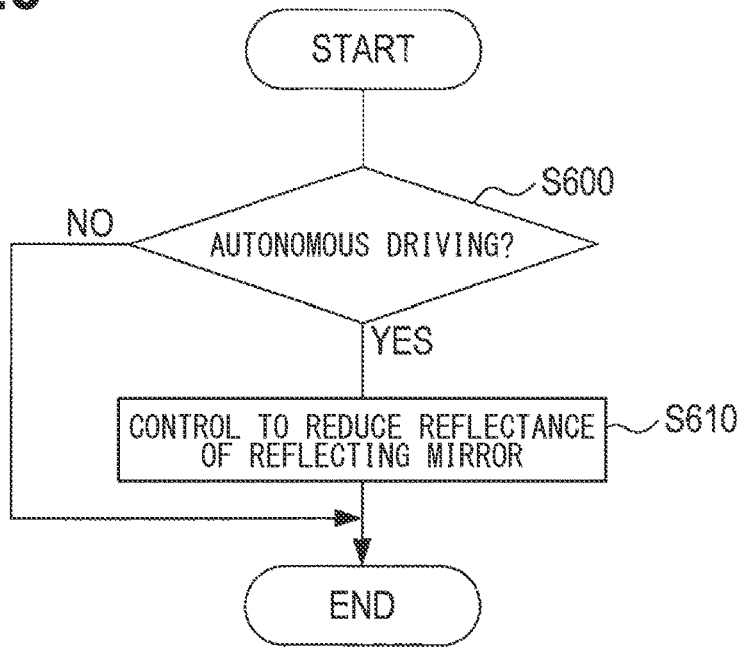
FIG. 26 is a flowchart illustrating control processing by the display control device in the case of (9a) of a ninth embodiment.

As illustrated in FIG. 26, in the display control device 219, in S600, the microcomputer 231 determines whether or not the vehicle 203 is in an autonomous driving state based on, for example, a signal from the vehicle control device 229. When a positive determination is made here, the microcomputer 231 proceeds to S610, and on the other hand, when a negative determination is made, the microcomputer 231 temporarily terminates the present processing.

As the level of the autonomous driving, a level at which the driver's hand can be separated from the steering wheel 249 or higher is considered.

In S610, since the vehicle is in the autonomous driving state, the microcomputer 231 performs control for reducing the reflectance of the reflecting mirror 217 and temporarily terminates the present processing.

As described above, in the case of the autonomous driving, the necessity of the display related to the driving on the display device 201 is reduced, and hence it is possible to reduce the complexity due to excessive light entering the visual field of the driver from the display device 201 by performing the control described above.

When the autonomous driving is switched to the manual driving, it is possible to perform control for increasing the reduced reflectance and return the reflectance to the reflectance corresponding to the manual driving.

(9b) Next, an example of controlling the reflectance in accordance with the line-of-sight movement of the driver will be described.

Figure 27:
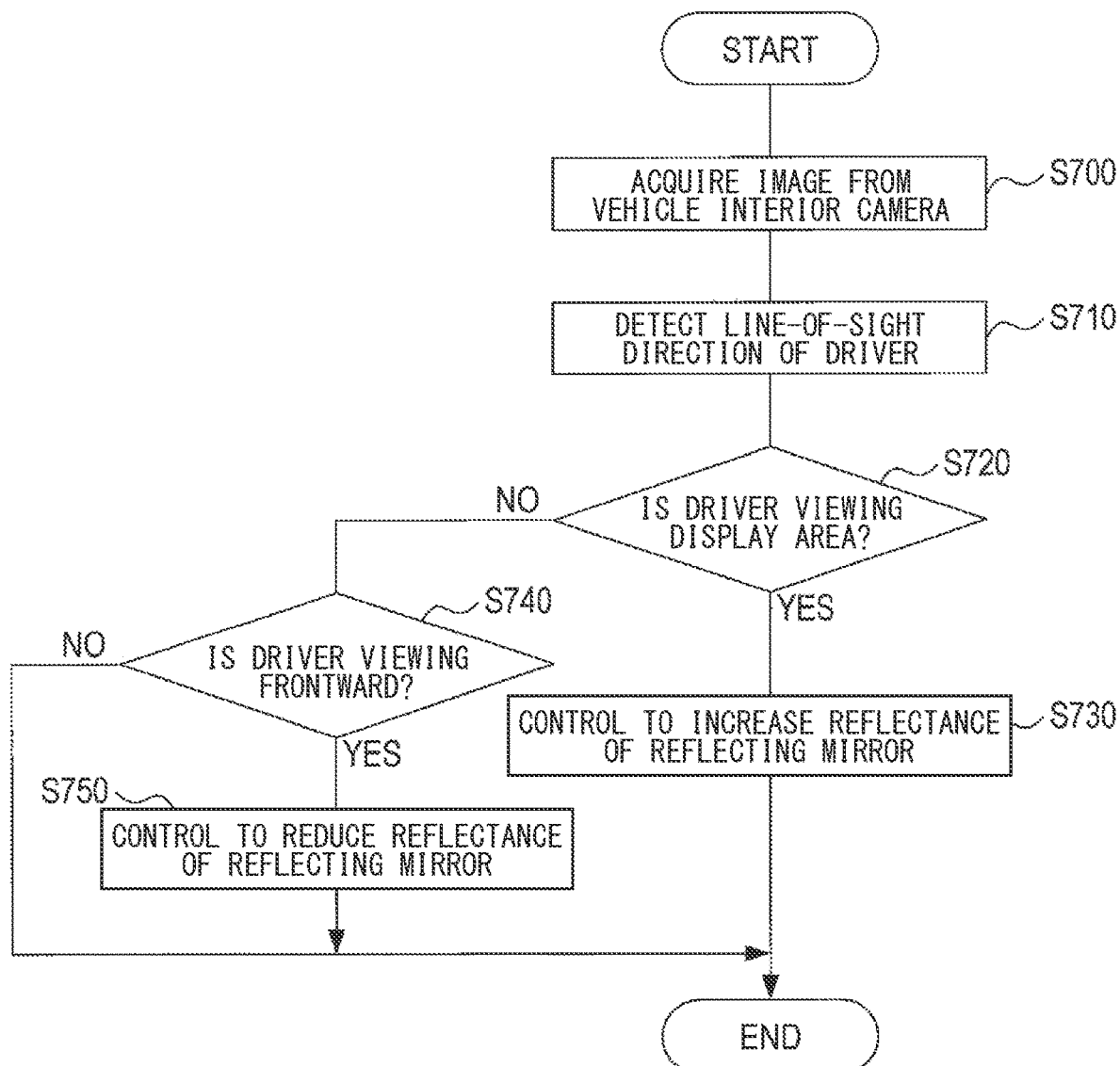
FIG. 27 is a flowchart illustrating control processing by the display control device in the case of (9b) of the ninth embodiment.

As illustrated in FIG. 27, the microcomputer 231 acquires, for example, an image of the vehicle interior camera 241 in S700.

In subsequent S710, the microcomputer 231 detects the direction of the line of sight of the driver based on the image. The control to detect the direction of the line of sight is known, and hence the description thereof will be omitted.

In subsequent S720, the microcomputer 231 determines whether or not the driver is viewing the display area of the display device 201, that is, the display region 227 of the reflective surface 225 of the reflecting mirror 217 based on the detected direction of the line of sight. When a positive determination is made here, the microcomputer 231 proceeds to S730, and on the other hand, when a negative determination is made, the microcomputer 231 proceeds to S740

In S730, since the driver is viewing the display area, the microcomputer 231 performs control for increasing the reflectance of the reflecting mirror 217 and temporarily terminates the present processing. Thereby, the luminance of the display image increases, so that the visibility is improved.

On the other hand, in S740, the microcomputer 231 determines whether or not the driver is viewing the front of the vehicle 203. When a positive determination is made here, the microcomputer 231 proceeds to S750, and on the other hand, when a negative determination is made, the microcomputer 231 temporarily terminates the present processing.

In S750, since the driver is viewing the front of the vehicle 203, the microcomputer 231 performs control for reducing the reflectance of the reflecting mirror 217 and temporarily terminates the present processing. As a result, the light from the reflecting mirror 217 can be restricted from entering the visual field of the driver, so that the complexity for the driver can be reduced.

(9c) Next, an example of controlling the reflectance in accordance with whether or not the driver is wearing sunglasses will be described.

Figure 28:
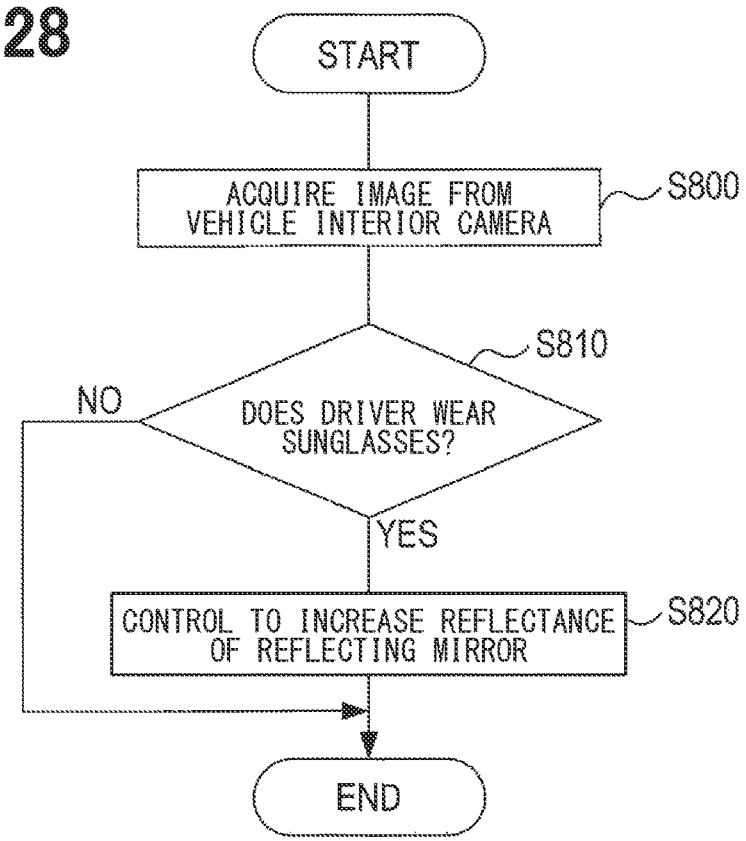
FIG. 28 is a flowchart illustrating control processing by the display control device in the case of (9c) of the ninth embodiment.

As illustrated in FIG. 28, the microcomputer 231 acquires, for example, an image of the vehicle interior camera 241 in S800.

In subsequent S810, the microcomputer 231 determines whether or not the driver is wearing sunglasses based on the image. When a positive determination is made here, the microcomputer 231 proceeds to S820, and on the other hand, when a negative determination is made, the microcomputer 231 temporarily terminates the present processing. Whether or not the driver is wearing the sunglasses can be determined by known image recognition processing.

In S820, since the driver is wearing sunglasses, the microcomputer 231 performs control for increasing the reflectance of the reflecting mirror 217 and temporarily terminates the present processing. Thereby, the luminance of the display image increases, so that the visibility is improved.

(9d) Next, an example of controlling the reflectance in accordance with whether or not the occupant is in the passenger seat will be described.

Figure 29:
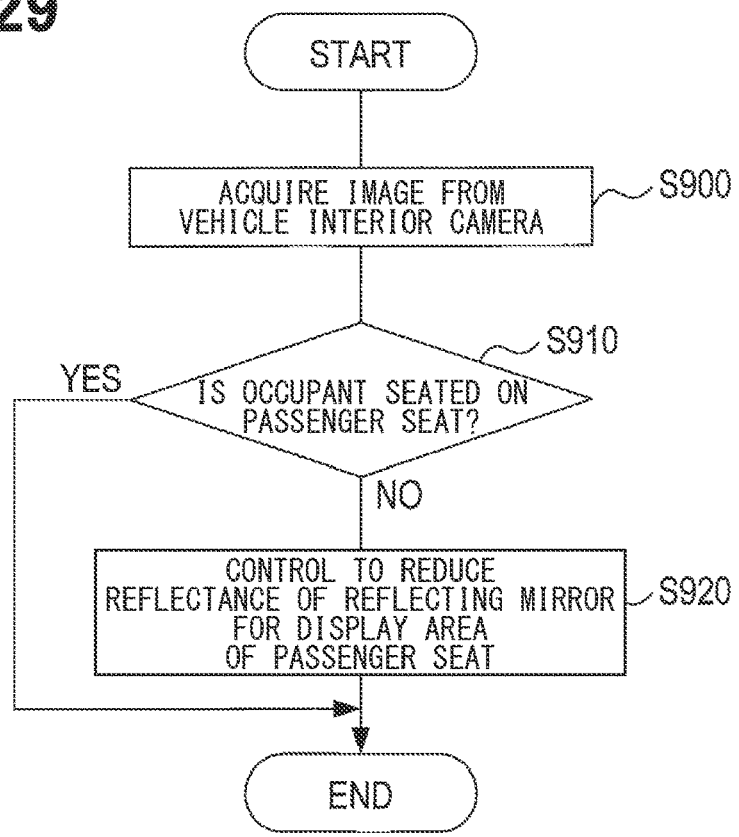
FIG. 29 is a flowchart illustrating control processing by the display control device in the case of (9d) of the ninth embodiment.

As illustrated in FIG. 29, the microcomputer 231 acquires, for example, an image of the vehicle interior camera 241 in S900.

In subsequent S910, the microcomputer 231 determines whether or not the occupant is seated in the passenger seat based on the image. When a negative determination is made here, the microcomputer 231 proceeds to S910, and on the other hand, when a positive determination is made, the microcomputer 231 temporarily terminates the present processing. Whether the passenger seat is seated can be determined by known image recognition processing.

In S920, since the occupant is not seated on the passenger seat, the microcomputer 231 performs control for reducing the reflectance of the reflecting mirror 217 of the display device 201 for the passenger seat and temporarily terminates the present processing.

As a result, the light from the reflecting mirror 217 on the passenger seat side can be restricted from entering the visual field of the driver, so that the complexity for the driver can be reduced.

Tenth Embodiment

[1. Overall Configuration]

First, an overall configuration of a display device of the present tenth embodiment will be described.

Figure 30:
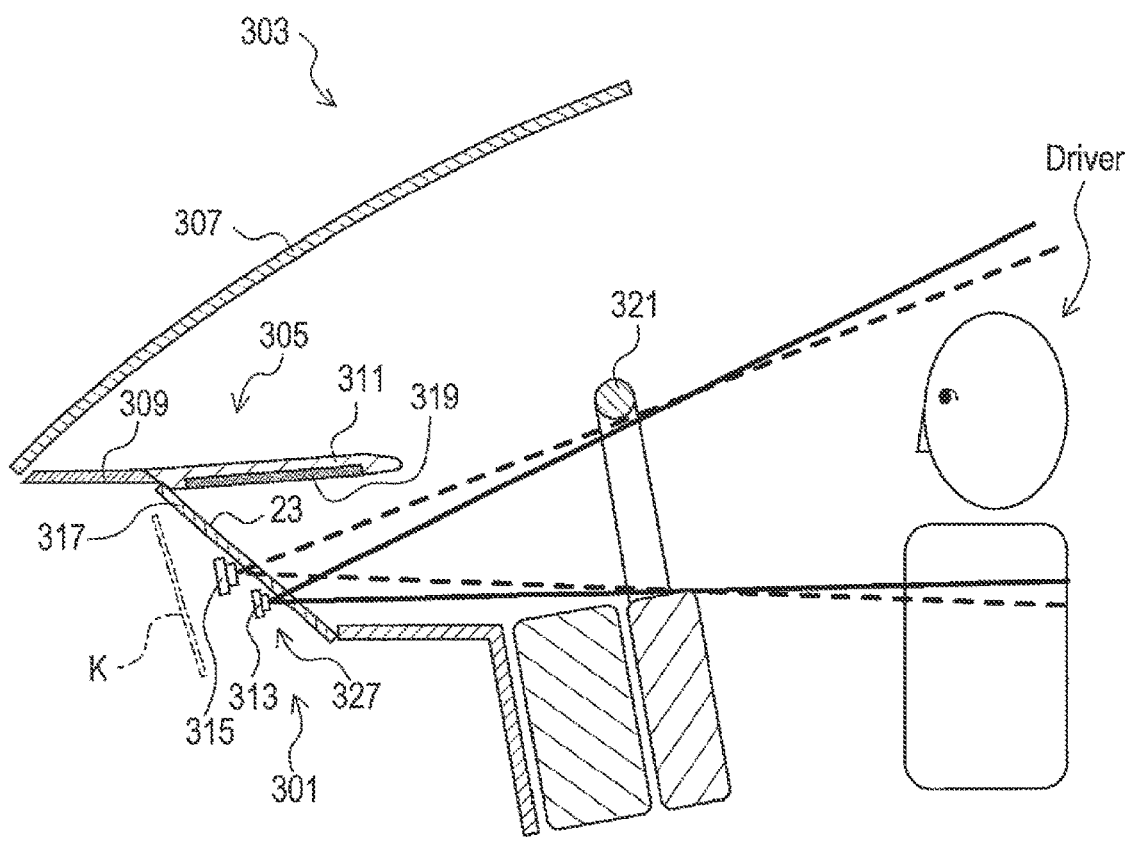
FIG. 30 is an explanatory view illustrating the inside of a vehicle including a display device according to a tenth embodiment as viewed from the lateral side.

As illustrated in FIG. 30, a display device 301 of the present tenth embodiment is a device that is mounted in a vehicle 303, which is an automobile, and displays various images to a driver, for example.

The display device 301 is disposed on a dashboard 305 in front of the driver seat. Specifically, the dashboard 305 is disposed below a windshield 307, and the dashboard 305 includes on its upper side an instrument panel (i.e., IP panel) 309 to which various instruments are attached on an upper surface. On the driver seat side of the IP panel 309, a visor 311, which is a light shielding plate, protrudes toward the driver seat side.

The display device 301 is disposed below the visor 311, and an image displayed on the display device 301 is visually recognizable to the driver seated on the driver seat. The displayed image is a virtual image as described later, and hence the driver visually recognizes the virtual image.

[2. Configuration of Display Device]

Next, the configuration of the display device 301 will be described in detail. As illustrated in FIG. 30, the display device 301 includes a light irradiator 313, a shooting unit 315, a transmission reflector 317, and a display unit 319.

The light irradiator 313 is configured to irradiate the position of the driver viewing the display device 301 with, for example, infrared light. As the light irradiator 313, for example, an infrared LED (i.e., IR-LED) can be employed. IR is an abbreviation for infrared, and LED is an abbreviation for light-emitting diode.

In FIG. 30, the range (i.e., irradiation range) of the infrared light emitted from the light irradiator 313 is indicated by a range of a predetermined angle sandwiched by upper and lower solid lines. This irradiation range is a range in which the face and the upper body of the driver are irradiated through the space of the steering wheel 321, and is, for example, a conical range.

As the infrared light, for example, infrared light having a wavelength within a range of 0.7 μm to 1000 μm can be employed. For example, near-infrared light having a wavelength of 0.7 μm to 2.5 μm can be employed.

The shooting unit 315 is a camera that shoots an image of the driver, here, an infrared camera. The shooting unit 315 is disposed to receive reflected light of infrared rays emitted from the light irradiator 313. That is, the shooting unit 315 is configured to receive reflected light of infrared light emitted to the driver and shoot an image of the driver by using the reflected light.

In FIG. 30, an imageable range (i.e., the shooting range) of the shooting unit 315 is indicated by a range of a predetermined angle sandwiched by upper and lower broken lines. This shooting range is a range in which an image of the face and the upper body of the driver is shot through the space of the steering wheels 321 and is slightly different from the irradiation range. The shooting range is, for example, a conical range.

The transmission reflector 317 is a flat member and is a so-called cold mirror having optical characteristics of reflecting visible light and transmitting infrared light. Here, for example, the transmission reflector 317 is configured to reflect visible light having a wavelength of 380 nm to 780 nm and transmit the near-infrared light.

The transmission reflector 317 can transmit infrared light emitted from the light irradiator 313 between the front side (i.e., the right side of FIG. 30) that is the driver side and the back side (i.e., the left side of FIG. 30) that is an opposite side of the front side, and can transmit reflected light that is infrared light obtained by reflecting the infrared light by the driver. Moreover, in the transmission reflector 317, at least a part (e.g., all) of light incident from the front side, that is, light (e.g., visible light) that falls on a surface 323 of the front side of the transmission reflector 317, is reflected on the surface 323 toward the driver side.

The transmission reflector 317 is disposed between the position of the driver and the light irradiator 313/the shooting unit 315 with the front side facing the driver side.

The transmission reflector 317 is inclined at an angle of, for example, 40 degrees with respect to the horizontal direction such that the position becomes lower toward the driver side.

Figure 31:
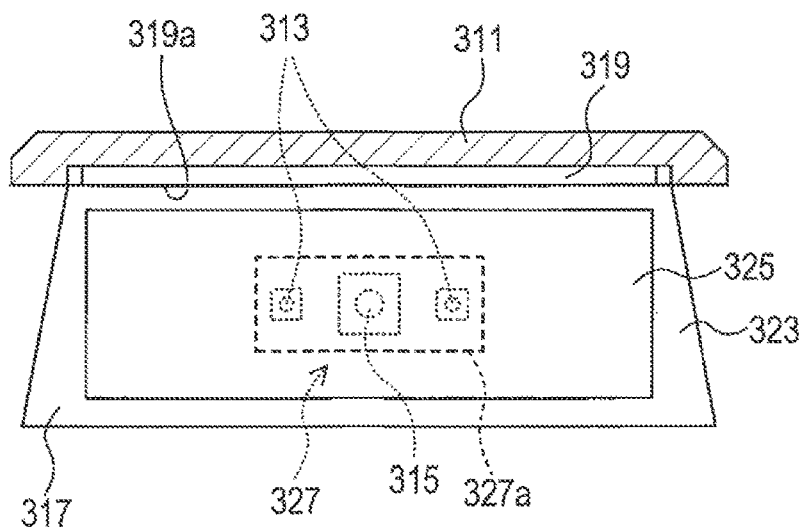
FIG. 31 is an explanatory view illustrating a state where the display device according to the tenth embodiment is viewed from the driver side.

As illustrated in FIG. 31, one shooting unit 315 is disposed on the back side of the substantially center of the transmission reflector 317, and a pair of light irradiators 313 is disposed on both left and right sides of the shooting unit 315.

The planar shape of the transmission reflector 317 is a trapezoid long in the right-left direction, and a display region 325 in which an image of the display unit 319 is displayed is provided on a surface 323 of the front side of the transmission reflector 317. The surface shape of the display region 325 is the same as the surface shape (e.g., rectangular) of the display unit 319.

The display unit 319 is an LED display plate having the shape of a flat plate and capable of displaying various images such as characters, symbols, and videos based on an electric signal from a control device (not illustrated). That is, it is a device capable of displaying an image by an LED.

The display unit 319 is attached to the lower surface of the visor 311 and is disposed with a display surface 319a, which is a surface for displaying an image, facing downward. That is, the display unit 319 is configured to display an image toward the transmission reflector 317 disposed below the display unit 319. A display surface 319a of the display unit 319 is inclined at an angle of, for example, 5 degrees with respect to the horizontal direction such that the position becomes higher toward the driver side.

As described above, since the display unit 319 is disposed on the front side and above the transmission reflector 317 with the display surface 319a for displaying an image facing downward, the image displayed by the display unit 319 is visually recognizable to the driver by being reflected on the transmission reflector 317. In other words, the display unit 319 and transmission reflector 317 are disposed at such positions that the displayed image is visually recognizable to the driver.

As described above, in the present tenth embodiment, the display unit 319 is disposed on the lower side of the visor 311 on the front side (i.e., the driver side) of the transmission reflector 317 so as not to hinder the driver from visually recognizing the transmission reflector 317. Similarly, the light irradiator 313 and the shooting unit 315 are disposed on the back side (i.e., the front-top side of the vehicle 303) of the transmission reflector 317 so as not to hinder the visual recognition of the image by the driver.

Hereinafter, the configuration including the light irradiator 313 and the shooting unit 315 may be referred to as a shooting mechanism 327, and the shooting mechanism 327 has the function of the DSM described above. The light irradiator 313 and the shooting unit 315 are integrally disposed on a support substrate 327a, for example.

[3. Function of Display Device]

Next, the function of the display device 301 will be described in detail.

As illustrated in FIG. 30, when the transmission reflector 317 is irradiated with infrared light from the light irradiator 313, the infrared light is transmitted through the transmission reflector 317 and falls on the driver.

The infrared light emitted to the driver is reflected on the driver, and the reflected light (i.e., infrared light) passes through the transmission reflector 317 and enters the shooting unit 315. Therefore, the shooting unit 315 can shoot an image of the driver using the reflected light.

As described above, even when transmission reflector 317 is disposed on the driver side of the light irradiator 313 and the shooting unit 315, a shot image of the driver can be acquired.

When an image is displayed on the display unit 319 above the front side of the transmission reflector 317, light (i.e., visible light) indicating the image is reflected toward the driver side on the surface 323 of the front side of the transmission reflector 317. As a result, the driver can visually recognize the image displayed by the transmission reflector 317.

Figure 32:
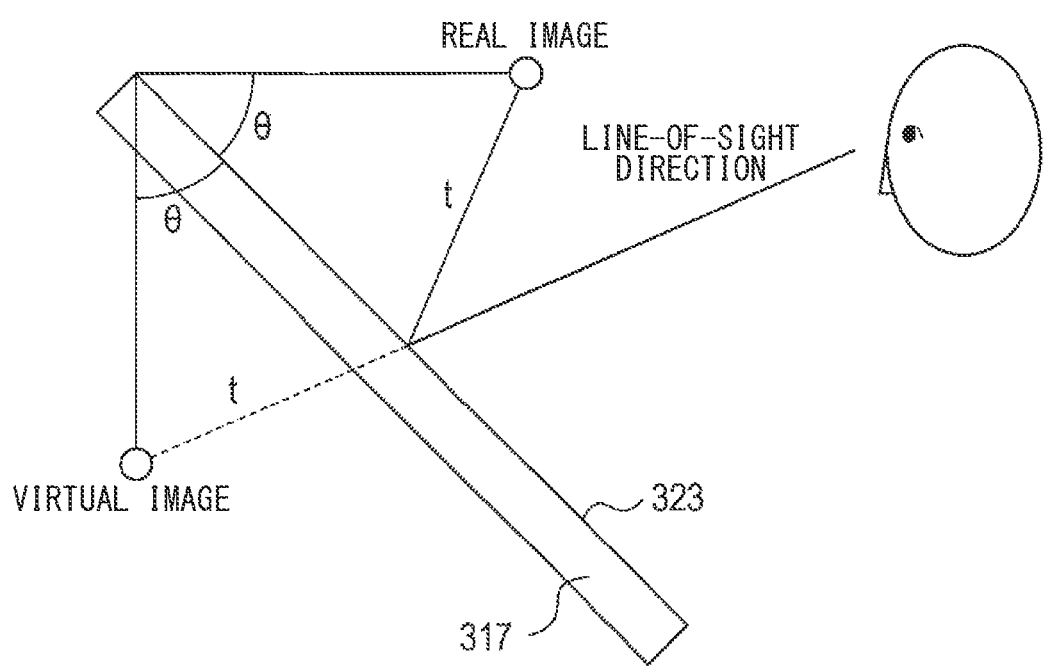
FIG. 32 is an explanatory view illustrating a formation state of a virtual image in the display device according to the tenth embodiment.

Specifically, as illustrated in FIG. 32, when the light of the image, which is the real image from display unit 319, is reflected on the surface 323 of the front side of the transmission reflector 317, the driver who sees the reflected light recognizes as if the real image is at a predetermined position on the back side of the transmission reflector 317. That is, a virtual image that is not actually present is recognized at a predetermined position in the line-of-sight direction of the driver.

That is, in the present tenth embodiment, the image viewable by the transmission reflector 317 is a virtual image formed on the back side of the transmission reflector 317.

The angles formed by the real image and the virtual image with respect to the surface 323 of the transmission reflector 317 are the same θ, and the distance between the surface 323 of the transmission reflector 317 and the real image and the distance between the surface 323 of the transmission reflector 317 and the virtual image are the same.

In the present tenth embodiment, the light irradiator 313 and the shooting unit 315 are disposed between the formation position of the virtual image indicated by K in FIG. 30 and transmission reflector 317.

[4. Effects]

In the tenth embodiment, the following effects can be obtained.

(10a) In the display device 301 of the present tenth embodiment, the display unit 319 is disposed closer to the driver than the transmission reflector 317, and the image displayed on the display unit 319 is reflected on the transmission reflector 317 toward the driver side. Therefore, the driver looking at the transmission reflector 317 looks as if the image on the display unit 319 is behind the transmission reflector 317, that is, on the opposite side of the position of the driver. That is, the image of the display unit 319 can be seen as a virtual image on the back side of the transmission reflector 317, which is the destination of the driver's line of sight.

Furthermore, in the display device 301, since the light irradiator 313 and the shooting unit 315 are disposed behind (i.e., on the back side of) the transmission reflector 317, when an image is displayed as a virtual image by the transmission reflector 317, the display region 325 of the image in the transmission reflector 317 is hardly limited due to the presence of the light irradiator 313 and the shooting unit 315.

Figure 33:
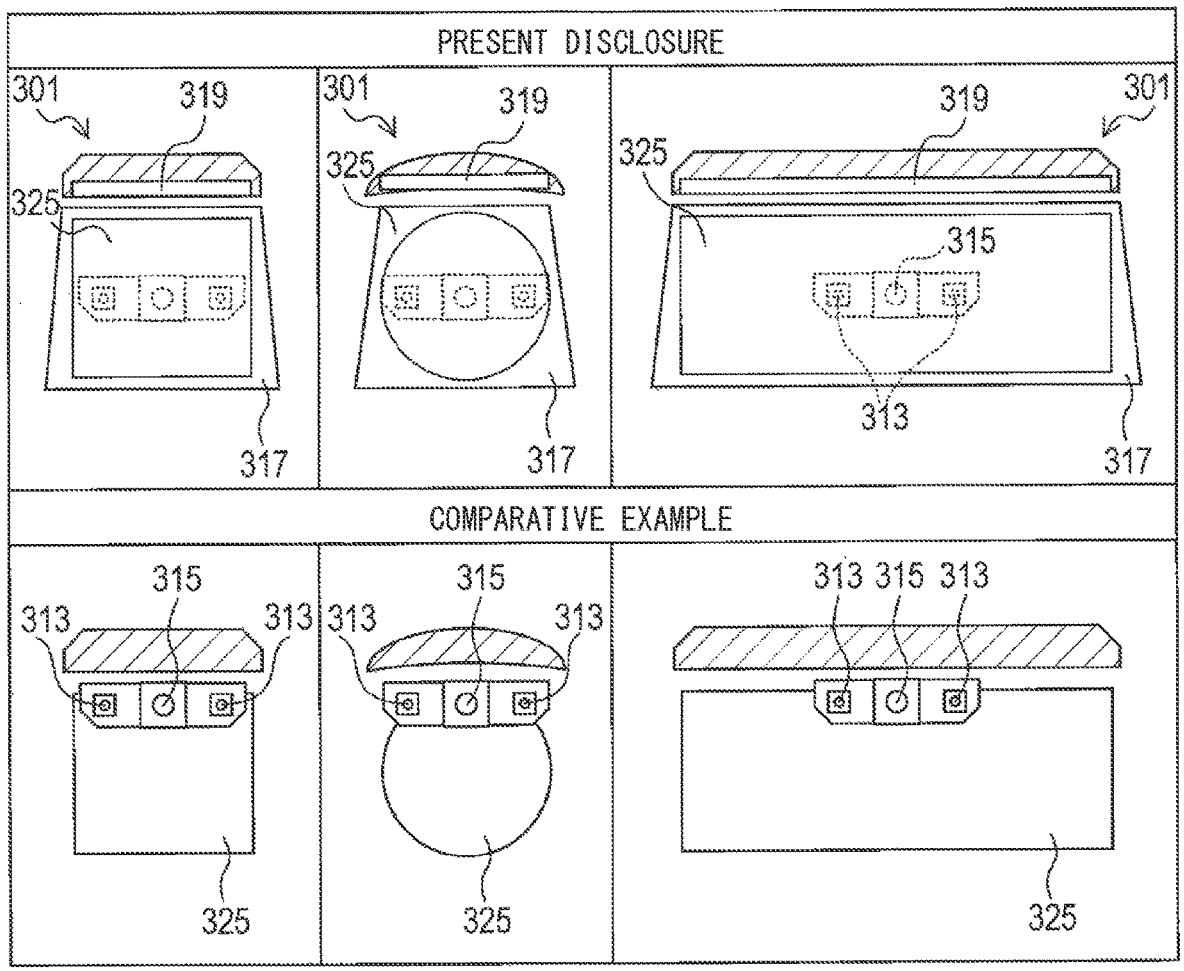
FIG. 33 is an explanatory view illustrating a plurality of display devices of the present disclosure and those of a comparative example as viewed from the driver side.

For example, as illustrated side by side in the upper column of FIG. 33, the configuration of the present disclosure can be applied to the display devices 301 having various shapes including the display unit 319, the transmission reflector 317, and the display region 325 having various shapes. That is, with the light irradiator 313 and the shooting unit 315 being disposed on the back side of the transmission reflector 317, the maximum display region 325 can be ensured without reducing the display region 325. The right end of the upper column is the display device 301 of the present tenth embodiment, and the display devices 301 at the center or the left end are modifications thereof.

In contrast, the display devices of comparative examples are illustrated side by side in the lower column of FIG. 33, and since the light irradiator 313 and the shooting unit 315 are disposed in front of (i.e., on the driver seat side of) the display region 325, the visible display region 325 is small, which is not preferable. In the upper column and the lower column of FIG. 33, the display devices having substantially similar shapes are vertically arranged and compared.

Moreover, in the display device 301 according to the present tenth embodiment, it is not necessary to dispose the light irradiator 313 and the shooting unit 315 by cutting out the periphery of the transmission reflector 317, or to dispose the light irradiator and the shooting unit by embedding the light irradiator 313 and the shooting unit 315 in the transmission reflector 317 itself, so that the device configuration can be simplified.

Figure 34:
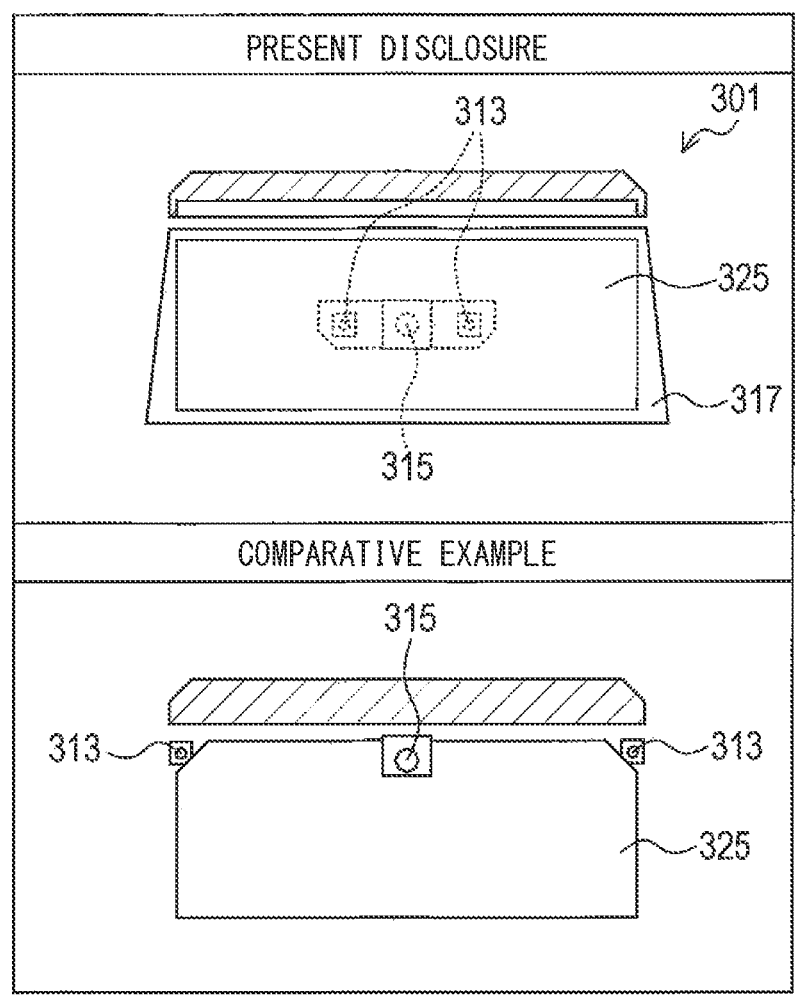
FIG. 34 is an explanatory view illustrating a state where the display device of the present disclosure and that of a comparative example are viewed from the driver side.

For example, as illustrated in the upper column of FIG. 34, in the present tenth embodiment, since the light irradiator 313 and the shooting unit 315 are disposed on the back side of the transmission reflector 317, it is not necessary to perform special processing on the transmission reflector 317, and the configuration of the display device 301 can be simplified.

In contrast, the display device of the comparative example is illustrated in the lower column of FIG. 34, and since the light irradiator 313 is disposed by cutting out a part of the member constituting the display region 325 or the shooting unit 315 is embedded in the member constituting the display region 325, the configuration becomes complicated and is not preferable.

As described above, according to the configuration of the present tenth embodiment, there is an effect that the display of the display device 301 is less likely to be hidden, and moreover, the configuration of the display device 301 can be simplified.

(10b) In the present tenth embodiment, the light emitted from the light irradiator 313 is infrared light, and the light reflected on the surface 323 of the front side of the transmission reflector 317 is visible light.

Therefore, even when the driver is irradiated with infrared light, an image of the driver can be shot with little influence on the driver's driving or the like. In addition, by the shooting using infrared light, it is possible to suitably grasp the state of the driver even when the surroundings are dark.

The image displayed on the display unit 319 with visible light is reflected on the surface 323 of the front side of the transmission reflector 317, so that the driver can easily recognize the image.

(10c) In the present tenth embodiment, the light irradiator 313 and the shooting unit 315 are disposed between the formation position of the virtual image and the transmission reflector 317. In the case of such a configuration, when the driver views the virtual image, the driver focuses on the virtual image. Therefore, there is an advantage that the light irradiator 313 and the shooting unit 315 look blurred, and the light irradiator 313 and the shooting unit 315 are difficult to see.

Only one of the light irradiator 313 and the shooting unit 315 may be disposed between the formation position of the virtual image and the transmission reflector 317.

[5. Modifications, etc.]

Next, modifications of the tenth embodiment and the like will be described.

(1) In the tenth embodiment, the infrared LED has been shot as an example of the light irradiator 313, and the infrared camera has been shot as an example of the shooting unit 315, but visible light may be employed instead of infrared rays.

For example, a lamp that emits visible light may be employed as the light irradiator 313, and a camera (e.g., a CCD camera) that shoots an image using normal visible light may be employed as the shooting unit 315.

(2) In the tenth embodiment, a cold mirror that transmits infrared light and reflects visible light has been employed as transmission reflector 317, but other configurations may be employed.

Figure 35:
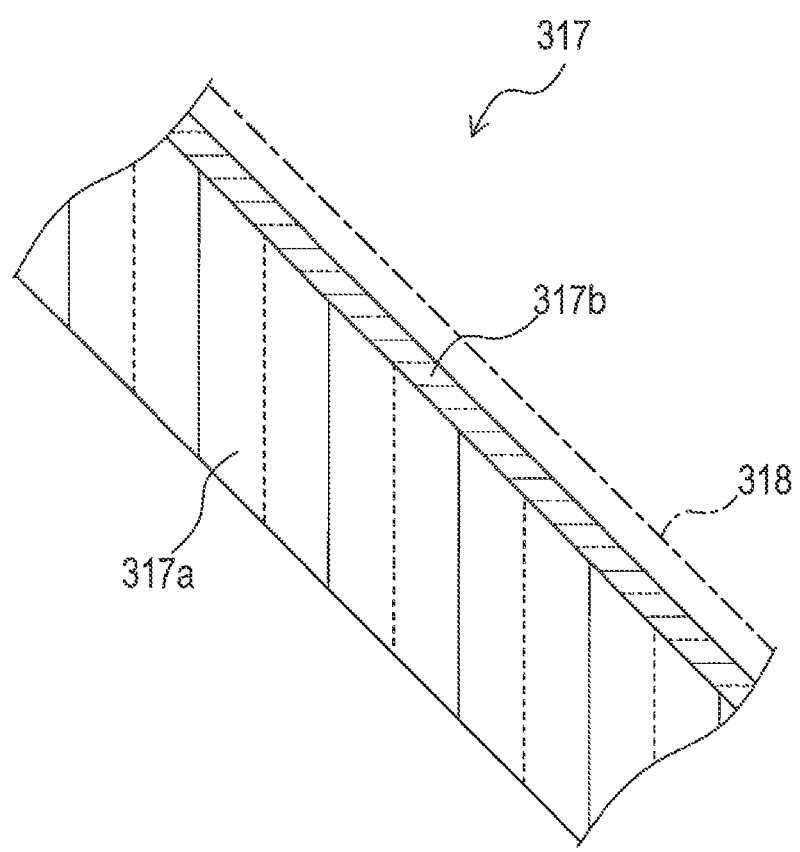
FIG. 35 is a cross-sectional view illustrating a transmission reflector broken in a thickness direction.

As a configuration of the cold mirror, as illustrated in FIG. 35, a material having a property of transmitting infrared light and reflecting visible light may be coated on a surface of a light transmissive substrate 317a through which visible light and infrared light are transmitted, or an optical film having the property may be attached. That is, the layer 317b having the property described above may be provided on the surface of the substrate 317a. The whole transmission reflector 317 may be made of a material having the above properties.

As the transmission reflector 317, for example, a half mirror capable of transmitting and reflecting visible light can be employed. In this case, a configuration of a lamp or a camera that shoots an image using visible light is employed.

Furthermore, as the transmission reflector 317, for example, a member capable of selectively transmitting and selectively reflecting light in accordance with a deflection direction can be employed. That is, it is possible to employ a configuration in which light in a certain polarization direction is transmitted and light in another polarization direction is reflected. Examples of the light in various deflection directions include P waves, S waves, and circularly polarized light.

(3) As illustrated in FIG. 35, a layer 318 capable of changing optical characteristics may be provided on the surface of the front or back side of the transmission reflector 317. For example, a liquid crystal shutter capable of changing light transmittance may be provided.

[6. Correspondence Relationship Between Words]

In the relationship between the present tenth embodiment and the present disclosure, the light irradiator 313 corresponds to a light irradiator, the shooting unit 315 corresponds to a shooting unit, the transmission reflector 317 corresponds to a reflector, the display unit 319 corresponds to a display unit, the shooting mechanism 327 corresponds to a shooting mechanism, the pseudo display unit 329 corresponds to a pseudo display unit, and the restriction unit 331 corresponds to a restriction unit.

Eleventh Embodiment

A basic configuration of an eleventh embodiment is similar to that of the tenth embodiment, and hence a difference from the tenth embodiment will be mainly described below. The same reference numerals as those in the tenth embodiment denote the same configuration, and the preceding description will be referred to.

Figure 36:
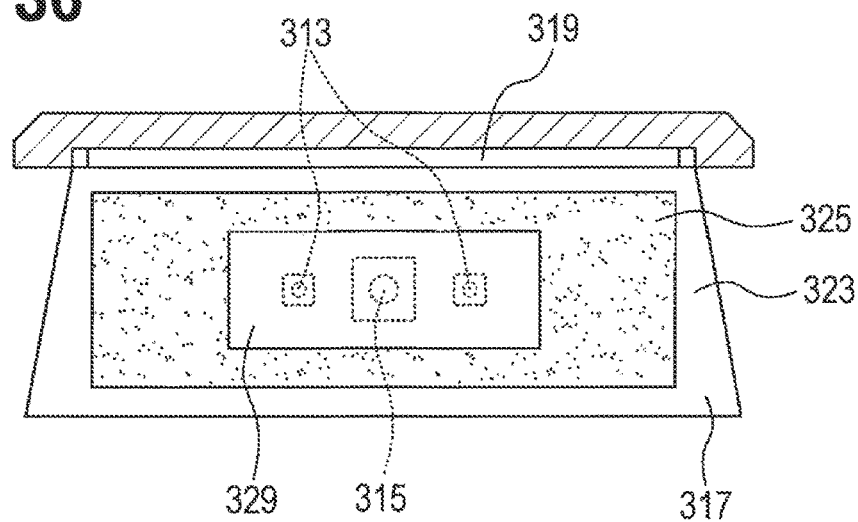
FIG. 36 is an explanatory view illustrating a state where an example of a display device according to an eleventh embodiment is viewed from the driver side.
Figure 37:
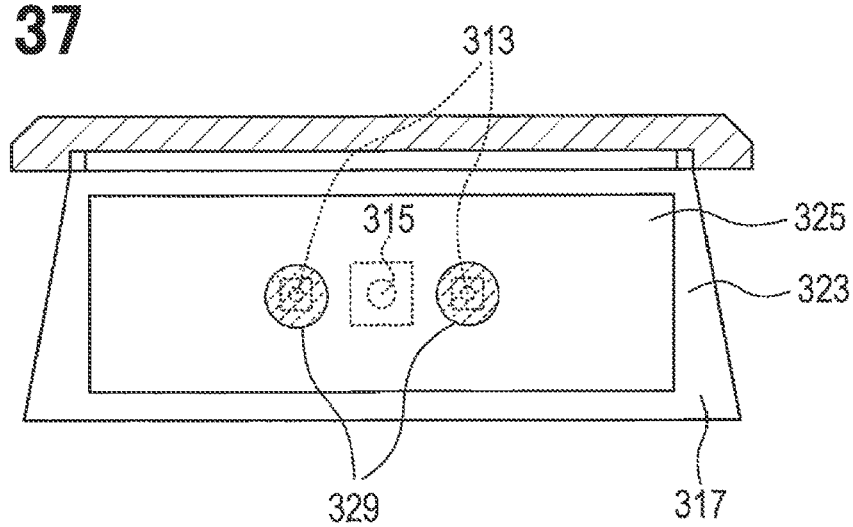
FIG. 37 is an explanatory view illustrating a state where another example of the display device of the eleventh embodiment is viewed from the driver side.
Figure 38:
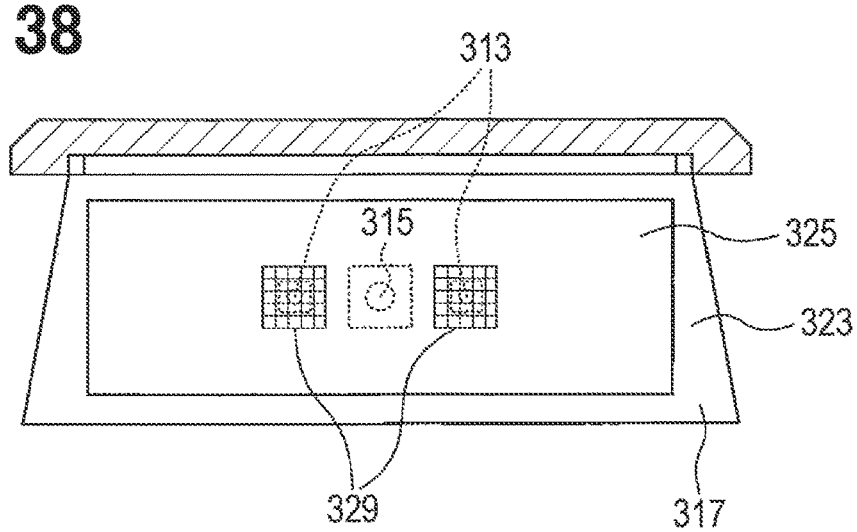
FIG. 38 is an explanatory view illustrating still another example of the display device of the eleventh embodiment as viewed from the driver side.

In the present eleventh embodiment, as illustrated in FIGS. 36 to 38, transmission reflector 317 includes a pseudo display unit 329 that reduces visual recognition of the light irradiator 313 and the shooting unit 315. Hereinafter, a specific description will be given.

For example, as illustrated in FIG. 36, in the display region 325 on the surface 323 of the front side of the transmission reflector 317, the pseudo display unit 329 is provided to cover a range in which the light irradiator 313 and the shooting unit 315 are visible when viewed from the driver.

Specifically, in order to make the light irradiator 313 and the shooting unit 315 inconspicuous, the transmission reflector 317 is provided with the pseudo display unit 329 that displays display content (i.e., content) brighter in color than the surroundings. That is, when the virtual image by the display unit 319 is displayed in the display region 325, the light irradiator 313 and the shooting unit 315 are made inconspicuous by brightening the color of the virtual image in the range of the pseudo display unit 329. That is, the light irradiator 313 and the shooting unit 315 are disguised by colors.

In a case where an infrared LED is used as the light irradiator 313, the infrared LED may shine red. In such a case, as illustrated in FIG. 37, in the display region 325 on the surface 323 of the front side of the transmission reflector 317, the pseudo display unit 329 made of red content is provided to cover a range in which the light irradiator 313 is visible when viewed from the driver.

Alternatively, as illustrated in FIG. 38, in the display region 325 on the surface 323 of the front side of the transmission reflector 317, the pseudo display unit 329 including content of a geometric pattern is provided to cover a range in which the light irradiator 313 is visible when viewed from the driver.

In addition to the above, the pseudo display unit 329 including content of gradation or a multicolor pattern may be provided.

The present eleventh embodiment has a similar effect to that of the present tenth embodiment. Further, in the present eleventh embodiment, since the light irradiator 313 and the shooting unit 315 are difficult to see, there is an effect of reducing discomfort when the driver views the display on the display device 301.

Twelfth Embodiment

A basic configuration of a twelfth embodiment is similar to that of the tenth embodiment, and hence a difference from the tenth embodiment will be mainly described below. The same reference numerals as those in the tenth embodiment denote the same configuration, and the preceding description will be referred to.

Figure 39:
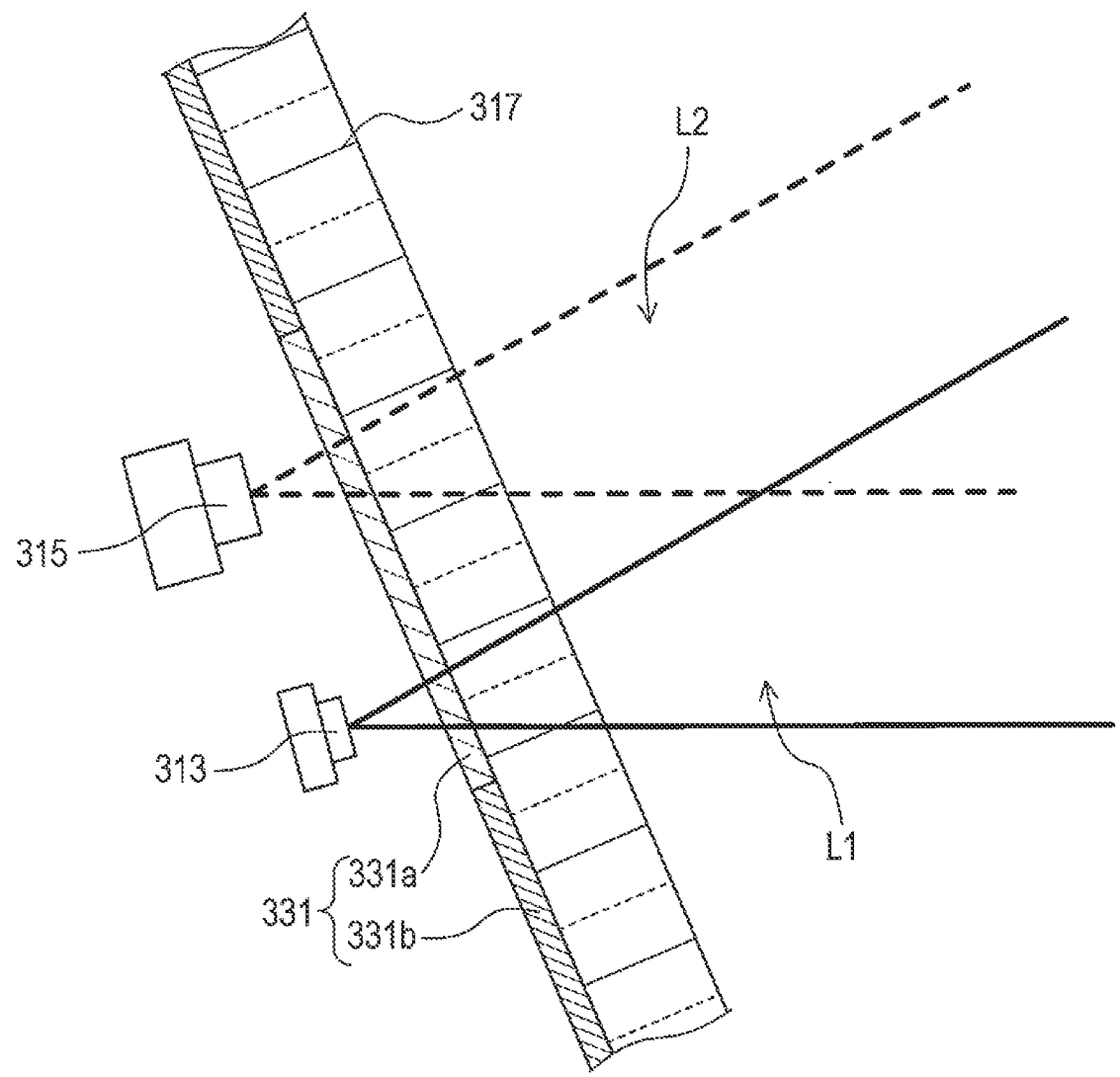
FIG. 39 is an explanatory view illustrating a transmission reflector broken in a thickness direction in a display device according to a twelfth embodiment.

In the present twelfth embodiment, as illustrated in FIG. 39, the restriction unit 331 that restricts the irradiation range of the light emitted from the light irradiator 313 and the shooting range of the shooting unit 315 is provided on the back side of the transmission reflector 317. Hereinafter, a specific description will be given.

As illustrated in FIG. 39, on the back side of the transmission reflector 317, a light adjuster 331a made of, for example, a Fresnel lens or the like for adjusting the traveling direction of light and the like is provided to cover an irradiation range L1 of the light irradiator 313, that is, a range L1 of a predetermined angle sandwiched by two solid lines, and a shooting range L2 of the shooting unit 315, that is, a range L2 of a predetermined angle sandwiched by two broken lines. Here, the range covering the irradiation range L1 and the shooting range L2 are ranges covering the irradiation range L1 and the shooting range L2 when viewed from the driver side.

That is, the light adjuster 331a having an optical shape for adjusting the irradiation range L1 and the shooting range L2 is provided on the surface of the back side of the transmission reflector 317. The transmission reflector 317 may not be a member having a constant thickness such as a flat plate or a curved plate, and irregularities may be formed on the back side by the light adjuster 331a or the like.

Similarly, a light shielding layer 331b that blocks transmission of light is provided on the back side of the transmission reflector 317 so as to surround the irradiation range L1 of the light irradiator 313 and the shooting range L2 of the shooting unit 315 when viewed from the driver side.

That is, the light shielding layer 331b is provided around the light adjuster 331a, and the light adjuster 331a and the light shielding layer 331b constitute the restriction unit 331.

One of the light adjuster 331a and the light shielding layer 331b may be employed as the restriction unit 331. The restriction unit 331 may be provided only on one of the light irradiator 313 and the shooting unit 315.

The present twelfth embodiment has a similar effect to that of the present tenth embodiment. Further, in the present twelfth embodiment, since the restriction unit 331 is provided on the back side of the transmission reflector 317, it is possible to irradiate a necessary range with light (e.g., infrared light) and to shoot an image in the necessary range.

Thirteenth Embodiment

A basic configuration of a thirteenth embodiment is similar to that of the tenth embodiment, and hence a difference from the tenth embodiment will be mainly described below. The same reference numerals as those in the tenth embodiment denote the same configuration, and the preceding description will be referred to.

Figure 40:
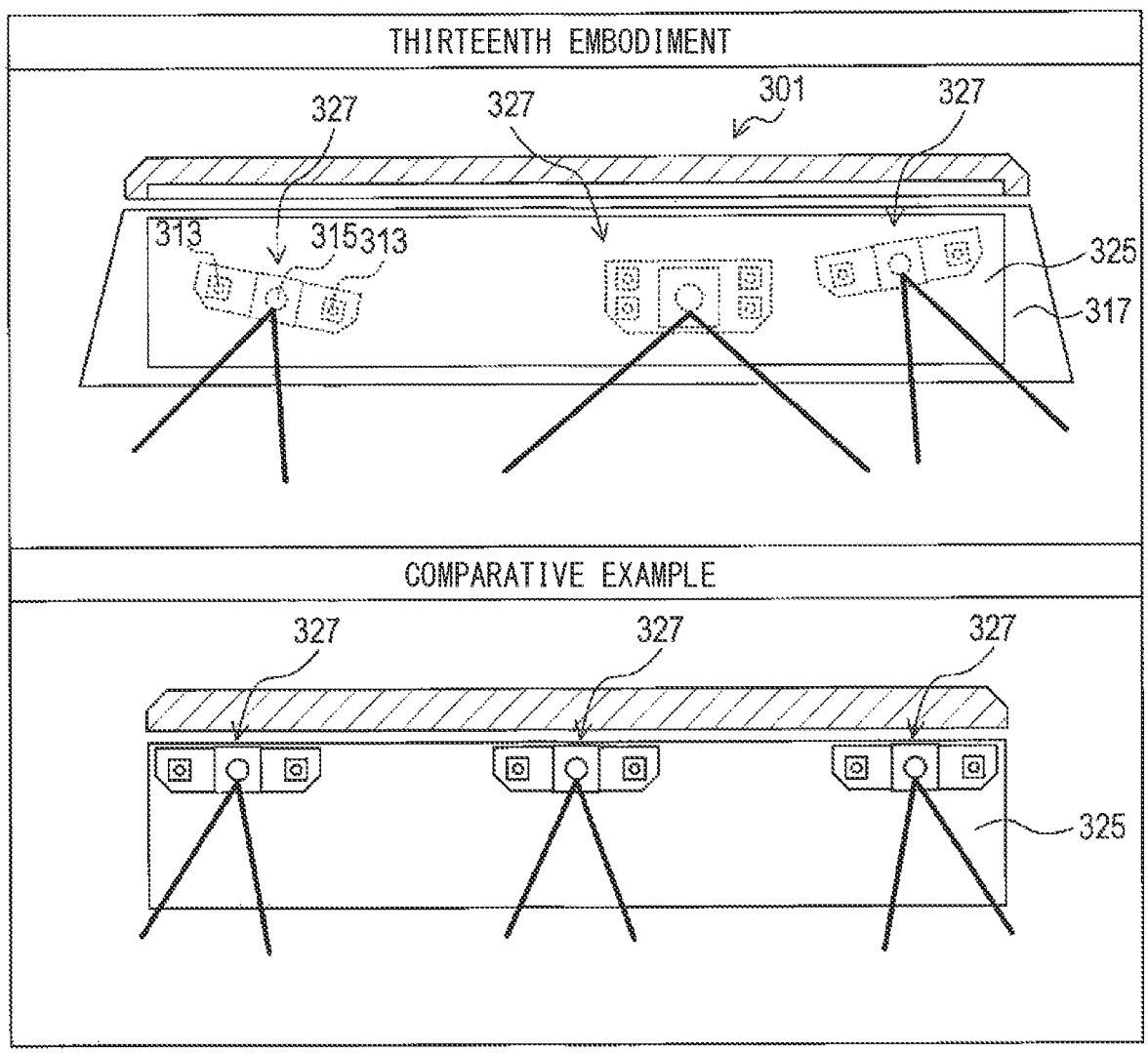
FIG. 40 is an explanatory view illustrating a state where a display device of a thirteenth embodiment and that of a comparative example are viewed from the driver side.

In the present thirteenth embodiment, as illustrated in the upper column of FIG. 40, a plurality of shooting mechanisms 327 each including the light irradiator 313 and the shooting unit 315 are provided on the back side of the transmission reflector 317, and each shooting mechanism 327 is disposed in accordance with the shooting position and/or the shooting direction of the shooting target.

For example, in the display device 301 in the upper column of FIG. 40, the shooting mechanism 327 on the left side is disposed on the left side of the transmission reflector 317 so as to shoot an image of the passenger in the passenger seat, and the shooting direction of the shooting unit 315, that is, the shooting range is set so as to shoot an image of the face of the passenger in the passenger seat. The shooting range is a range of a predetermined angle (i.e., shooting view angle) surrounded by a solid line.

Further, the shooting mechanism 327 on the central side in FIG. 40 is disposed on the central side of the transmission reflector 317 so as to shoot an image of the passenger on the rear seat, and the shooting direction of the shooting unit 315, that is, the shooting range, is set so as to shoot an image of the face of the passenger on the rear seat.

Moreover, the shooting mechanism 327 on the right side of FIG. 40 is disposed on the right side of the transmission reflector 317 so as to shoot an image of the driver, and the shooting direction of the shooting unit 315, that is, the shooting range, is set so as to shoot an image of the face of the driver.

The present thirteenth embodiment has a similar effect to that of the present tenth embodiment. Further, the present thirteenth embodiment has an advantage that when there are a plurality of shooting targets, each shooting mechanism 327 can be disposed at a position most suitable for shooting in accordance with the position of each shooting target and the like.

There is also an advantage that the shooting mechanism 327 having different sizes, shapes, and performances can be disposed freely. For example, there is an advantage that various sizes of lenses for telephoto or wide angle, different types of camera modules, and the like can be appropriately employed depending on the shooting target.

On the other hand, although a comparative example is illustrated in the lower column of FIG. 40, in the comparative example, in a case where a plurality of shooting mechanisms 327 are disposed, it is necessary to dispose the plurality of shooting mechanisms 327 on the front side of the display region 325 of the image. Therefore, there are a disadvantage that the display region 325 is limited, a disadvantage that the placement of the shooting mechanism 327 is limited, and a disadvantage that the shooting mechanism 327 is conspicuous, which are not preferable.

Fourteenth Embodiment

A basic configuration of a fourteenth embodiment is similar to that of the tenth embodiment, and hence a difference from the tenth embodiment will be mainly described below. The same reference numerals as those in the tenth embodiment denote the same configuration, and the preceding description will be referred to.

Figure 41:
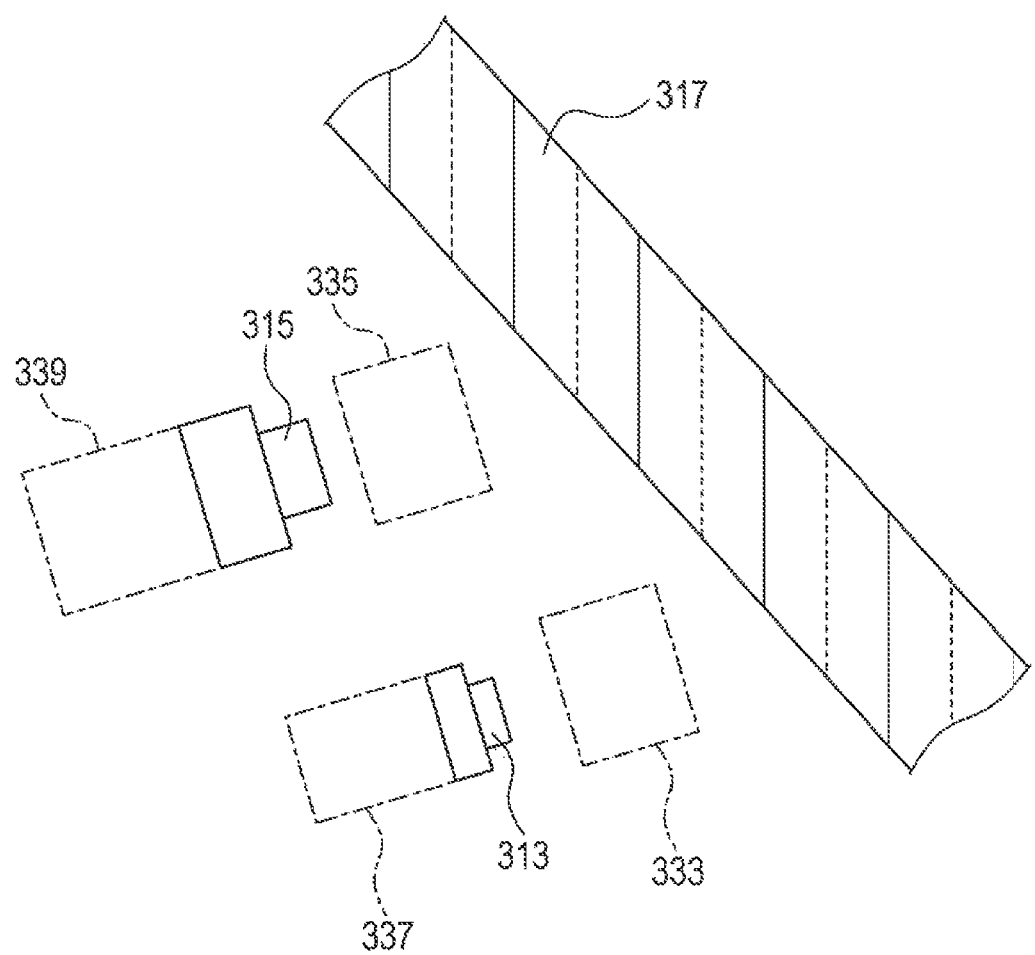
FIG. 41 is an explanatory view illustrating a transmission reflector broken in a thickness direction in a display device according to a fourteenth embodiment.

In the present fourteenth embodiment, as illustrated in FIG. 41, a first optical element 333 that adjusts a state of light emitted from the light irradiator 313 and a second optical element 335 that adjusts a state of light incident on the shooting unit 315 are provided on the back side of the transmission reflector 317. Examples of the state of light include a light direction, a light condensing state, and the like.

Examples of the first optical element 333 and the second optical element 335 include a mirror, a lens, a MEMS module, and the like. By these elements, a shooting view angle, a focal point, and an optical axis direction may be adjusted. Only one of the first optical element 333 and the second optical element 335 may be provided. MEMS is an abbreviation for micro-electro mechanical system.

In addition, in the present fourteenth embodiment, a first drive unit 337 that mechanically drives the light irradiator 313 and a second drive unit 339 that mechanically drives the shooting unit 315 are provided on the back side of the transmission reflector 317.

Examples of the first drive unit 337 and the second drive unit 339 include an actuator such as a motor, a shake reduction mechanism that reduces a shake at the time of shooting, and the like. Only one of the first drive unit 337 and the second drive unit 339 may be provided.

The present fourteenth embodiment has a similar effect to that of the present tenth embodiment. Further, in the present fourteenth embodiment, since the first optical element 333, the second optical element 335, the first drive unit 337, and the second drive unit 339 are disposed on the back side of the transmission reflector 317, there is an advantage that the placement thereof is less limited.

Although one embodiment of the present disclosure has been described above, the present disclosure is not limited to the above embodiment, and various modifications can be made.

[Modification 1]

For example, in the above embodiment, the form in which the organic EL display emits display light has been described, but the organic EL display is not limited to the organic EL display, and any display plate (e.g., liquid crystal display) that can emit display light for displaying an image may be used.

[Modification 2]

In the above embodiment, the plurality of display units 106 are arranged in a line along the vehicle width direction. However, the direction in which the plurality of display units 106 are arranged is determined appropriately. The plurality of display units 106 may be arranged so as to form a plurality of lines. That is, the plurality of display units 106 may be arranged to form a matrix. A similar configuration to that of the above embodiment may be applied to the plurality of display units 106 arranged in the row direction and the plurality of display units 106 arranged in the column direction. Even in the case of having such a configuration, a similar effect can be obtained.

[Modification 3]

The display device 101 according to the above embodiment may be configured to project a virtual image not onto the reflector 104 below the meter hood 150 but, for example, onto a front windshield or a combiner provided to protrude to a dashboard. Even in the case of having such a configuration, a similar effect can be obtained.

[Modification 4]

(a) The present disclosure is not limited to the in-vehicle display described above but can be applied to various display devices such as various meters, air conditioner panels, and navigation displays.

(b) The present disclosure can be applied to various devices capable of performing display by using reflection of light, in addition to a reflecting mirror such as an in-vehicle display. For example, the present invention can be applied to a combiner or the like which is a display member of a head-up display.

(c) In the present disclosure, the reflectance of the reflecting mirror, that is, the reflectance of the reflective surface of the reflecting mirror, does not need to be uniform over the entire reflective surface and may be appropriately set in accordance with the function or environment, for example, an external light source around the vehicle, solar radiation, temperature, occupant, and the like.

For example, the reflective surface may be divided into a plurality of areas, and an arbitrary reflectance may be set for each area. That is, a reflectance difference may be set between the areas.

The reflectance may be set so as to change stepwise in a specific direction on the right, left, top, bottom, center, outer periphery, or the like of the reflective surface. For example, the reflectance may be set to gradually increase or decrease. For example, a reflectance difference may be set to occur in a specific direction.

(d) Examples of the brightness in the surroundings include brightness in the surroundings that are a range (i.e., space) that affects the visual recognition of the display of the reflecting mirror. Examples thereof include brightness around the vehicle, brightness in the interior, and brightness around the reflective surface side of the reflecting mirror. Examples thereof include brightness of a space in which a person (e.g., occupant) who views an image displayed on the reflecting mirror, such as a driver, is present.

(e) The controller and the technique of the display device according to the present disclosure may be achieved by a dedicated computer provided by constituting a processor and a memory programmed to execute one or more functions embodied by a computer program.

Alternatively, the controller and the technique of the display device according to the present disclosure may be achieved by a dedicated computer provided by constituting a processor with one or more dedicated hardware logic circuits.

Alternatively, the controller and the technique of the display device according to the present disclosure may be achieved using one or more dedicated computers constituted by a combination of a processor and a memory programmed to execute one or more functions and a processor formed of one or more hardware logic circuits.

The computer program may store a computer-readable non-transitional tangible recording medium as an instruction to be executed by the computer. The technique for achieving the functions of the respective units included in the controller of the display device does not necessarily include software, and all the functions may be achieved using one or a plurality of pieces of hardware.

(f) In addition to the controller of the display device described above, the present disclosure can be achieved in various forms such as a system including the controller as a component, a program for causing a computer to function as the controller, a non-transitional tangible recording medium such as a semiconductor memory in which the program is recorded, and a control method.

[Modification 5]

(a) The present disclosure is not limited to a display device having a configuration (i.e., shooting mechanism) for shooting an image of a passenger of a vehicle but can also be applied to a device for shooting an image of a person who operates the device and recognizing the person when the person operates the device with a gesture. Further, the present disclosure can be applied to security applications for performing human recognition, monitoring, shooting, and the like.

(b) Examples of the passenger of the vehicle include the driver, the passenger in the passenger seat, and the passenger in the rear seat.

(c) The pseudo display unit is not limited to that of the above embodiment so long as being able to make the light irradiator and the shooting unit inconspicuous.

A plurality of functions of one component in the above embodiment may be achieved by a plurality of components, or one function of one component may be achieved by a plurality of components. A plurality of functions of a plurality of components may be achieved by one component, or one function achieved by a plurality of components may be achieved by one component. A part of the configuration of the above embodiment may be omitted. At least a part of the configuration of the above embodiment may be added to or replaced with the configuration of another embodiment.

What is claimed is:

1. A display device for a vehicle, the display device comprising:
   a plurality of display units configured to emit a display light representing an image to be displayed from a display screen; and
   a reflector disposed to face the display screen of each of the plurality of display units and to reflect the display light emitted from the plurality of display units, wherein
   the reflector is formed to bridge between a vicinity of a first A-pillar installed on a left side of the vehicle and a vicinity of a second A-pillar installed on a right side of the vehicle, and
   each of a first reflective surface of the reflector in vicinity of the first A-pillar and a second reflective surface of the reflector in vicinity of the second A-pillar is disposed to form an obtuse angle with a third reflective surface except for the first reflective surface and the second reflective surface of the reflector.

2. The display device according to claim 1, wherein each of the plurality of display units is an organic electroluminescence display.

3. A display device for a vehicle, the display device comprising:
   a plurality of display units configured to emit a display light representing an image to be displayed from a display screen; and
   a reflector disposed to face the display screen of each of the plurality of display units and to reflect the display light emitted from the plurality of display units, wherein
   the display unit that emits the display light for projecting the image in front of a position for a specific occupant in the vehicle is defined as a specific display unit,
   the display unit adjacent to the specific display unit is defined as an adjacent display unit, and
   the specific display unit is located closer to the reflector than the adjacent display unit is, and the specific display unit and the adjacent display unit are disposed such that edge portions of the specific display unit and the adjacent display unit overlap each other.

4. The display device according to claim 3, further comprising
   a controller configured to control the plurality of display units, wherein
   the image has a background image constituting a background of the image, and
   the controller is configured to cause two of the plurality of display units adjacent to each other to emit the display light for projecting the background image formed using a dark color.

5. The display device according to claim 3, further comprising
   a controller configured to control the plurality of display units, wherein
   each of the images projected by the display light from each of the plurality of display units has an adjacent region adjacent to the image projected by another adjacent display unit, and
   the controller is configured to cause two of the plurality of display units adjacent to each other to emit the display light for projecting a plurality of image elements irregularly arranged in the adjacent region.

6. The display device according to claim 3, further comprising
   a detector configured to detect intensity of light incident on the plurality of display units and/or the reflector from an outside of the display device; and
   a controller configured to control the plurality of display units, wherein
   the controller is configured to cause two of the plurality of display units adjacent to each other to emit the display light for projecting the image having a quality corresponding to a result of detection by the detector.

7. The display device according to claim 3, wherein
   the display screen of each of the plurality of display units has
   a display area configured to emit the display light, and
   a non-display area extending along an edge of the display screen and emits no display light,
   a proximity section is defined by a boundary line between the display area and the non-display area in each of the plurality of display units, the proximity section being adjacent to another adjacent display unit, and the display screen of at least one of the plurality of display units has a polarizing plate that covers the display area and the non-display area while straddling the proximity section.

8. The display device according to claim 3, wherein
a surface of each of the plurality of display units forming an edge is defined as an end surface, and a surface on an opposite side of the display screen is defined as a back surface,
each of the display screen and the back surface has an edge area including the edge of each of the plurality of display units,
the end surface in each of the plurality of display units has a first area adjacent to another adjacent display unit,
the edge area of the display screen of each of the plurality of display units has a second area in contact with the first area,
the edge area of the back surface of each of the plurality of display units has a third area in contact with the first area, and
at least one of the plurality of display units has a reflection suppressor for reducing reflection of light in at least two of the first to third areas.

9. The display device according to claim 3, further comprising an outer peripheral frame disposed to surround the plurality of display units, wherein
a surface of the outer peripheral frame facing the reflector is defined as a top surface, and
a distance between the display screen and a portion of the top surface of the outer peripheral frame adjacent to the display screen is a half or less of a thickness of the display screen in at least one of the plurality of display units.

10. The display device according to claim 3, further comprising an outer peripheral frame disposed to surround the plurality of display units, wherein
a surface of the outer peripheral frame facing the reflector is defined as a top surface, and
the top surface is subjected to surface treatment corresponding to an appearance of the display screen of each of the plurality of display units when the display light is not emitted.

11. A display device for a vehicle, the display device comprising:
a plurality of display units configured to emit a display light representing an image to be displayed from a display screen; and
a reflector disposed to face the display screen of each of the plurality of display units and to reflect the display light emitted from the plurality of display units, wherein
the reflector is configured such that a reflectance of light is adjustable, and
the display device further includes a controller configured to control a reflectance of the reflector.

12. The display device according to claim 11, wherein the controller is configured to control the reflectance of the reflector in accordance with brightness in a surrounding space affecting visual recognition.

13. The display device according to claim 11, wherein the controller is configured to be able to control the reflectance of the reflector and to control a luminance of light generated in the display unit.

14. The display device according to claim 13, wherein the controller is configured to perform a combination control controlling the reflectance of the reflector and controlling the luminance of light generated in the display unit in order to display a virtual image with target brightness.

15. The display device according to claim 14, wherein the controller is configured to perform a control for increasing the reflectance of the reflector and a control for reducing the luminance of light generated in the display unit in order to decrease the brightness of the virtual image.

16. The display device according to claim 11, wherein the controller is configured to control at least the reflectance of the reflector in accordance with presence or absence of a light source existing around a vehicle in which the display device is mounted and/or a proximity state of the light source.

17. The display device according to claim 11, wherein the controller is configured to control at least the reflectance of the reflector in accordance with a temperature of the display unit and/or a vicinity of the display unit or an index corresponding to the temperature.

18. A display device for a vehicle, the display device comprising:
a plurality of display units configured to emit a display light representing an image to be displayed from a display screen;
a reflector disposed to face the display screen of each of the plurality of display units and to reflect the display light emitted from the plurality of display units;
a light irradiator configured to irradiate a position for a person viewing the display device with light; and
a shooting unit disposed to receive reflected light of the light emitted from the light irradiator and configured to shoot an image of the person by using the reflected light, wherein
the reflector is configured such that the emitted light and the reflected light are able to be transmitted between a front side and a back side opposite to the front side, and at least a part of the light incident from the front side is reflected on a surface of the front side toward the position for the person,
the reflector is disposed between the position for the person and the light irradiator/the shooting unit with the front side facing the position for the person,
the display unit is disposed on the front side of the reflector and is disposed such that the person is visually recognizable by reflection of the image, displayed by the display unit, on the reflector, and
the light irradiator and the shooting unit are disposed on the back side of the reflector.

19. The display device according to claim 18, wherein the light emitted from the light irradiator is infrared light, and the light reflected on a surface of the front side of the reflector is visible light.

20. The display device according to claim 18, wherein the reflector includes a pseudo display unit that reduces visual recognition of the light irradiator and/or the shooting unit.

21. The display device according to claim 18, wherein the light irradiator and/or the shooting unit is disposed between a formation position of a virtual image of the display unit and the reflector in a case where the virtual image is formed on the back side of the reflector by light reflected on the surface of the front side of the reflector.

22. The display device according to claim 18, further comprising a restriction unit on the back side of the reflector so as to restrict an irradiation range of light emitted from the light irradiator and/or a shooting range of the shooting unit.

23. The display device according to claim 18, further comprising a plurality of shooting mechanisms on the back side of the reflector, wherein each of the shooting mechanisms includes the light irradiator and the shooting unit, and is disposed in accordance with a shooting position and/or a shooting direction of a shooting target.

24. The display device according to claim 18, wherein the reflector includes at least one of a half mirror, a member capable of selectively transmitting and selectively reflecting light in accordance with a wavelength, a member capable of selectively transmitting and selectively reflecting light in accordance with a deflection direction, or a layer disposed on the front side and capable of changing an optical characteristic.

25. The display device according to claim 18, further comprising a first optical element that adjusts a state of light emitted from the light irradiator and/or a second optical element that adjusts a state of light incident on the shooting unit on the back side of the reflector.

26. The display device according to claim 18, further comprising a first drive unit that mechanically drives the light irradiator and/or a second drive unit that mechanically drives the shooting unit on the back side of the reflector.

\* \* \* \* \*